(12) United States Patent
Kuramori et al.

(10) Patent No.: US 10,818,337 B2
(45) Date of Patent: Oct. 27, 2020

(54) SEMICONDUCTOR MEMORY DEVICE FOR PREVENTING OCCURRENCE OF ROW HAMMER ISSUE

(71) Applicant: ZENTEL JAPAN CORPORATION, Tokyo (JP)

(72) Inventors: Bunsho Kuramori, Tokyo (JP); Mineo Noguchi, Kanagawa (JP); Akihiro Hirota, Tokyo (JP); Masahiro Ishihara, Saitama (JP); Mitsuru Yoneyama, Tokyo (JP); Takashi Kubo, Osaka (JP); Masaru Haraguchi, Osaka (JP); Jun Setogawa, Hyogo (JP); Hironori Iga, Hyogo (JP)

(73) Assignee: ZENTEL JAPAN CORPORATION, Tokyo (JP)

( * ) Notice: Subject to any disclaimer, the term of this patent is extended or adjusted under 35 U.S.C. 154(b) by 142 days.

(21) Appl. No.: 16/088,211

(22) PCT Filed: Aug. 2, 2017

(86) PCT No.: PCT/JP2017/027992
§ 371 (c)(1),
(2) Date: Sep. 25, 2018

(87) PCT Pub. No.: WO2019/026197
PCT Pub. Date: Feb. 7, 2019

(65) Prior Publication Data
US 2019/0362774 A1      Nov. 28, 2019

(51) Int. Cl.
*G11C 11/406* (2006.01)
*G11C 11/408* (2006.01)

(52) U.S. Cl.
CPC ....... *G11C 11/40611* (2013.01); *G11C 11/408* (2013.01)

(58) Field of Classification Search
CPC ......... G11C 11/40611; G11C 11/40622; G11C 11/408; G11C 29/76
(Continued)

(56) References Cited

U.S. PATENT DOCUMENTS 8,503,262 B2    8/2013 Fujishiro et al.
9,449,671 B2 *  9/2016 Crawford .............. G11C 11/406
(Continued)

FOREIGN PATENT DOCUMENTS

JP    2011-51489      3/2011
JP    2011-258259     12/2011
(Continued)

OTHER PUBLICATIONS

Translation of the International Preliminary Report on Patentability dated Feb. 13, 2020 in International (PCT) Application No. PCT/JP2017/027992.
(Continued)

*Primary Examiner* — Xiaochun L Chen
(74) *Attorney, Agent, or Firm* — Wenderoth, Lind & Ponack, L.L.P.

(57) ABSTRACT

A semiconductor memory device is provided with a row control circuit, in order to dissolve a Row Hammer issue. The row control circuit is configured to: (A) latches one of (a) a target address upon issuing of an ACTIVE command to the semiconductor memory device, and (b) a row address of a victim cell in which data of a memory cell is affected by the target address, as a victim address by using a predetermined row address latch method; and then, (B) refreshes the victim cell having the victim address by a predetermined refresh method upon issuing of a REFRESH command.

39 Claims, 55 Drawing Sheets

(58) Field of Classification Search
USPC .......................................................... 365/149
See application file for complete search history.

(56) References Cited

U.S. PATENT DOCUMENTS

2014/0281206 A1* 9/2014 Crawford .......... G11C 11/40611
  711/106
2016/0202926 A1 7/2016 Benedict

FOREIGN PATENT DOCUMENTS

JP  2012-38400  2/2012
JP  2016-18578  2/2016

OTHER PUBLICATIONS

International Search Report dated Oct. 24, 2017 in International (PCT) Application No. PCT/JP2017/027992.

* cited by examiner

Fig.2

| Ka | RATIO | A | B | B$^A$ | 10 YEARS |
|---|---|---|---|---|---|
| 0 | 0% | 599 | 0 | 0 | 0 |
| 1 | 1% | 603 | 0.0060 | 0 | 0 |
| 2 | 1% | 607 | 0.0120 | 0 | 0 |
| 3 | 2% | 610 | 0.0180 | 0 | 0 |
| 4 | 2% | 614 | 0.0240 | 0 | 0 |
| 5 | 3% | 618 | 0.0299 | 0 | 0 |
| 6 | 4% | 622 | 0.0359 | 0 | 0 |
| 7 | 4% | 625 | 0.0419 | 0 | 0 |
| 8 | 5% | 629 | 0.0497 | 0 | 0 |
| 9 | 5% | 633 | 0.0539 | 0 | 0 |
| 10 | 6% | 637 | 0.0599 | 0 | 0 |
| 20 | 12% | 681 | 0.1198 | 0 | 0 |
| 30 | 18% | 730 | 0.1796 | 0 | 0 |
| 40 | 24% | 788 | 0.2395 | 0 | 0 |
| 50 | 30% | 855 | 0.2994 | 0 | 0 |
| 100 | 60% | 1493 | 0.5988 | 0 | 0 |
| 110 | 66% | 1755 | 0.6587 | 0 | 0 |
| 120 | 72% | 2128 | 0.7186 | 4E-306 | 6.8E-296 |
| 130 | 78% | 2703 | 0.7784 | 1E-294 | 1.4E-284 |
| 140 | 84% | 2704 | 0.8383 | 2E-284 | 2.3E-274 |
| 150 | 90% | 5883 | 0.8982 | 5E-275 | 3.5E-265 |
| 154 | 92% | 7693 | 0.9222 | 2E-271 | 9.1E-262 |
| 155 | 93% | 8334 | 0.9281 | 1E-270 | 6.2E-261 |
| 156 | 93% | 9091 | 0.9341 | 1E-269 | 4.2E-260 |

| | | | |
|---|---|---|---|
| $t_{REFI}$ | | 7.8125 | us |
| $t_{RCmin}$ | | 10 | ns |
| $t_{REF}$ | | 64 | ms |
| NUMBER OF TIMES OF ACTIVE COMMANDS | n | 6400000 | TIMES |
| RH UPPER LIMIT NUMBER | r | 100000 | |
| SKIP | | 3 | |
| NUMBER OF TIMES OF VICTIM REFRESHING | v | 2048 | |
| | | | |
| MISSELECTION PROBABILITY FOR EACH VICTIM REFRESHING | B | 0.984375 | |
| TOTAL MISSELECTION PROBABILITY | $B^A$ | 9.83691E-15 | |
| | | | |
| 10 YEARS (10×365 DAYS×24h×60min×60s)/64ms | | 4927500000 | |
| | | | |
| MISSELECTION PROBABILITY FOR 10 YEARS | | 4.84714E-05 | |

Fig.8
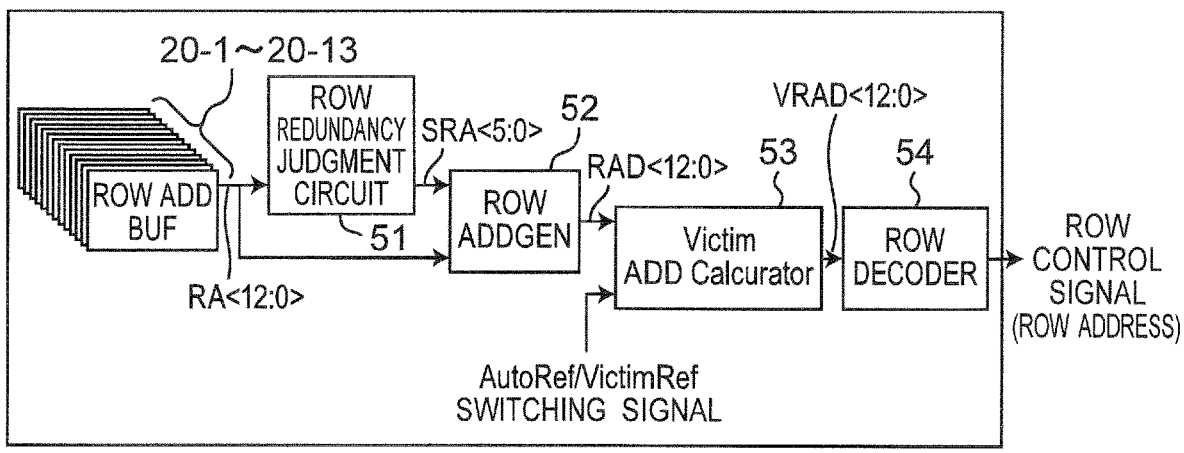
Fig.9
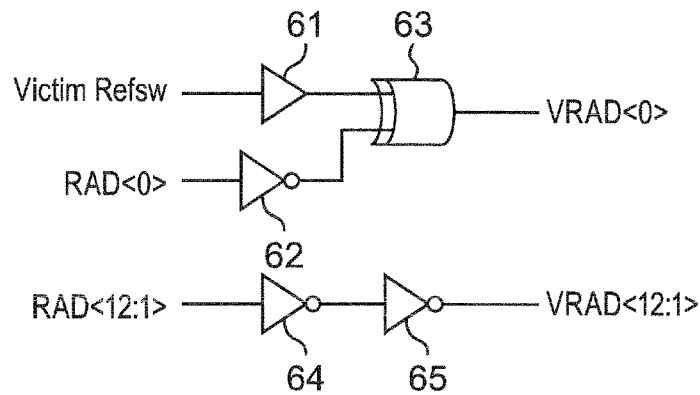
Fig.10
| Victim Refsw | RAD<0> | VRAD<0> |
|---|---|---|
| 0 | 0 | 1 |
| 0 | 1 | 0 |
| 1 | 0 | 0 |
| 1 | 1 | 1 |

UNRELIABLE COUNTERMEASURE OF NOT FETCHING ROW ADDRESS BEFORE ROW ADDRESS IMMEDIATELY BEFORE AUTO REFRESHING (AutoRefresh), TO FETCH ROW ADDRESS IMMEDIATELY BEFORE AUTO REFRESHING

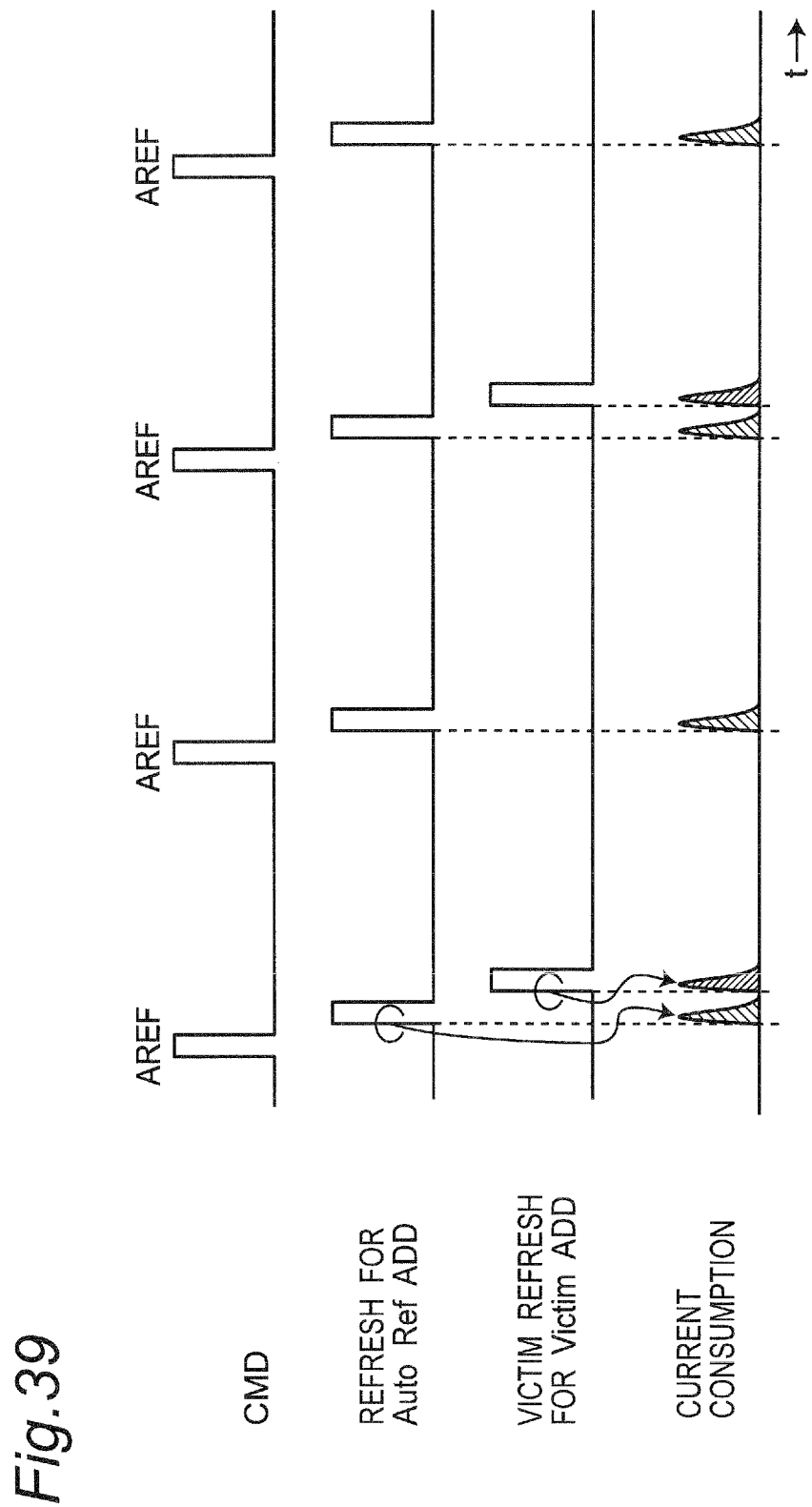

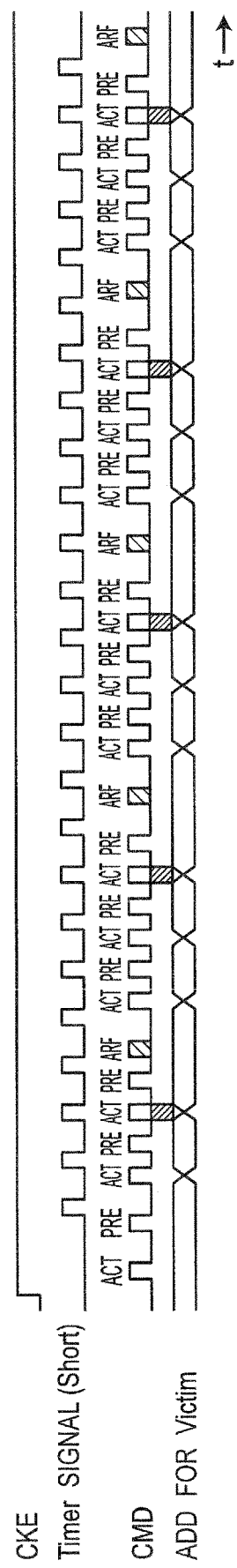

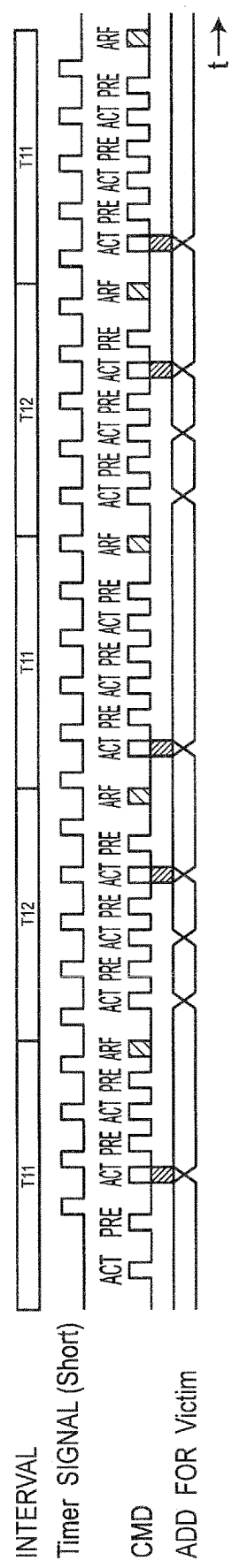

SEMICONDUCTOR MEMORY DEVICE FOR PREVENTING OCCURRENCE OF ROW HAMMER ISSUE

TECHNICAL FIELD

The present invention relates to a semiconductor memory device configured to include a semiconductor integrated circuit or the like, such as a dynamic access memory (hereinafter, referred to as a DRAM). The present invention particularly relates to prevention of occurrence of failure regarding a case (referred to as Row Hammer (RH) failure, and the issue is referred to as a Row Hammer issue), by performing the refresh (Ref) on a word line (WL), which may be a target upon an AUTO REFRESH command. In the case, selecting of an identical word line (WL) a plurality of times causes electric charge of a memory cell connected to an adjacent word line to be leaked, and causes reading failure (disturbance or loss).

BACKGROUND ART

Since a DRAM, which is a typical semiconductor memory device, stores information by using electric charge accumulated in a cell capacitor, information disappears unless periodically performing the refresh operation. For this reason, a control circuit for controlling the DRAM periodically issues a REFRESH command giving an instruction to perform the refresh operation (See Patent Document 1). The control circuit issues the REFRESH command at a frequency of reliable refresh on all the word lines once for an interval of one refresh cycle (for example, 64 ms).

PRIOR ART DOCUMENTS

Patent Documents

[Patent Document 1] Japanese Patent Laid-open Publication No. JP2011-258259A
[Patent Document 2] Japanese Patent Laid-open Publication No. JP2016-018578A
[Patent Document 3] Japanese Patent Laid-open Publication No. JP2011-051489A
[Patent Document 4] Japanese Patent Laid-open Publication No. JP2012-038400A

SUMMARY OF THE INVENTION

Problems to be Solved by the Invention

However, depending on the access history to a memory cell, the information retention characteristic of a certain memory cell may be degraded. Then, when the information retention time of the predetermined memory cell lowers to less than one refresh cycle, even if a REFRESH command is issued at the frequency of the refresh on all the word lines once for the interval of one refresh cycle, there is a possibility that part of information will be lost.

In order to solve this problem, for example, each of Patent Documents 2 and 3 discloses a method of providing a mechanism for counting the number of accesses to each word line and refreshing adjacent word lines when the number exceeds a specified number. In this method, there is such a problem that each word line requires a counter circuit and the circuit scale becomes large. For example, when a SRAM is used to prepare a memory element that counts the number of times of 8192 WL×64K times in the peripheral standard of 38 nm rule DRAM process, a space of about 730 µm×520 µm is required only for a core portion of the SRAM. In addition to this, since a control peripheral circuit is also required, an enormous area is required. Therefore, an increase in chip size is inevitable.

An object of the present invention is to solve the above problems and to provide a semiconductor memory device capable of preventing refresh failure of a memory cell whose the information retention characteristic lowers due to an access history.

Means for Solving the Problem

According to one aspect of the present invention, there is provided a semiconductor memory device including a row control circuit. The row control circuit is configured to:

(A) latches one of (a) a target address upon issuing of an ACTIVE command to the semiconductor memory device, and (b) a row address of a victim cell in which data of a memory cell is affected by the target address, as a victim address by using a predetermined row address latch method; and then, (B) refreshes the victim cell having the victim address by a predetermined refresh method upon issuing of a REFRESH command.

Effect of the Invention

According to the semiconductor memory device of the present invention, it is possible to prevent refresh failure to an extent similar to that of the prior patents without accompanying a significant increase in the size of the circuit as compared with the prior arts.

BRIEF DESCRIPTION OF THE DRAWINGS

FIG. 2 is a table illustrating calculation results of failure probabilities in the DRAM of FIG. 1.
FIG. 8 is a block diagram illustrating a configuration example of the row control circuit 10 of FIG. 7.
FIG. 9 is a block diagram illustrating a configuration example of a victim address calculation circuit 53 of FIG. 8.
FIG. 10 is a truth table illustrating an operation of the victim address calculation circuit 53 of FIG. 9.

FIG. 39 is a timing chart illustrating a third operation example in the row control circuits 10I, 10J, and 10K according to the tenth to twelfth embodiment.

FIG. 40B is a timing chart illustrating an operation example when always continuing the operation of fetching and latching a first ACTIVE command after a timer signal is output, in the row control circuit 10C according to the fourth embodiment.

FIG. 40C is a timing chart illustrating an operation example of alternately performing an operation interval T11 and an operation interval T12, in the row control circuit 10C according to the fourth embodiment. In the operation interval T11, a first ACTIVE command after a timer signal is outputted is fetched, and then, the fetched first ACTIVE command is kept to be latched. In the operation interval T12, the operation of fetching and latching a first ACTIVE command after a timer signal is outputted always continues.

MODE FOR CARRYING OUT THE INVENTION

Figure 1:
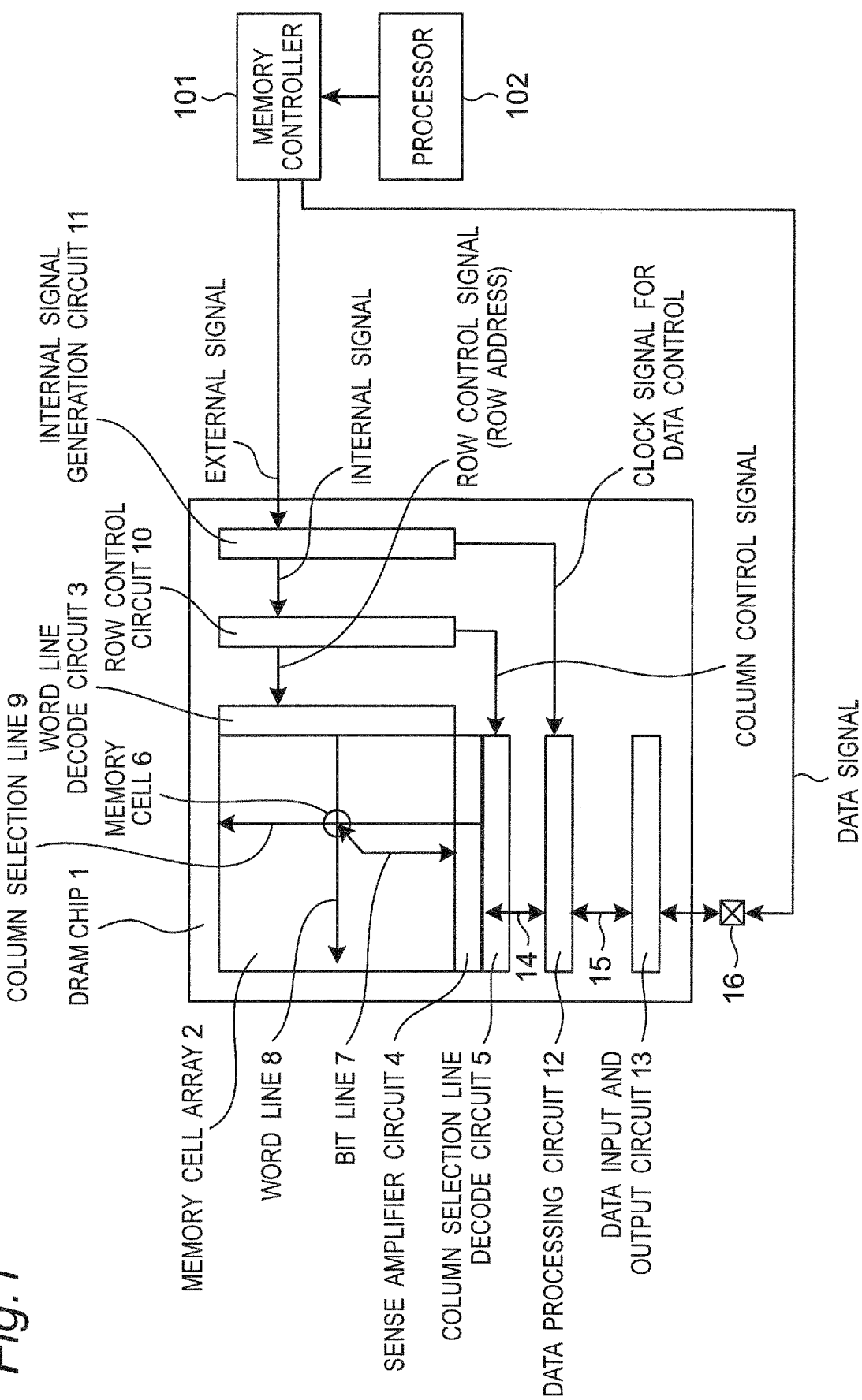
FIG. 1 is a block diagram illustrating a configuration example of a data processing apparatus including a DRAM chip 1 and a peripheral circuit thereof according to one embodiment of the present invention.

Embodiments of the present invention will be described below. It is noted that in the drawings, identical reference characters denote similar components, and a detailed description thereof will be omitted.

FIG. 1 is a block diagram illustrating a configuration example of a data processing apparatus including a DRAM chip 1 and peripheral circuits thereof according to one embodiment of the present invention. The data processing apparatus of FIG. 1 includes the DRAM chip 1, a memory controller 101, and a processor 102.

The DRAM chip 1 includes a memory cell array 2, a row control circuit 10, an internal signal generation circuit 11, a data processing circuit 12, a data input and output circuit 13, internal data buses 14 and 15, and an external data input and output pin 16. In this case, the memory cell array 2 includes a plurality of memory cells 6, a plurality of bit lines 7, a sense amplifier circuit 4, a plurality of word lines 8, a plurality of column selection lines 9, a word line decode circuit 3, and a column selection line decode circuit 5.

The memory controller 101 transmits a command, an address, and a clock to the DRAM chip 1 under control of the processor 102, and transmits and receives a data signal to and from the DRAM chip 1. The internal signal generation circuit 11 converts a command or the like from the memory controller 101 so as to generate an internal signal such as an internal command, outputs the internal signal to the row control circuit 10, and outputs a data control clock to the data processing circuit 12. The row control circuit 10 outputs a column control signal to the column selection line decode circuit 5 according to the converted internal signal, and also generates a row control signal (row address) to output the row control signal to the word line decode circuit 3.

The plurality of memory cells 6 is arranged in a lattice shape along the plurality of bit lines 7 and the plurality of word lines 8 orthogonal to each other. A switching element, which operates according to an active or an inactive state of each word line 8, causes each memory cell 6 arranged along each word line 8 to be connected or disconnected to each bit line 7. The sense amplifier circuit 4 includes a plurality of sense amplifiers connected to a plurality of bit lines 7, respectively. The plurality of column selection lines 9 selects one of the plurality of sense amplifiers in the sense amplifier circuit 4. The word line decode circuit 3 decodes the address sent from the row control circuit 10 into the position of the word line and selects one or more of the plurality of word lines 8. The column selection line decode circuit 5 decodes the address sent from the row control circuit 10 into the position of the column selection line 9 and selects one or more of the plurality of column selection lines 9. It is noted that for simplification of illustration, FIG. 1 illustrates only one memory cell 6, one bit line 7, one word line 8, and one column selection line 9.

The data input and output circuit 13 transmits and receives a data signal to and from the memory controller 101 via the external data input and output pin 16. Further, the data input and output circuit 13 transmits and receives a data signal to and from each sense amplifier in the sense amplifier circuit 4 via the internal data bus 15, the data processing circuit 12, and the internal data bus 14.

In the DRAM chip 1 and the peripheral circuit thereof configured as described above, when the word line 8 is activated by a row access, a small amount of electric charge of the memory cell 6, which stores data, is transferred to the connected bit line 7. After a sense voltage corresponding to the electric charge of data is read and transmitted to the sense amplifier circuit 4, the sense voltage is amplified to logical 1 or 0. Thereafter, a column access activates the column selection line 9, and thus, a part of the sense amplifier circuit 4, which stores data activated by the row access, is selected. The memory controller 101, which is an external circuit, reads the data via the data processing circuit 12, the data input and output circuit 13, and the external data input and output pin 16. In contrast, external data is written in the sense amplifier circuit 4 specified by the column selection line 9, and the memory cell 6 whose word line 8 is activated stores the external data through the bit line 7. It is noted that since data stored in the memory cell 6 is lost with time, it is necessary to supplement the amount of lost data periodically by the operation called "refresh (Ref)". The row control circuit 10 of FIG. 1 generates an address required for the normal word line activation. A refresh controller 21 (FIG. 7) generates an address to be refreshed and supplies the address to the memory cell array 2. Refresh operation needs to be performed for all the word lines 8 in the DRAM chip 1 at predetermined intervals within a predetermined time.

In the DRAM chip 1 according to the embodiment configured as described above, the row control circuit 10 is characterized by having the following configuration.

(1) The row control circuit 10 includes an auto refresh counter 36 (FIG. 7), and refreshes the DRAM chip 1 according to the count value of the auto refresh counter 36 upon issuing of an AUTO REFRESH command.

(2) The row control circuit 10 includes a circuit, which allows a latch 39 (FIG. 7) to latch the row address obtained when receiving the ACTIVE command (ACT command) before starting the auto refresh, via an address buffer 32, a switch 33, a latch 34, and a switch 38, and refreshes the memory cell 6 whose stored data is affected (data is disturbed or lost) by the row address latched upon issuing of the ACTIVE command (hereinafter referred to as a victim cell), after or instead of the refresh operation of the address of the auto refresh counter upon issuing of an AUTO REFRESH command. The row control circuit 10 refreshes the victim cell so as to suppress an occurrence of refresh failure.

That is, unlike in Patent Documents 2 and 3, the DRAM chip 1 according to the present embodiment does not count the number of accesses for each accessed word line. The DRAM chip 1 is characterized by additionally refreshing the word line 8 whose data is affected by a certain word line 8 selected by a certain ACTIVE command for the interval from an AUTO REFRESH command to the next AUTO REFRESH command. Since it is sufficient to latch at least one row address at a timing of a certain ACTIVE command, an increase in the number of components is very small and there is little influence on the chip size.

First of all, basic concepts according to the embodiments of the present invention will be described below.

(1) Before starting the auto refresh, the latch 39 (FIG. 7) latches a row address upon issuing of an ACTIVE command. The row address is inputted from the memory controller 101 (which is a row address for writing or reading data and is also referred as a "target address"), via the address buffer 32, the switch 33, the latch 34, and the switch 38.

(2) Upon issuing of the AUTO REFRESH command, refresh (hereinafter, referred to as victim refresh) is performed for a victim cell affected by a row address (referred to as a "victim address" meaning a victim's address) latched in the latch 39 separately from the row address to be auto refreshed.

(3) If the row address latched in the latch 39 is a victim address which may be selected a number of times and may cause malfunction, refreshing for the victim cell is completed at this point and malfunction can be prevented.

(4) In this case, if the row address latched in the latch 39 is not a target victim address, refreshing for the victim cell is not completed at this point.

(5) This cycle comes many times before failure occurs. Therefore, a chance of refreshing this victim cell arrives each time. For this reason, this method executes refreshing of this victim cell almost 100% stochastically, and it is possible to avoid failure.

The probability that this malfunction actually occurs is obtained by the following calculation example (the probability of selecting an identical row address up to the number of times that failure occurs and never latching the address in the above sequence).

Calculation Example 1

The setting conditions are as follows.
(1) Upper limit of selection times of an address selected a plurality of times (RH allowable times)=100K times;
(2) Auto refresh cycle $t_{REFI}$=7.8 μs;
(3) Auto refresh time $t_{REC}$=300 ns; and
(4) ACTIVE command interval $t_{RCmin}$=45 ns.

In the case of the setting conditions, the following equation expresses the number N of ACTIVE commands to be inserted in one auto refresh cycle $t_{REFI}$.

$$N=(7.8\ \mu s-300\ ns)/45\ ns=167\ times$$

At that time, when the input addresses in all the ACTIVE commands are identical, the probability that the latch addresses differ from each other in this cycle will be 0%. At this time, the following equation expresses chances A (times) of the victim refresh which arrive before reaching the upper limit.

$$A=100K/167=598.8$$

Therefore, the overall failure probability is $0^{598.8}$=0%.

Calculation Example 2

If only one address is different, the following equation expresses probability B that the latch addresses in this cycle differ from each other.

$$B=1/167$$

At this time, the following equation expresses the chances A (times) of the victim refresh, which arrive before reaching the upper limit of selection times (RH allowable times).

$$A=100K/(167-1)=602.4$$

Therefore, the following equation expresses the overall failure probability.

$$(1/167)^{602.4}=0\%$$

Calculation Example 3

When only Ka addresses differ from each other, Ka being a number more than 1, the probability that the latch addresses in this cycle are different is determined by the number of combinations of the value obtained by subtracting 1 from the total number of ACTIVE commands N and the value obtained by subtracting 1 from Ka (a state in which different addresses are selected by lottery). Therefore, there are $_{N-1}C_{Ka-1}$ combinations. In this case, there are $_NC_{Ka}$ combinations in total.

Therefore, the following equation expresses probability B of selecting different addresses in one auto refresh cycle $t_{REFI}$.

$$B=(_{N-1}C_{Ka-1})/(_NC_{Ka})$$

The following equation expresses the number of times A that the auto refresh is performed until the address selected a plurality of times when there are Ka different addresses reaches the upper limit of selection times (RH allowable times).

$$A=(RH\ allowable\ times)/(N-Ka)=100000/(167-Ka)$$

The following equation expresses overall probability B.

$$B^A=((_{N-1}C_{Ka-1})/(_NC_{Ka}))^{100000/(167-Ka)}$$

Figure 3:
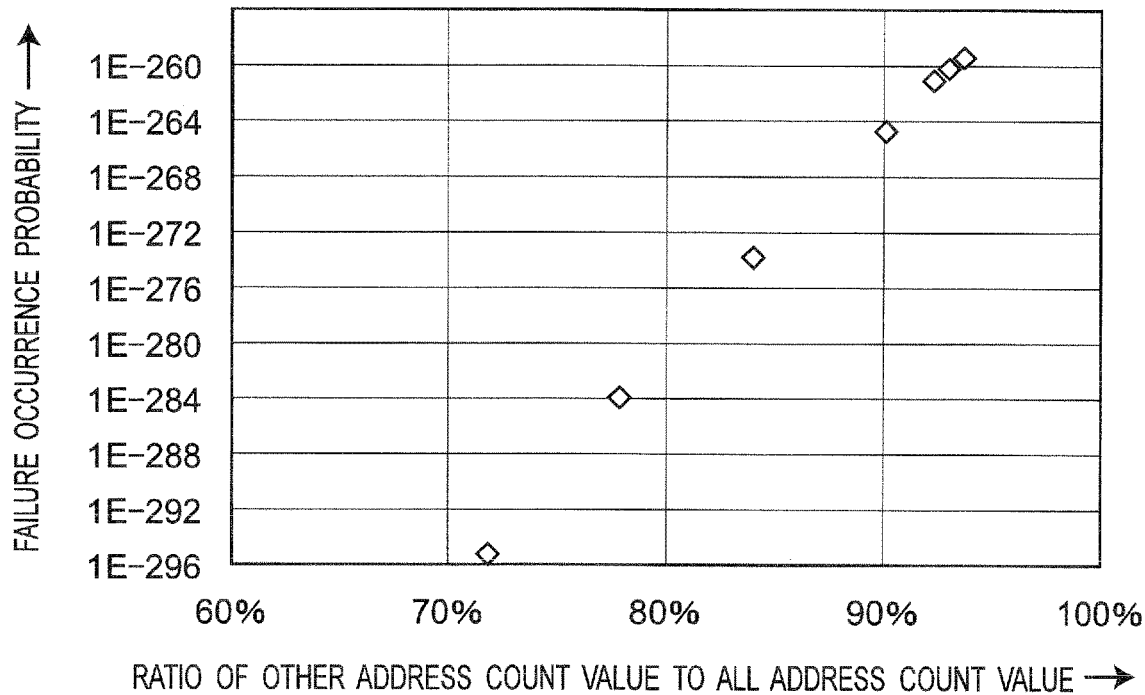
FIG. 3 is a graph illustrating failure probabilities with respect to a ratio of other address count value to all address count value in the DRAM of FIG. 1.

FIGS. 2 and 3 illustrate the probabilities obtained by this equation. The conditions in this case are as follows.

(1) RH allowable times=100K times;
(2) Auto refresh cycle $t_{REFI}$=7.8 μs;
(3) ACTIVE command interval $t_{RC}$=45 ns;
(4) The count value of ACTIVE commands in the auto refresh cycle $t_{REFI}$=167 times.

FIG. 2 is a table illustrating the calculation results of the failure probabilities in the DRAM of FIG. 1. FIG. 3 is a graph illustrating failure probabilities with respect to the ratio of the other address count value to all address count value in the DRAM of FIG. 1. In FIG. 2 and subsequent drawings and the like, "XE-Y" represents X to the power of −Y. As apparent from FIGS. 2 and 3, the failure generation probability is almost 0% in all combinations even for 10 years. Incidentally, when the number of times A that the auto refresh is performed exceeds 8192 times, the victim address is refreshed in the normal auto refresh. Therefore, no failure occurs.

Next, extension to a general probability will be described below.

According to the above calculation results, the probability increases as the number Ka of different addresses increases. According to this, it is considered that, for the interval until the refresh is completed, the failure probability will be maximal in the following case.

Figure 4:
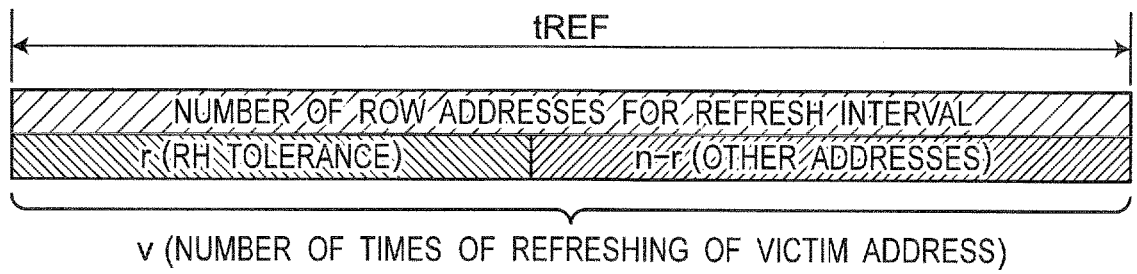
FIG. 4 is a diagram illustrating a schematic configuration example of one refresh cycle in the DRAM of FIG. 1.

In this case, assuming that
(a) r is the upper limit time of selecting an identical address;
(b) n is the maximum number of times that ACTIVE commands can be issued before completion of the refresh; and
(c) v is the number of times of refreshing the victim address, then the diagram of FIG. 4 is established.

At this rate, the number of different addresses is maximal, and the upper limit number of selecting an identical address is also satisfied. The diagram of FIG. 5 illustrates this.

Figure 5:
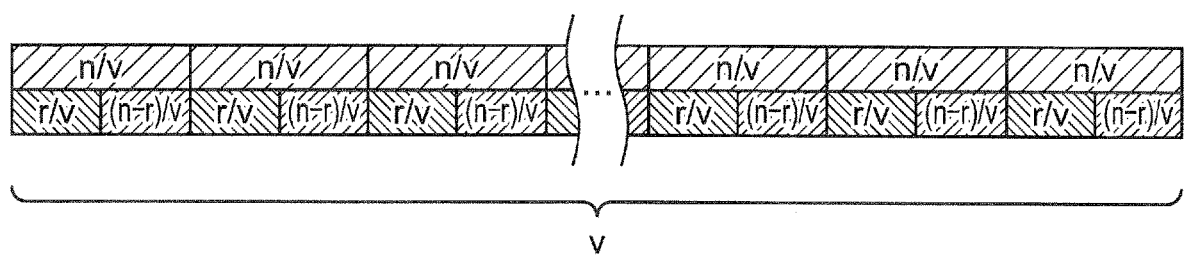
FIG. 5 is a diagram illustrating another schematic configuration example of one refresh cycle in the DRAM of FIG. 1.

The following expresses equations obtained if FIG. 5 is applied to the mathematical expressions of calculation example 1.

N=number of ACTIVE commands that can be input in the auto refresh cycle $t_{REFI}$ n/v
K=number of different addresses in the auto refresh cycle $t_{REFI}$=(n−r)/v
A=number of chances to perform the refresh of the victim address=v $B$ = probability of selecting different addresses for the auto refresh cycle $t_{REFI}$ $= (_{N-1}C_{Ka-1})/(_NC_{Ka})$ $= _{(n/v-1)}C_{(n/v-r/v-1)}/_{(n/v)}C_{(n-r)}/v$ $= (n/v-1)!/\{(n/v-1-n/v+r/v+1)! \times (n/v-r/v-1)!\}/$ $\{(n/v)!/(n/v-n/v+r/v)!/(n/v-r/v)!\}$ $= (n/v-1)!/(r/v)!/(n/v-r/v-1)!/(n/v)! \times (r/v)! \times (n/v-r/v)!$ $= \{(n/v-1) \times (n/v-2) \times ... \times 2 \times 1\}/\{n/v \times (n/v-1) \times (n/v-2) \times ... \times$ $2 \times 1\} \times \{(n/v-r/v) \times (n/v-r/v-1) \times (n/v-r/v-2) \times ... \times 2 \times 1\}$ $= (n/v-r/v)/(n/v)$ $= (n-r)/n$ In this case, the following equation expresses the probability of failure as a whole.

$$B^A = \{(n-r)/n\}^v$$

Figures 6, 7:
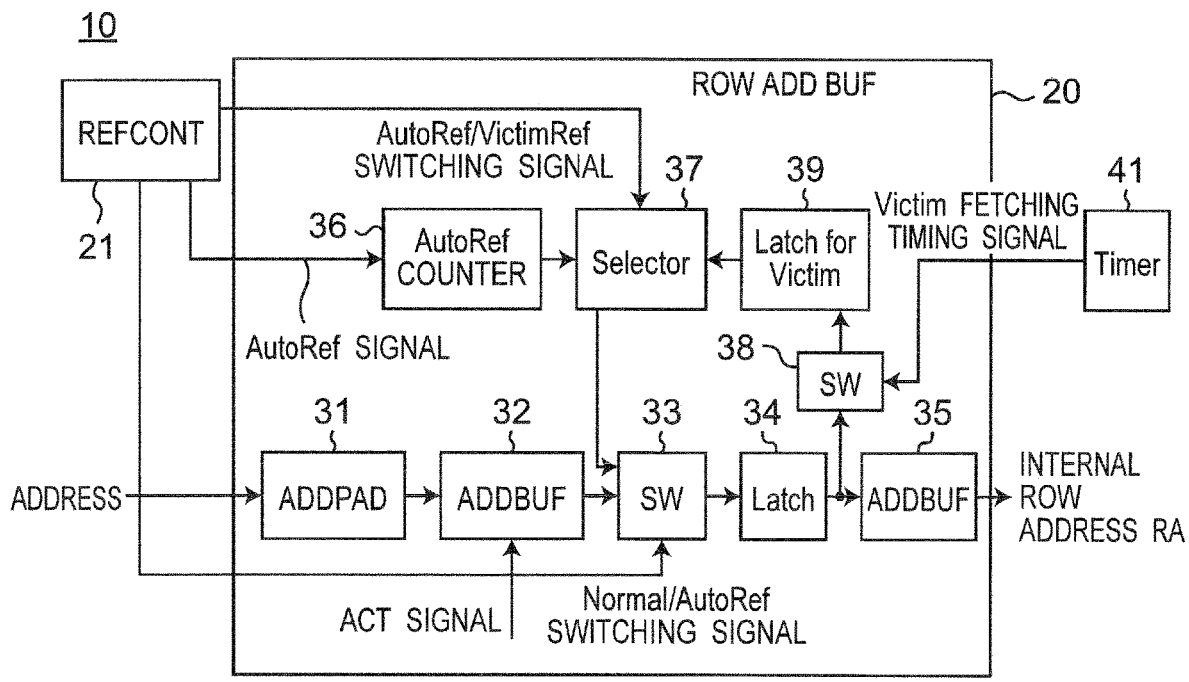
FIG. 6 is a table illustrating the calculation result of a misselection probability in 10 years in the DRAM of FIG. 1.
FIG. 7 is a block diagram illustrating a configuration example of a part of a row control circuit 10 of the DRAM according to a first embodiment.

FIG. 6 indicates the probability of continuously misselecting under the conditions of FIG. 6 obtained by this equation. FIG. 6 indicates that failure probability is sufficiently small. It is noted that, in FIG. 6, skip indicates the refresh of the victim address performed once in four times.

The calculation of FIG. 6 expresses the result obtained when the refresh is performed on the victim cell once in the auto refresh performed four times. The calculation of FIG. 6 indicates that a sufficient result is obtained without executing the refresh every time.

First Embodiment

FIG. 7 is a block diagram illustrating a configuration example of a part of a row control circuit 10 of a DRAM according to a first embodiment. In addition, FIG. 8 is a block diagram illustrating a configuration example of the row control circuit 10 in FIG. 7, and FIG. 9 is a block diagram illustrating a configuration example of a victim address calculation circuit 53 of FIG. 8. Further, FIG. 10 is a truth table illustrating operation of the victim address calculation circuit 53 of FIG. 9.

Referring to FIGS. 7 and 8, the row control circuit 10 includes a row address buffer 20, a refresh controller 21, a timer circuit 41, and a circuit of FIG. 8. The row address buffer 20 includes an address pad 31, an address buffer 32, a switch 33, a latch 34, an address buffer 35, an auto refresh counter 36, a selector 37, a switch 38, and a latch 39 for a victim address. For example, for 13 row address buffers 20-1 to 20-13, the circuit of FIG. 8 includes a row redundancy judgment circuit 51, a row address generation circuit 52, a victim address calculation circuit 53, and a row decoder 54.

Referring to FIG. 7, at each timing described later in detail, the refresh controller 21 is configured to:

(1) generates an AUTO REFRESH command giving an instruction to perform the auto refresh, and outputs the AUTO REFRESH command to the auto refresh counter 36;

(2) generates a Normal/AutoRef switching signal for giving an instruction to selectively switch over between normal operation and auto refresh operation, and outputs the signal to the switch 33; and (3) generates an AutoRef/VictimRef switching signal for giving an instruction to selectively switch over between the auto refresh operation and refresh operation for the victim address, and outputs the signal to the selector 37.

The specified address from the memory controller 101 is inputted via the address pad 31. The address buffer 32 temporarily stores an ACTIVE (ACT) command (it is noted that a signal generated according to an ACTIVE command is referred to as an active (ACT) signal)) from the memory controller 101. The latch 34 latches the ACTIVE command transmitted via the switch 33. The switch 33 outputs the address of the address buffer 32 to the latch 34 and causes the latch 34 to latch the address, according to the Normal/AutoRef switching signal giving an instruction to perform normal operation. In addition, the switch 33 outputs the address from the selector 37 to the latch 34 and causes the latch 34 to latch the address, according to the Normal/AutoRef switching signal giving an instruction to perform auto refresh operation.

The address from the latch 34 is outputted as an internal row address RA via the address buffer 35, and then, is latched in the latch 39 via the switch 38. The switch 38 fetches the address latched by the latch 34 at the timing indicated by a Victim fetching timing signal from the timer circuit 41, which generates the Victim fetching timing signal at a predetermined cycle, and causes the latch 39 to latch the address as a victim address. The latch 39 outputs the address to the latch 34 via the selector 37 and the switch 33.

The auto refresh counter 36 includes an up counter. The auto refresh counter 36 increments a count value according to the AUTO REFRESH command from the refresh controller 21, and outputs data of the count value to the switch 33 via the selector 37. According to the AutoRef/VictimRef switching signal giving an instruction to perform auto refresh operation from the refresh controller 21, the selector 37 selects data from the auto refresh counter 36, and outputs the data to the switch 33. Meanwhile, the selector 37 selects the address from the latch 39, and outputs the address to the switch 33 according to the AutoRef/VictimRef switching signal giving an instruction to perform victim refresh operation.

Referring to FIG. 8, the row redundancy judgment circuit 51 and the row address generation circuit 52 receive 13 row addresses RA <12:0> from the row address buffers 20-1 to 20-13. The row redundancy judgment circuit 51 is, for example, a known circuit that Patent Document 4 discloses. The row redundancy judgment circuit 51 judges whether or not the input row address is redundant according to information stored in advance, and outputs a row address SRA <5:0> which is information of the row address to be replaced to the row address generation circuit 52. The row address generation circuit 52 generates a row address RAD <12:0> to be used according to the input row address RA <12:0> and the input row address SRA <5:0>, and outputs the row address RAD <12:0> to the victim address calculation circuit 53.

Referring to FIG. 9, the victim address calculation circuit 53 includes a buffer amplifier 61, an inverter 62, an EXOR gate 63, and two inverters 64 and 65. The victim address calculation circuit 53 calculates the victim row address by executing logical operations of FIG. 10 according to an AutoRef/VictimRef switching signal VictimRefsw and a row address RAD <0>, and outputs the victim row address to the row decoder 54. It is noted that the victim address calculation circuit 53 of FIG. 9 calculates the victim address by changing only the lower address, and outputs the other upper address as it is. The row decoder 54 decodes the input row address into a row control signal (row address), and outputs the row control signal.

The components of the row control circuit 10 of FIGS. 7 to 9 added to or changed from the components of the row control circuit of the prior art are the refresh controller 21, the selector 37, the switch 38, the timer circuit 41, and the victim address calculation circuit 53. The row control circuit 10 is characterized by further including these circuits. It is noted that the circuit for the AutoRef/VictimRef switching signal needs to be changed depending on different specifications of the respective embodiments. In the first embodiment, for example, the refresh controller 21 is configured to execute the victim refresh subsequently to completion of the auto refresh.

In addition, Victim fetching timing signals differ according to the specifications of the respective embodiments. In the example of the first embodiment, the timer circuit 41 generates the timer signal as a Victim fetching timing signal. The latch 39 fetches the address latched by the latch 34 as the victim address at the timing of the Victim fetching timing signal. It is noted that by performing a conversion process to the victim address after judgment made by the row redundancy judgment circuit 51, it is possible to take countermeasures without misselecting the victim address for the affected part even if the victim address is replaced after redundancy judgment.

The row control circuit 10 of FIG. 7 can be configured by including the refresh controller 21, the selector 37, the latch 39, the switches 38 and 33, and the timer circuit 41. Therefore, the row control circuit 10 latches a target address upon issuing of an ACTIVE command to the semiconductor memory device such as a DRAM or a row address of a victim cell, in which data of a memory cell is affected by the target address, as a victim address by using a predetermined row address latch method. Thus, the row control circuit 10 can refresh the victim cell having the victim address by a predetermined refresh method upon issuing of a REFRESH command.

The row control circuit 10 of FIG. 7 includes a timer circuit 41. By using the switch 38 and the latch 39, the row control circuit 10 can latch the row address as the victim address according to the row address latch method, at the timing that the timer signal outputted from the timer circuit 41 indicates. It is noted that the victim address calculation circuit 53 of FIGS. 8 and 9 can perform the specific victim address calculation.

In this case, the effectiveness of the timer circuit 41 will be described below with reference to FIGS. 12 to 15.

Figure 12:
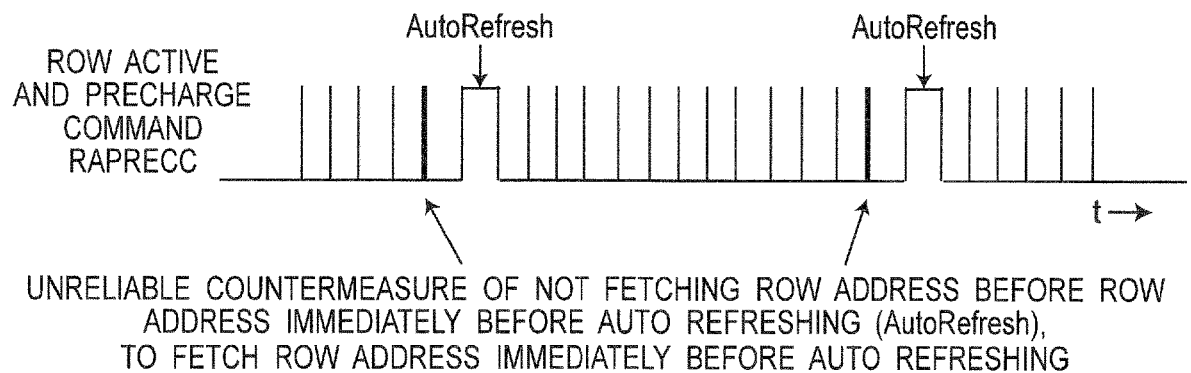
FIG. 12 is a timing chart illustrating a first operation example of a ROW ACTIVE AND PRECHARGE command RAPRECC in the DRAM of FIG. 1.
Figure 13:
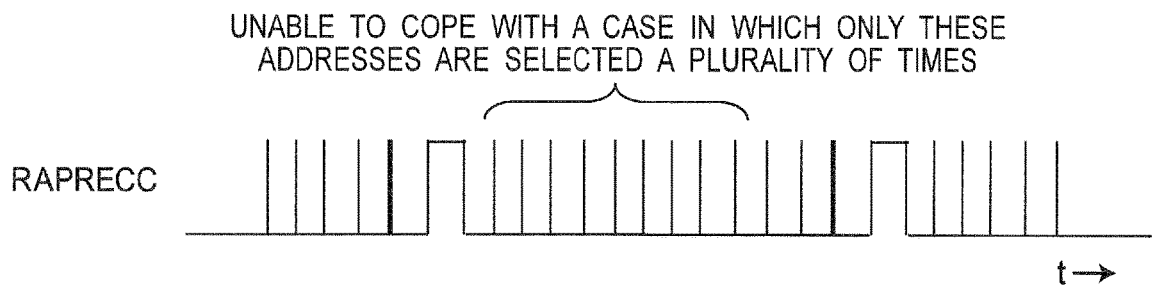
FIG. 13 is a timing chart illustrating a second operation example of the ROW ACTIVE AND PRECHARGE command RAPRECC in the DRAM of FIG. 1.
Figure 14:
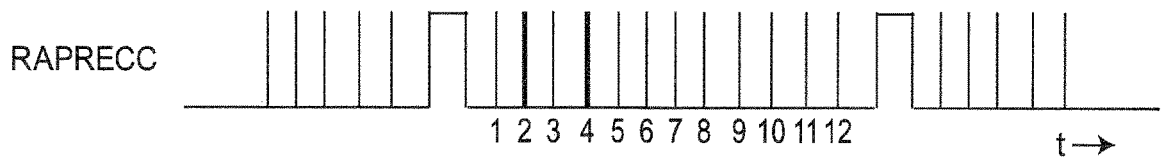
FIG. 14 is a timing chart illustrating a third operation example of the ROW ACTIVE AND PRECHARGE command RAPRECC in the DRAM of FIG. 1.
Figure 15:
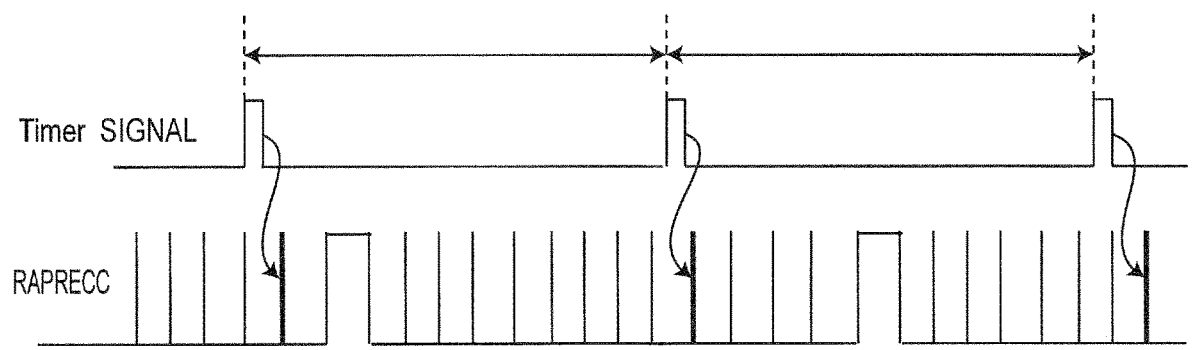
FIG. 15 is a timing chart illustrating a fourth operation example of the ROW ACTIVE AND PRECHARGE command RAPRECC in the DRAM of FIG. 1.
Figure 16:
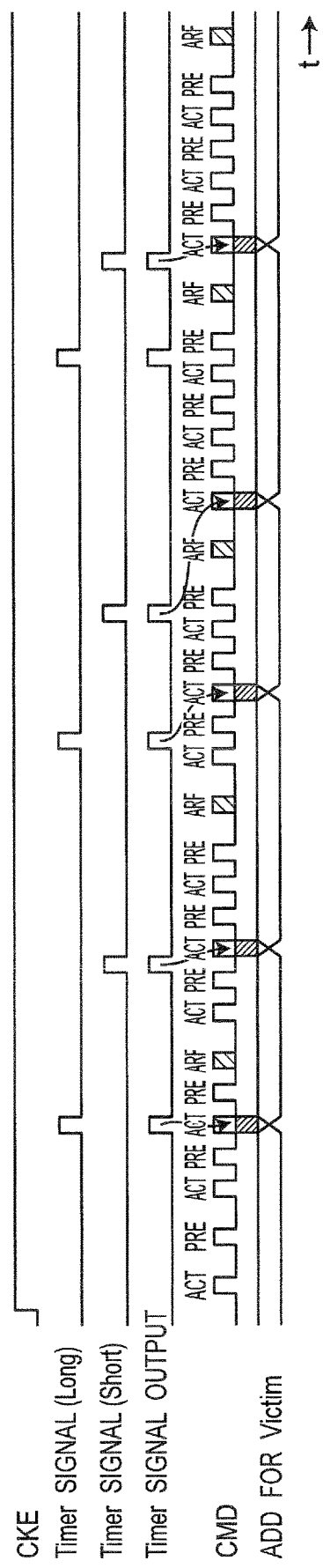
FIG. 16 is a timing chart illustrating an operation example of the row control circuit 10 according to the first embodiment.

FIG. 12 is a timing chart illustrating a first operation example of a ROW ACTIVE AND PRECHARGE command RAPRECC in the DRAM of FIG. 1. FIG. 13 is a timing chart illustrating a second operation example of the ROW ACTIVE AND PRECHARGE command RAPRECC in the DRAM of FIG. 1. FIG. 14 is a timing chart illustrating a third operation example of the ROW ACTIVE AND PRECHARGE command RAPRECC in the DRAM of FIG. 1. FIG. 15 is a timing chart illustrating a fourth operation example of the ROW ACTIVE AND PRECHARGE command RAPRECC in the DRAM of FIG. 1.

As apparent from FIGS. 12 and 13, for example, in the case of a method of latching a row address at the time of an ACTIVE command immediately before the auto refresh, the countermeasure according to the present embodiment cannot cope with a case where an address accessed a plurality of times in the actual use is accessed at a timing except the timing immediately before the auto refresh. In actual machines, there is little likelihood that the above will happen; however, intentional performance of such an operation in a device selection test or the like will cause failure.

As apparent from FIG. 14, specifying the fetching position in a specific method (for example, the second or fourth address after the auto refresh, or the like) will result in a similar outcome.

In order to solve the above problem, as apparent from FIG. 15, it is possible to set fetching positions at random by using the timer circuit 41 installed inside to set the cycle of the timer circuit 41 to be different from 7.8 μs which is the auto refresh cycle.

Figure 11:
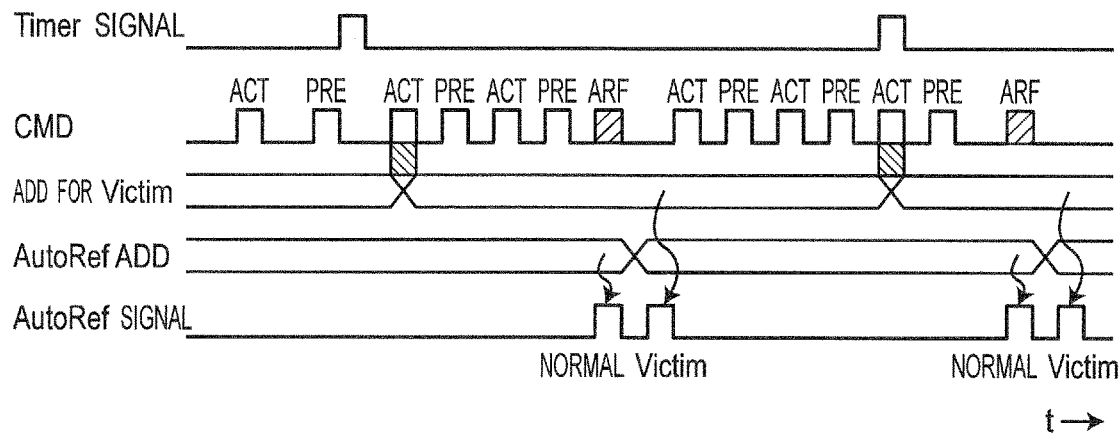
FIG. 11 is a timing chart illustrating an operation of the row control circuit 10 according to the first embodiment.

FIG. 11 is a timing chart illustrating operation of the row control circuit 10 according to the first embodiment. In FIG. 11 and subsequent drawings, the following abbreviations are used:
Command (CMD)
ACTIVE command (ACT)
PRECHARGE command (PRE)
AUTO REFRESH command (ARF; AutoRef)
Clock enable signal (CKE)

As apparent from FIG. 11, the switch 38 and the latch 39 can cause the row address to be latched as the victim address at the timing indicated by a timer signal outputted from the timer circuit 41.

Figure 60:
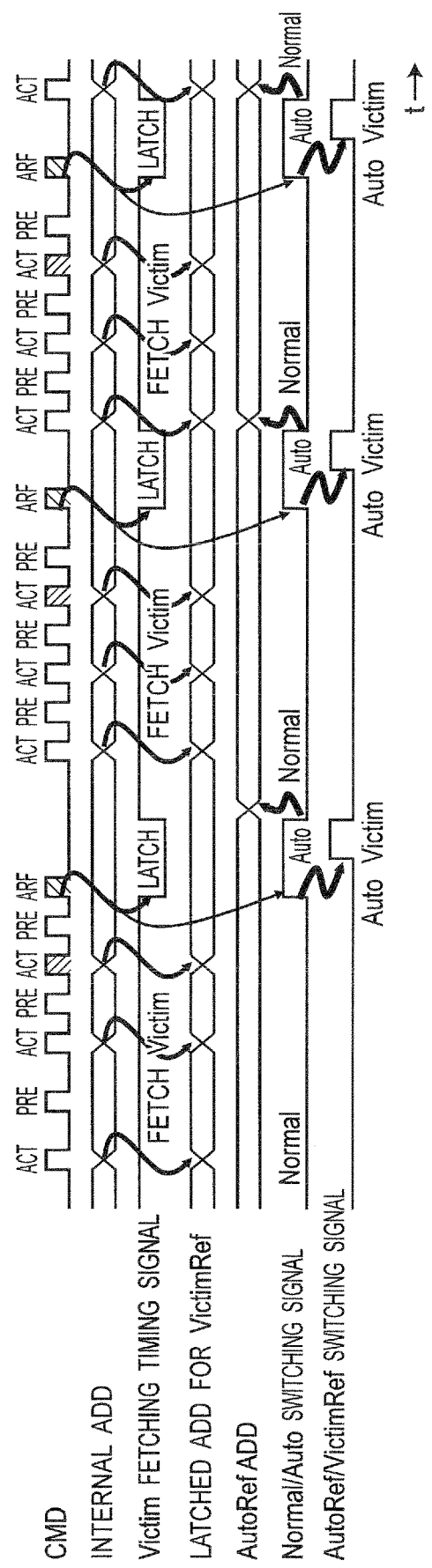
FIG. 60 is a timing chart illustrating an operation example when the address fetched according to an ACTIVE command immediately before issuing of a REFRESH command is a victim address for the victim refresh, in the row control circuits 10 and 10A according to the first and second embodiments.

FIG. 60 is a timing chart illustrating an operation example when the address fetched according to an ACTIVE command immediately before issuing of a REFRESH command is a victim address for the victim refresh in the row control circuit 10 (10A) according to the present embodiment (including a second embodiment). The row control circuit 10 of FIG. 7 includes the auto refresh counter 36, which counts AUTO REFRESH commands. The row control circuit 10 refreshes the address specified by the count value from the auto refresh counter 36, and then, subsequently refreshes the victim cell having the victim address latched according to the ACTIVE command for an identical auto refresh command interval. As apparent from FIG. 60, for example, this is operation of switching over the AutoRef/VictimRef switching signal after switching over the mode from a normal operation mode to an auto refresh mode, and refreshing the victim cell having the victim address (referred to as a victim refresh) after performing the auto refresh in an identical AUTO REFRESH (AutoRef) command.

In addition, the operation of refreshing the victim cell having the victim address latched according to the ACTIVE command is executed by all AUTO REFRESH commands. As apparent from FIG. 60, this operation is switching over the AutoRef/VictimRef switching signal after the mode is switched over from the normal operation mode to the auto refresh mode in each auto refresh, and always performing the victim refresh after the auto refresh.

Figure 64:
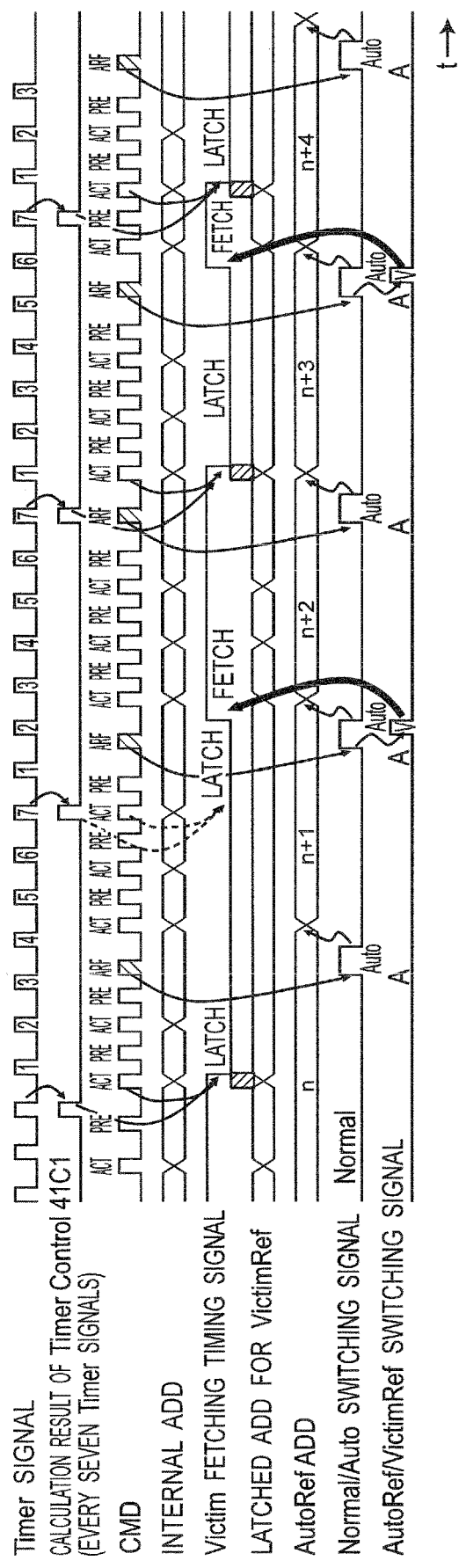
FIG. 64 is a timing chart illustrating an operation example when receiving a pulse, which occurs as a result of calculation based on a timer cycle, latching an address for the victim refresh according to the ACTIVE command issued after the pulse, and latching the address until the timing of an ACTIVE command after the victim refresh, in the row control circuits 10, 10E, 10F, and 10G according to the first, sixth, seventh, and eighth embodiments.
Figure 65:
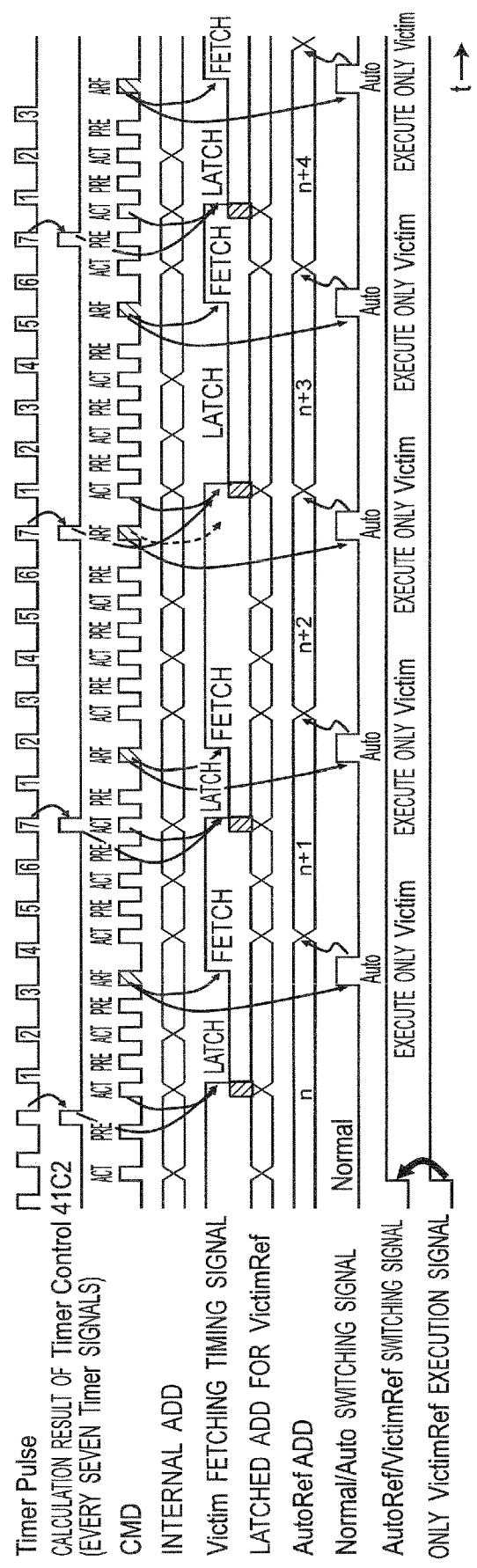
FIG. 65 is a timing chart illustrating an operation example when where an AutoRef/VictimRef switching signal always selects the victim refresh according to a test mode or the like in the row control circuit 10H according to the ninth embodiment.

FIG. 64 is a timing chart illustrating an operation example of the row control circuit 10 (10E, 10F, and 10G) according to the present embodiment (including sixth, seventh, and eighth embodiments), when receiving a timer signal, which is a pulse signal generated as a result of calculation based on a timer cycle, latching an address for the victim refresh according to the ACTIVE command issued after the timer signal, and latching the address until the timing of an ACTIVE command after the victim refresh is performed. The row control circuit 10 of FIG. 7 may perform the operation of refreshing the victim cell having the victim address latched by the ACTIVE command, according to the AUTO REFRESH command, for example, at a rate of once in a plurality of AUTO REFRESH commands. As apparent from FIG. 64, in this operation, the AutoRef/VictimRef switching signal rises once after the mode is switched over from the normal operation mode to the auto refresh mode twice, and the victim refresh is performed once after the auto refresh is performed twice.

Figure 66:
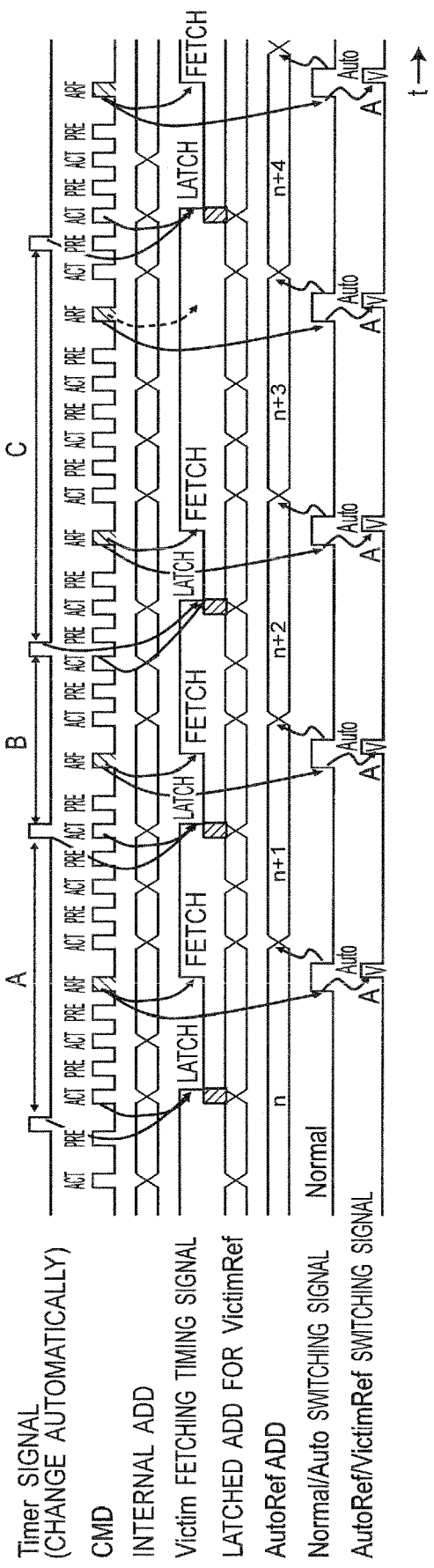
FIG. 66 is a timing chart illustrating an operation example when the timer cycle automatically changes due to, for example, a change in temperature, a change in voltage, a counter inside a timer, or the like, in the row control circuit 10 according to the first embodiment.

FIG. 66 is a timing chart illustrating an operation example when the timer cycle automatically changes due to, for example, a change in temperature, a change in voltage, a counter inside a timer, or the like in the row control circuit 10 according to the first embodiment. The row control circuit 10 of FIG. 7 may automatically and selectively change the cycle of the timer signal (Victim fetching timing signal) that the timer circuit 41 generates. As apparent from FIG. 66, the cycle of the timer signal changes automatically (depending on a change in temperature, a change in voltage, a counter value inside the timer circuit, or the like), and the timer cycles A, B, and C differ from each other in FIG. 66. That is, the counter inside counts trigger signals of the timer cycle or the address fetching cycle with respect to the timer cycle or the address fetching cycle calculated from the timer signal. The address fetching cycle is automatically and selectively changed by switching over the timer cycle itself according to a specific counter value or changing the calculation method. Therefore, it is possible to increase the likelihood that the address will be fetched at random.

The row control circuit 10 of FIG. 8 uses the row address obtained after a row redundancy judgment made by the row redundancy judgment circuit 51 as the victim address. Regarding this, as apparent from FIG. 8, the victim address calculation circuit 53 receives the address signal after the row redundancy judgment made by the row redundancy judgment circuit 51.

The row control circuit 10 according to the first embodiment configured as described above latches a target address upon issuing of an ACTIVE command to the semiconductor memory device such as a DRAM or the row address of the victim cell in which data of the memory cell is affected by the target address as a victim address. The row control circuit 10 refreshes the victim cell having the victim address upon issuing of a REFRESH command. Therefore, it is possible to prevent refresh failure of a memory cell whose the information retention characteristic lowers due to an access history.

Second Embodiment

Figure 17:
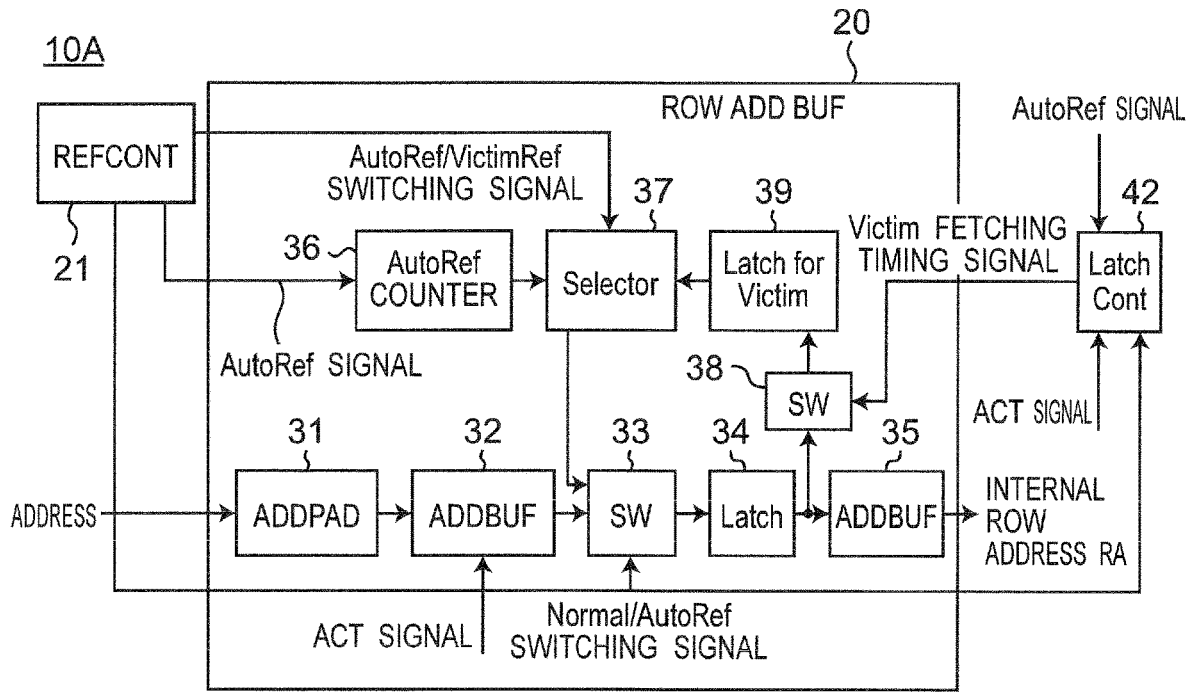
FIG. 17 is a block diagram illustrating a configuration example of a part of a row control circuit 10A of a DRAM according to a second embodiment.

FIG. 17 is a block diagram illustrating a configuration example of a part of a row control circuit 10A of a DRAM according to a second embodiment. In comparison with the row control circuit 10 according to the first embodiment of FIG. 7, the row control circuit 10A according to the second embodiment of FIG. 17 is characterized by including a latch controller 42 instead of the timer circuit 41. The latch controller 42 generates a Victim fetching timing signal according to a Normal/AutoRef switching signal.

Referring to FIG. 17, for example, the latch controller 42 controls the timing of the Victim fetching timing signal so as to latch the row address (row address stored in an address buffer 32) upon issuing of an ACTIVE command executed just before issuing of a REFRESH command. In this case, by only latching again each row address (latched by 32, 34) when a latch 39 which latches the row address is constantly activated by an ACTIVE command, the address which is activated by the ACTIVE command immediately before the auto refresh is latched. In this case, a redundant circuit such as the timer circuit 41 becomes unnecessary. FIG. 60, for example, discloses this operation.

Referring to FIG. 17, for example, the latch controller 42 generates victim fetching timing signal to latch the row address (stored by 32) upon issuing of an ACTIVE command executed immediately after issuing of a REFRESH command. In this case, if the latch 39 which latches the row address is reset upon completion of an AUTO REFRESH (AutoRef) command and the latch 39 holds the address latched once according to the ACTIVE (ACT) command (latched by 32, 34) until the latch 39 is reset, the row address is latched at the time of an ACTIVE command immediately after AutoRef. In this case, a redundant circuit such as the timer circuit 41 becomes unnecessary.

Figure 61:
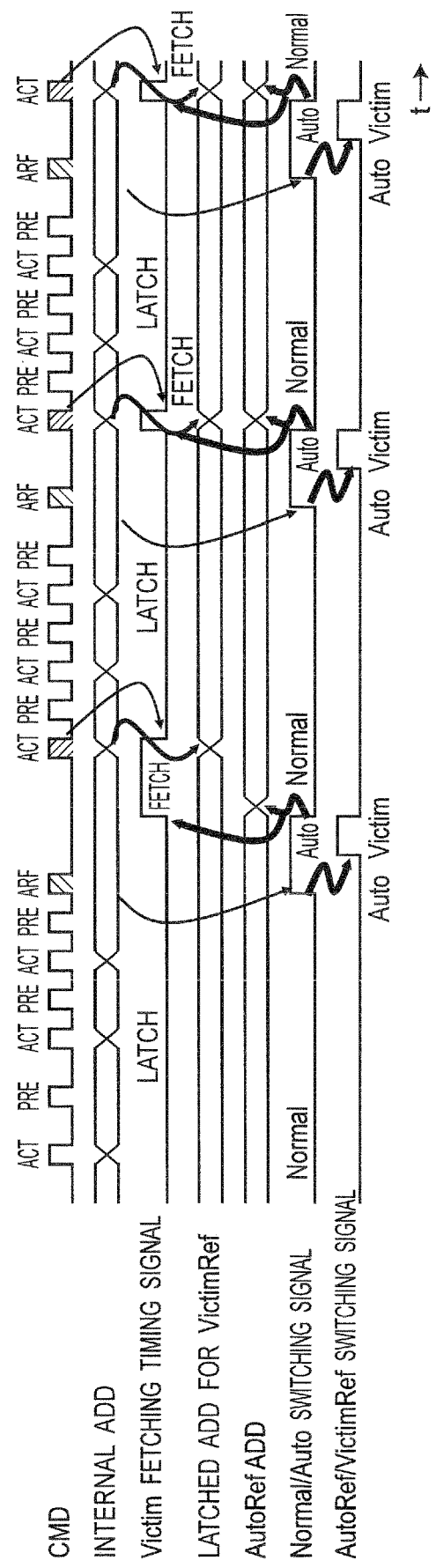
FIG. 61 is a timing chart illustrating an operation example when an address fetched according to an ACTIVE command immediately after issuing of a REFRESH command is an address for the victim refresh, in the row control circuit 10A according to the second embodiment.

FIG. 61 is a timing chart illustrating an operation example when an address fetched according to an ACTIVE command immediately after issuing of a REFRESH command becomes an address for the victim refresh in the row control circuit 10A according to the second embodiment. As apparent from FIG. 61, it is disclosed that the row address (stored by 32) is latched upon issuing of the ACTIVE command executed immediately after issuing of the REFRESH command.

Referring to FIG. 17, the latch controller 42 latches the row address at the time of issuing of the ACTIVE command after issuing of the REFRESH command after a predetermined number of active commands are issued. In this case, instead of the timer circuit 41, the latch controller 42 includes an auto refresh counter, which is an up counter for counting ACTIVE commands. The auto refresh counter has a function of being refreshed for each AutoRef signal, and is configured to issue a latch trigger signal when the count number reaches a predetermined count number. Thus, the latch 39 can fetch the row address after a certain number of ACTIVE (ACT) commands times after the auto refresh.

Figure 62:
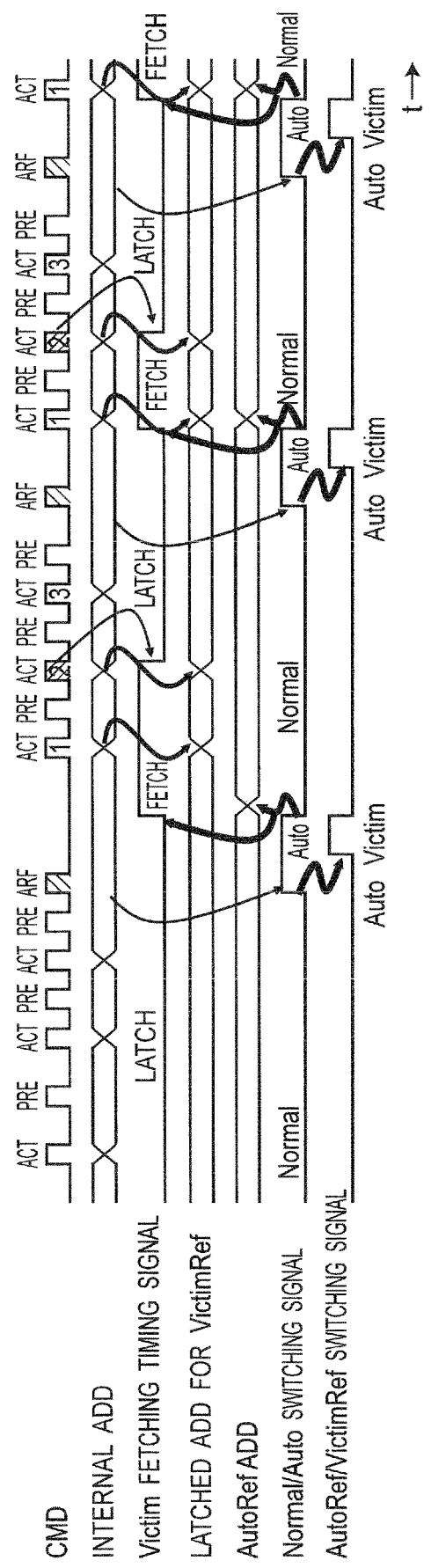
FIG. 62 is a timing chart illustrating an operation example when the address fetched according to an ACTIVE command in a predetermined number (for example, a second ACTIVE command) after issuing of a REFRESH command becomes an address for the victim refresh, in the row control circuit 10A according to the second embodiment.
Figure 63:
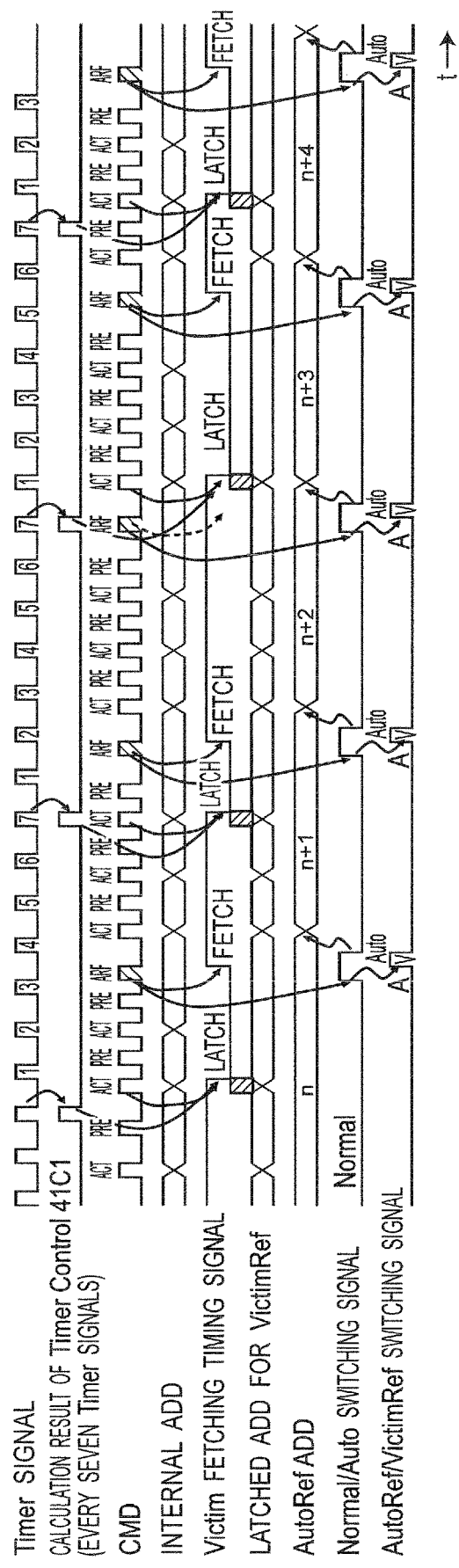
FIG. 63 is a timing chart illustrating an operation example when receiving a pulse, which occurs as a result of calculation based on a timer cycle, latching an address for the victim refresh according to the ACTIVE command issued after the pulse, and latching the address until the timing of an AUTO REFRESH command, in the row control circuit 10C according to the fourth embodiment.

FIG. 62 is a timing chart illustrating an operation example when the address fetched according to an ACTIVE command in a predetermined number (for example, a second ACTIVE command) after issuing of a REFRESH command becomes an address for the victim refresh in the row control circuit 10A according to the second embodiment. As apparent from FIG. 62, after the REFRESH command is issued, for example, an address fetched according to the second ACTIVE command is latched as an address for the victim refresh.

The row control circuit 10A according to the second embodiment configured as described above includes the latch controller 42 instead of the timer circuit 41, and thus extra circuits such as the timer circuit 41 are not required. Therefore, it is possible to simplify the circuit configuration.

Third Embodiment

Figure 18:
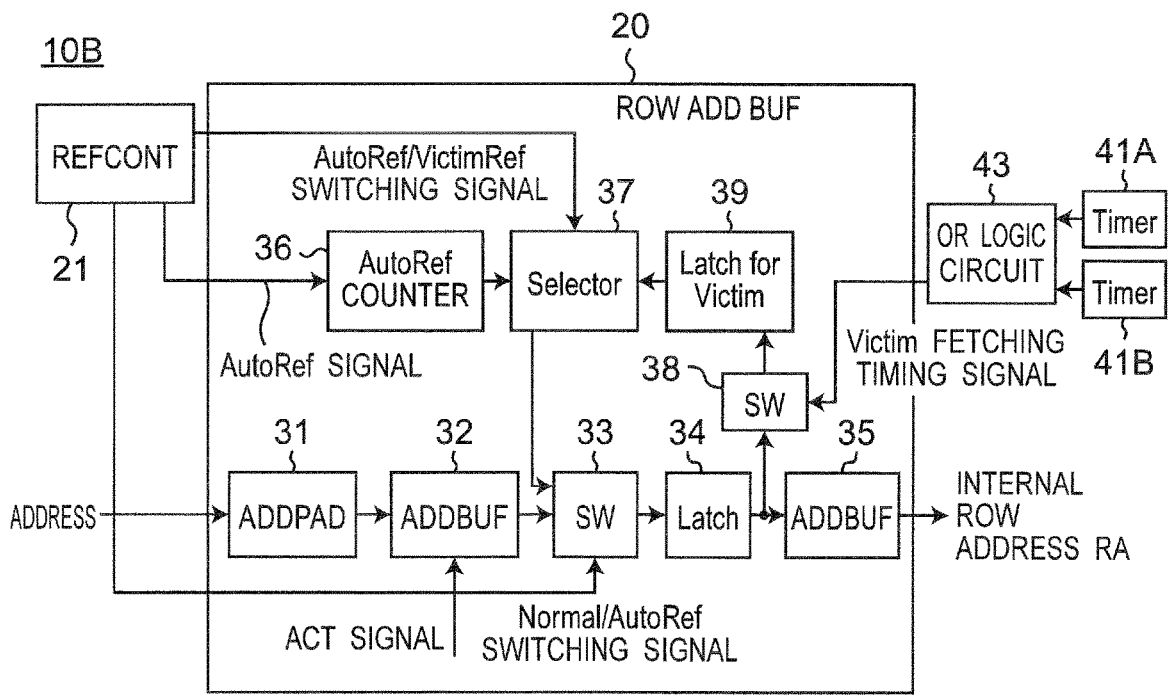
FIG. 18 is a block diagram illustrating a configuration example of a part of a row control circuit 10B of a DRAM according to a third embodiment.

FIG. 18 is a block diagram illustrating a configuration example of a part of a row control circuit 10B of a DRAM according to a third embodiment. In comparison with the row control circuit 10 according to the first embodiment of FIG. 7, the row control circuit 10B according to the third embodiment of FIG. 18 is characterized by including two timer circuits 41A and 41B and an OR logic circuit 43 instead of the timer circuit 41.

Referring to FIG. 18, the timer circuits 41A and 41B generate timer signals having different cycles, and output the timer signals to the OR logic circuit 43. The OR logic circuit 43 performs an OR (logical sum) operation of the two input timer signals, and outputs the resultant signal to a switch 38 as a Victim fetching timing signal which is a timer signal. By combining the timer circuits 41A and 41B having different cycles, it is possible to fetch row addresses at random. It is noted that the number of timer circuits 41A and 41B may be three or more.

Fourth Embodiment

Figure 19:
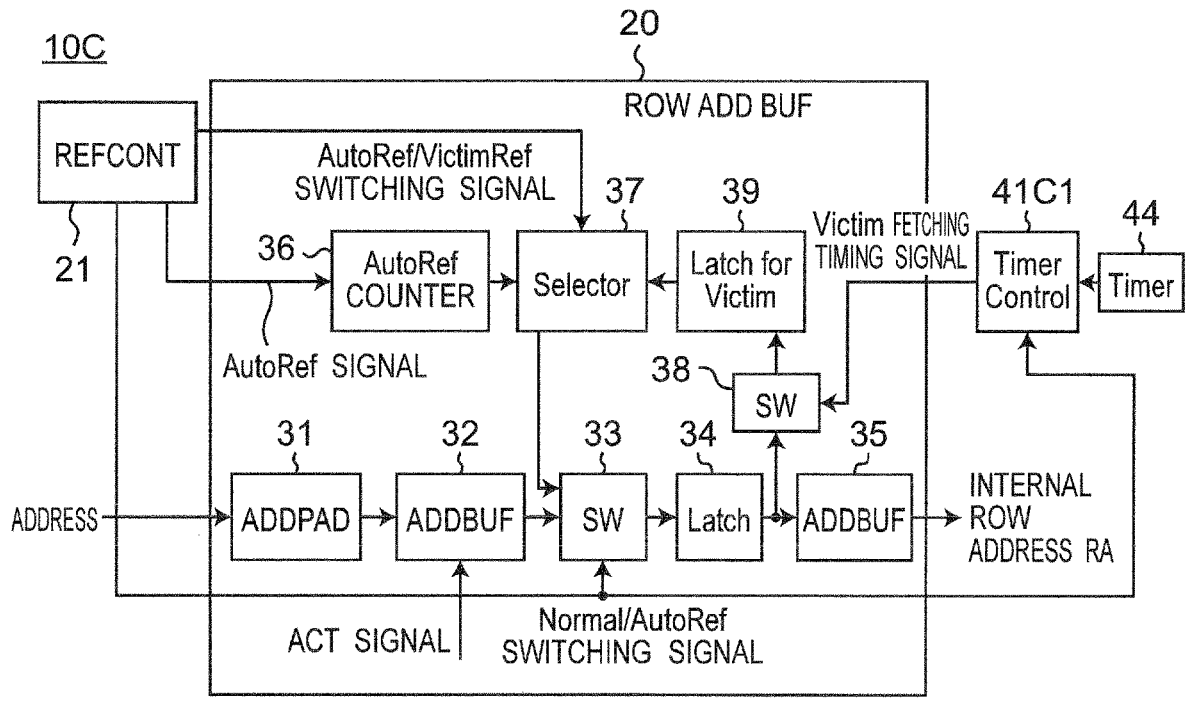
FIG. 19 is a block diagram illustrating a configuration example of a part of a row control circuit 10C of a DRAM according to a fourth embodiment.

FIG. 19 is a block diagram illustrating a configuration example of a part of a row control circuit 10C of a DRAM according to a fourth embodiment. In comparison with the row control circuit 10 according to the first embodiment of FIG. 7, the row control circuit 10C according to the fourth embodiment of FIG. 19 is characterized by including a timer circuit 44 and a timer controller 41C1 instead of the timer circuit 41 and that the timer controller 41C1 sets the cycle of a timer signal to be longer than an auto refresh cycle according to a Normal/AutoRef switching signal.

If a timer cycle of the timer circuit 44 or an address fetching timing cycle determined by the timer circuit 44 (hereinafter referred to as an address fetching cycle) is shorter than the auto refresh cycle, the deviation of the fetching position may occur depending on the address at which time point is kept to be latched. Therefore, it is preferable that the address fetching cycle be longer than the auto refresh cycle or the cycle of refreshing a victim cell.

When the latch 39 latches the address at the time of the ACTIVE command after generation of a fetching trigger signal of the address fetching cycle and keeps latching the address until reception of an auto refresh signal, when the address fetching cycle is shorter than the refresh cycle, the address is not able to be latched at the time of the ACTIVE command immediately before the auto refresh, in the time of the auto refresh cycle minus the address fetching cycle.

In contrast, in a method of latching a row address of the ACTIVE command after occurrence of a fetching trigger signal of the address fetching cycle, if the address fetching cycle is shorter, fetching positions concentrate around positions immediately before an AUTO REFRESH command. Therefore, the address is not able to be latched at the time of the ACTIVE command is disabled after the auto refresh, in the time (between the auto refresh cycle and the address fetching cycle). Therefore, it is preferable that the address fetching cycle be longer than the auto refresh cycle.

Figure 28A:
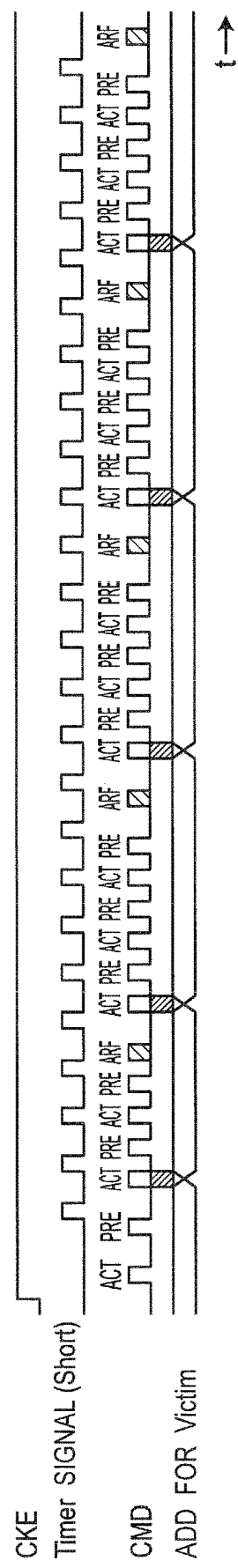
FIG. 28A is a timing chart illustrating an operation example when a timer cycle is shorter than a predetermined value, and when fetching and latching an ACTIVE command after a timer signal is outputted and keeping latching the ACTIVE command until the next auto refresh, in the row control circuit 10C according to the fourth embodiment.

FIG. 28A is a timing chart illustrating an operation example when a timer cycle is shorter than a predetermined value, and when fetching an ACTIVE command after a timer signal is outputted and keeping latching the ACTIVE command until the next auto refresh, in the row control circuit 10C according to the fourth embodiment. As apparent from FIG. 28A, if the timer cycle is shorter than a predetermined value, row address fetching positions concentrate around positions immediately after the AUTO REFRESH commands.

Figure 28B:
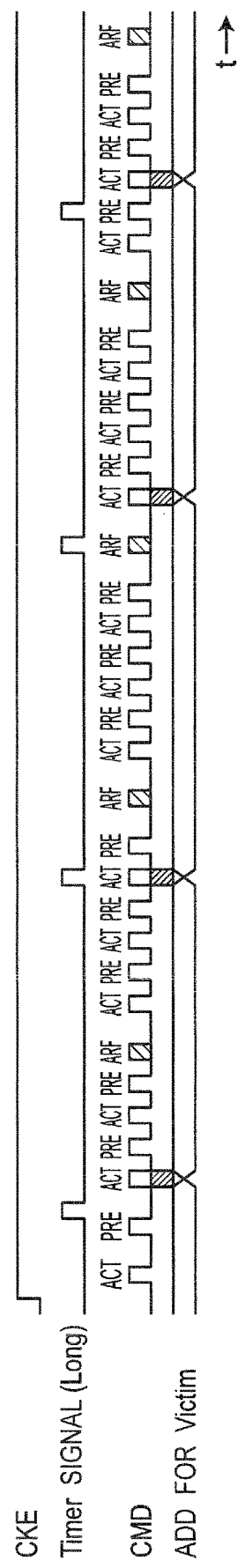
FIG. 28B is a timing chart illustrating an operation example when a timer cycle is longer than the predetermined value, and when fetching and latching an ACTIVE command after a timer signal is outputted and keeping latching the ACTIVE command until the next auto refresh, in the row control circuit 10C according to the fourth embodiment.

FIG. 28B is a timing chart illustrating an operation example when a timer cycle is longer than the predetermined value, and when fetching and latching an ACTIVE command after a timer signal is outputted and keeping latching the ACTIVE command until the next auto refresh, in the row control circuit 10C according to the fourth embodiment. As apparent from FIG. 28B, if the timer cycle is longer than the predetermined value, the row address fetching positions are dispersed to various positions between respective AUTO REFRESH commands.

Figure 29A:
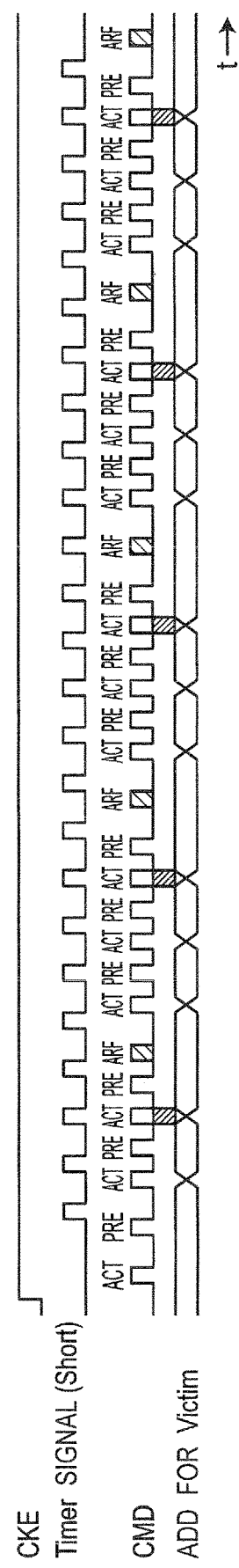
FIG. 29A is a timing chart illustrating an operation example when a timer cycle is shorter than the predetermined value, and when always continuing the operation of fetching and latching a first ACTIVE command after a timer signal is output, in the row control circuit 10C according to the fourth embodiment.

FIG. 29A is a timing chart illustrating an operation example when a timer cycle is shorter than the predetermined value, and when the operation of fetching and latching a first ACTIVE command after a timer signal is outputted always continues in the row control circuit 10C according to the fourth embodiment. As apparent from FIG. 29A, if the timer cycle is shorter than the predetermined value, the row address fetching positions concentrate around positions immediately before the AUTO REFRESH command.

Figure 29B:
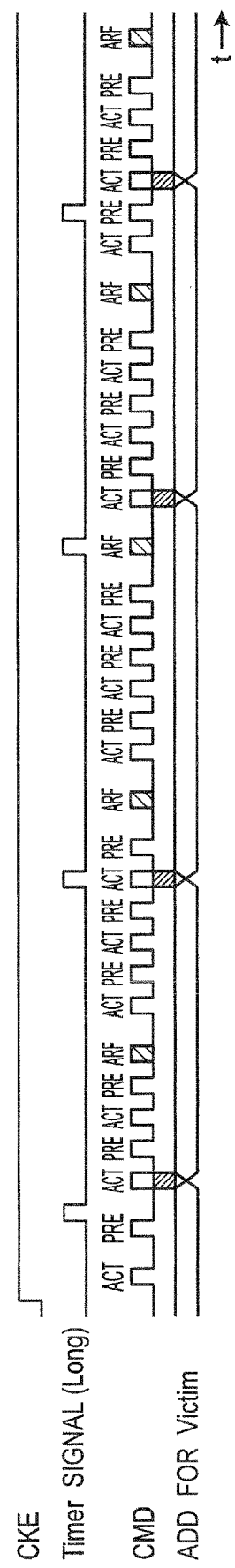
FIG. 29B is a timing chart illustrating an operation example when a timer cycle is longer than the predetermined value, and when always continuing the operation of fetching and latching a first ACTIVE command after a timer signal is output, in the row control circuit 10C according to the fourth embodiment.

FIG. 29B is a timing chart illustrating an operation example when a timer cycle is longer than the predetermined value, and when the operation of fetching and latching a first active command after a timer signal is outputted always continues, in the row control circuit 10C according to the fourth embodiment. As apparent from FIG. 29B, if the timer cycle is longer than the predetermined value, the row address fetching positions are dispersed to various positions between respective AUTO REFRESH commands.

Figure 30:
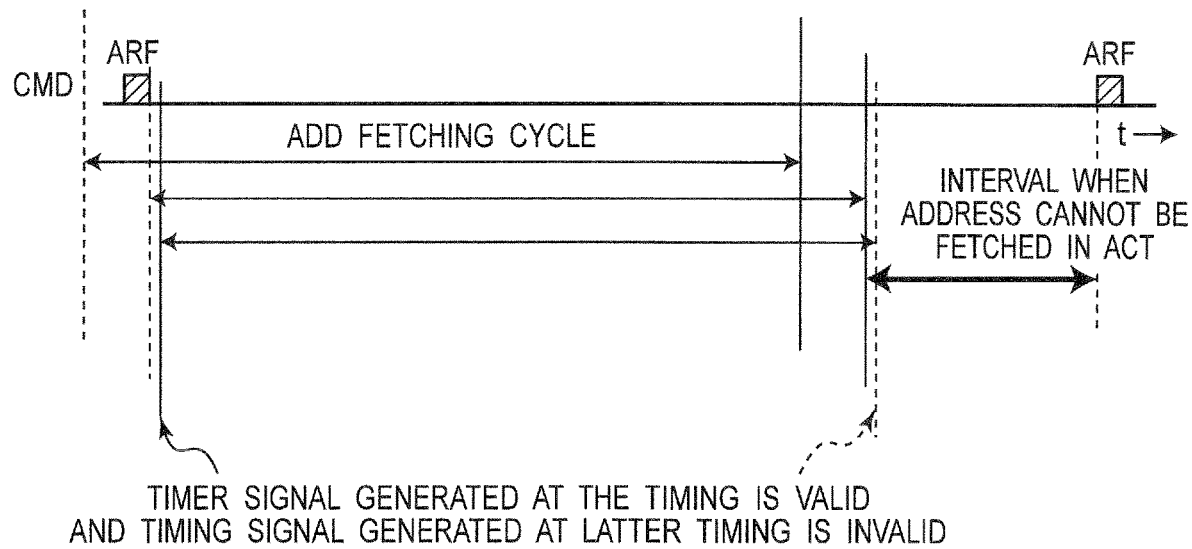
FIG. 30 is a timing chart illustrating an operation example when a first trigger signal after an AUTO REFRESH command is valid, and when an address fetching cycle is shorter than an auto refresh cycle, in the row control circuit 10C according to the fourth embodiment.
Figure 31:
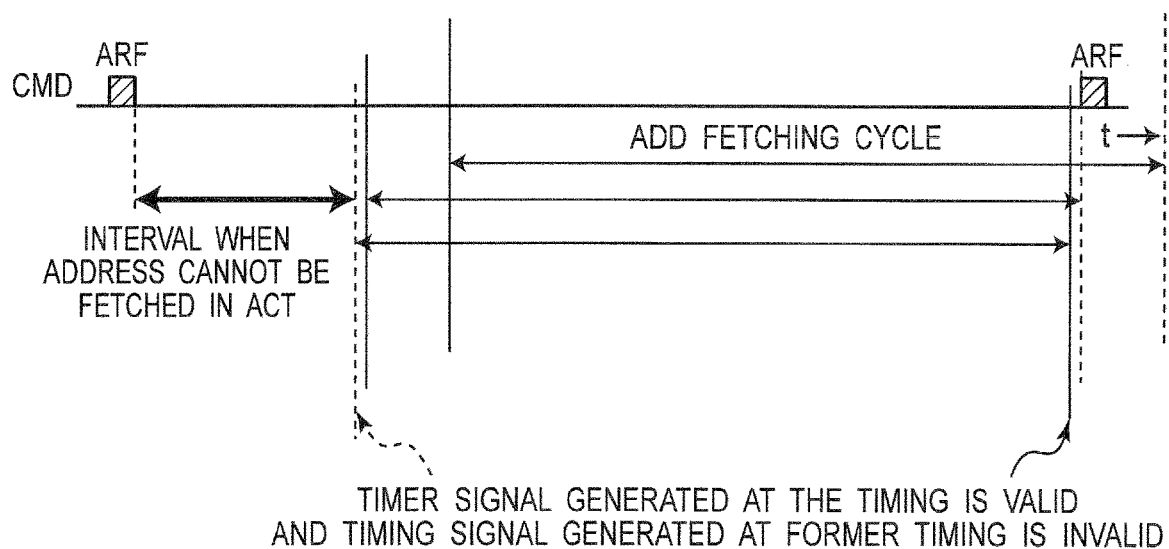
FIG. 31 is a timing chart illustrating an operation example when a trigger signal is valid until immediately before an AUTO REFRESH command, and when an address fetching cycle is shorter than the auto refresh cycle, in the row control circuit 10C according to the fourth embodiment.

FIG. 30 is a timing chart illustrating an operation example when a first trigger signal after an AUTO REFRESH command is valid, and when an address fetching cycle is shorter than the auto refresh cycle, in the row control circuit 10C according to the fourth embodiment. In addition, FIG. 31 is a timing chart illustrating an operation example when a trigger signal is valid until immediately before an AUTO REFRESH command, and when an address fetching cycle is shorter than the auto refresh cycle, in the row control circuit 10C according to the fourth embodiment. As apparent from FIG. 30 and FIG. 31, it is preferable that the address fetching cycle be longer than the auto refresh cycle.

Specifically, for example, this can be realized by causing the timer controller 41C1 of the row control circuit 10C of FIG. 19 to switch over the holding method of the address latch 39 for the victim refresh every auto refresh, according to a Normal/AutoRef switching signal from the refresh controller 21.

As it will be described in detail later, if the address fetching cycle is shorter than the victim refresh cycle, the period that the address cannot be latched will happen before or after the victim refresh according to the method of determining a latched address to be a victim refresh address. (Examples of the method include a method of latching an address according to an ACTIVE command generated after a timer signal of the timer circuit 41 and holding the address until the next auto refresh, and a method of latching again an address according to an ACTIVE command generated after a timer signal every time the timer signal is generated). In order to solve this problem, a latch determination timing should be switched over every time a victim refresh signal is generated, or is switched over by an internal counter circuit or the like not to occur the period that an address cannot be latched. That is, the latch interval of the victim address is preferably changed according to the AUTO REFRESH command or another control signal.

Figure 67:
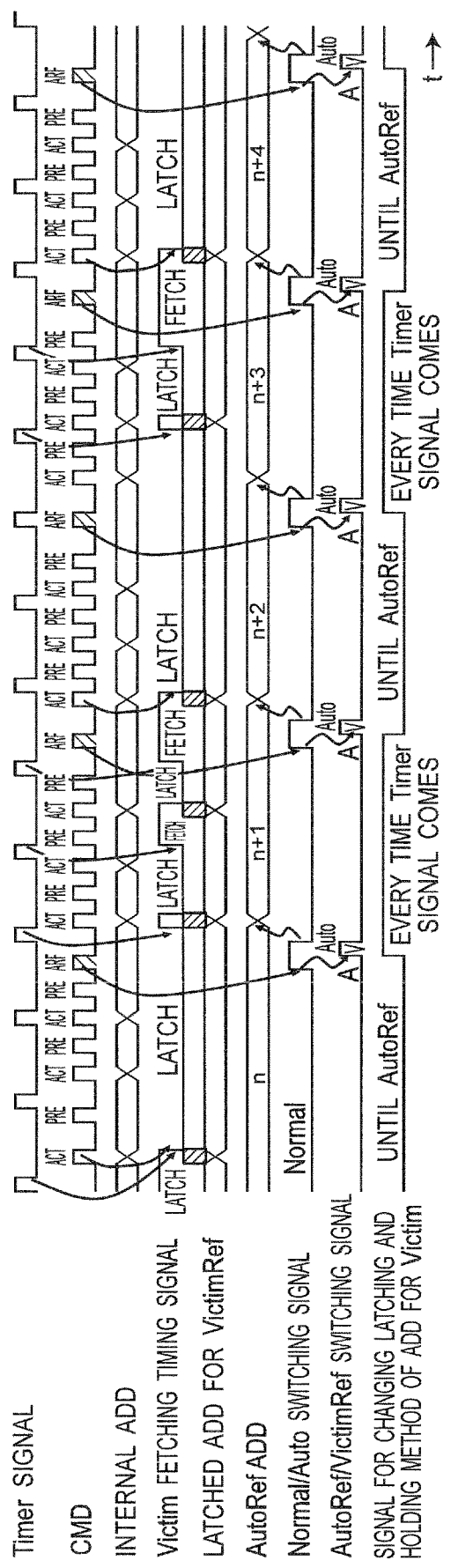
FIG. 67 is a timing chart illustrating an operation example when switching over a holding method of a latched victim address every auto refresh, in the row control circuit 10C according to the fourth embodiment.

FIG. 67 is a timing chart illustrating an operation example in the case of switching over the holding method of a latched victim address every auto refresh, in the row control circuit 10C according to the fourth embodiment. As apparent from FIG. 67, the timer controller 41C1 switches over the holding method of the address latch 39 for the victim refresh every auto refresh, according to a Normal/AutoRef switching signal from the refresh controller 21.

As described above, according to the fourth embodiment, the timer controller 41C1 sets the cycle of the timer signal to be longer than the auto refresh cycle. Therefore, it is possible to disperse row address fetching at various positions with respect to the AUTO REFRESH commands.

Figure 40A:
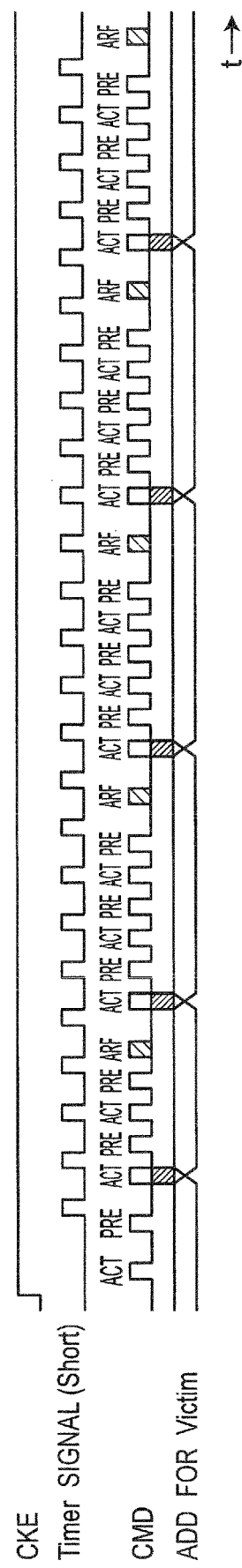
FIG. 40A is a timing chart illustrating an operation example when fetching and latching a first ACTIVE command after a timer signal is output, and then keeping latching a row address in the next auto refresh, in the row control circuit 10C according to the fourth embodiment.

In addition, in the row control circuit 10C of FIG. 19, for example, the timer controller 41C1 may change the victim address latch interval according to an AUTO REFRESH command or another control signal (modified embodiment of the fourth embodiment). FIGS. 40A to 40C illustrate specific operation examples.

FIG. 40A is a timing chart illustrating an operation example when a first ACTIVE command is fetched and latched after a timer signal is outputted and a row address is kept to be latched until the next AUTO REFRESH, in a row control circuit 10C according to a modified embodiment of the fourth embodiment. As apparent from FIG. 40A, if the timer cycle is shorter than a predetermined value, the row address fetching positions concentrate around positions immediately after the auto refresh.

FIG. 40B is a timing chart illustrating an operation example when always continuing operation of fetching and latching the first ACTIVE command after the timer signal is output, in the row control circuit 10C according to the modified embodiment of the fourth embodiment. As apparent from FIG. 40B, if the timer cycle is shorter than the predetermined value, the row address fetching positions concentrate around positions immediately before the auto refresh.

FIG. 40C is a timing chart illustrating an operation example of alternately performing an operation interval T11 and an operation interval T12 in the row control circuit 10C according to the modified embodiment of the fourth embodiment. In the operation interval T11, after a timer signal is outputted, the first ACTIVE command is fetched, and the fetched address is kept to be latched. In the operation interval T12, the operation of fetching and latching the address at every active command is performed after a timer signal is outputted. As apparent from FIG. 40C, by alternating arranging the intervals T11 and T12, it is possible to disperse row address fetching positions.

Therefore, according to the modified embodiment of the fourth embodiment, the timer controller 41C1 controls cycles of the timer signal such that the different intervals T11 and T12 alternately occur. Therefore, it is possible to disperse row address fetching at various positions between respective AUTO REFRESH commands.

Fifth Embodiment

Figure 20:
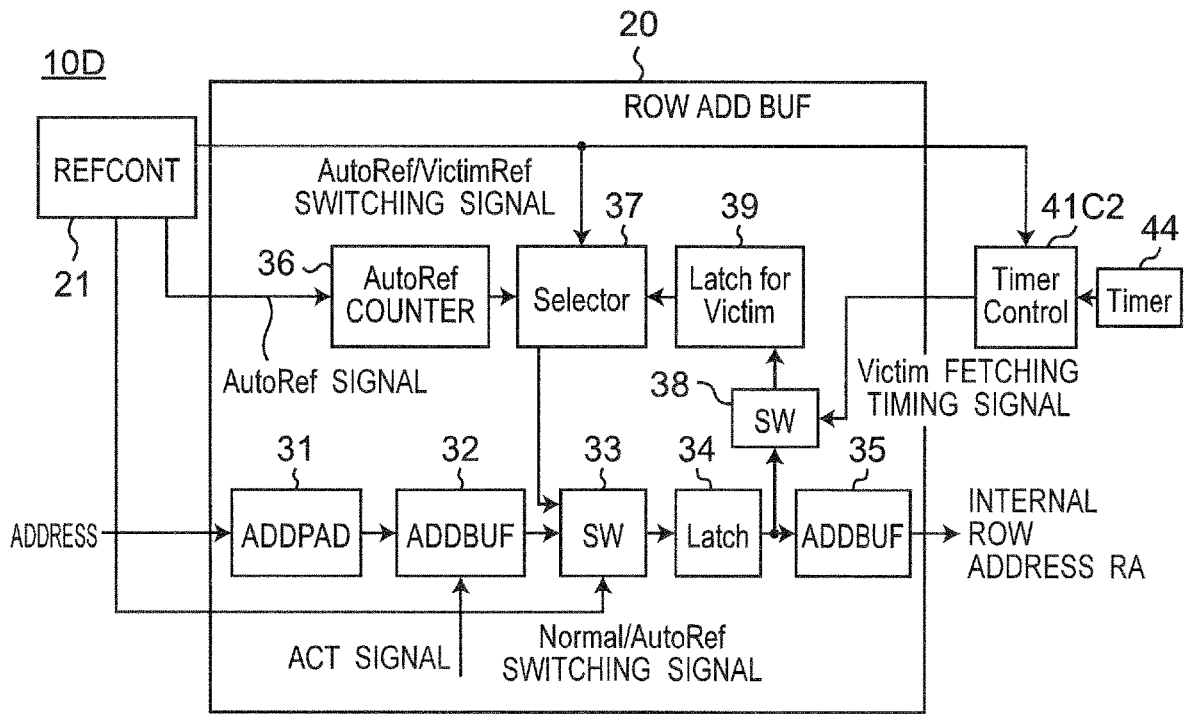
FIG. 20 is a block diagram illustrating a configuration example of a part of a row control circuit 10D of a DRAM according to a fifth embodiment.

FIG. 20 is a block diagram illustrating a configuration example of a part of a row control circuit 10D of a DRAM according to a fifth embodiment. In comparison with the row control circuit 10 according to the first embodiment of FIG. 7, the row control circuit 10D according to the fifth embodiment of FIG. 20 is characterized by including a timer circuit 44 and a timer controller 41C2 instead of the timer circuit 41. The timer controller 41C2 sets the cycle of a timer signal to be longer than a refresh cycle of a victim cell according to an AutoRef/VictimRef switching signal.

Figure 32:
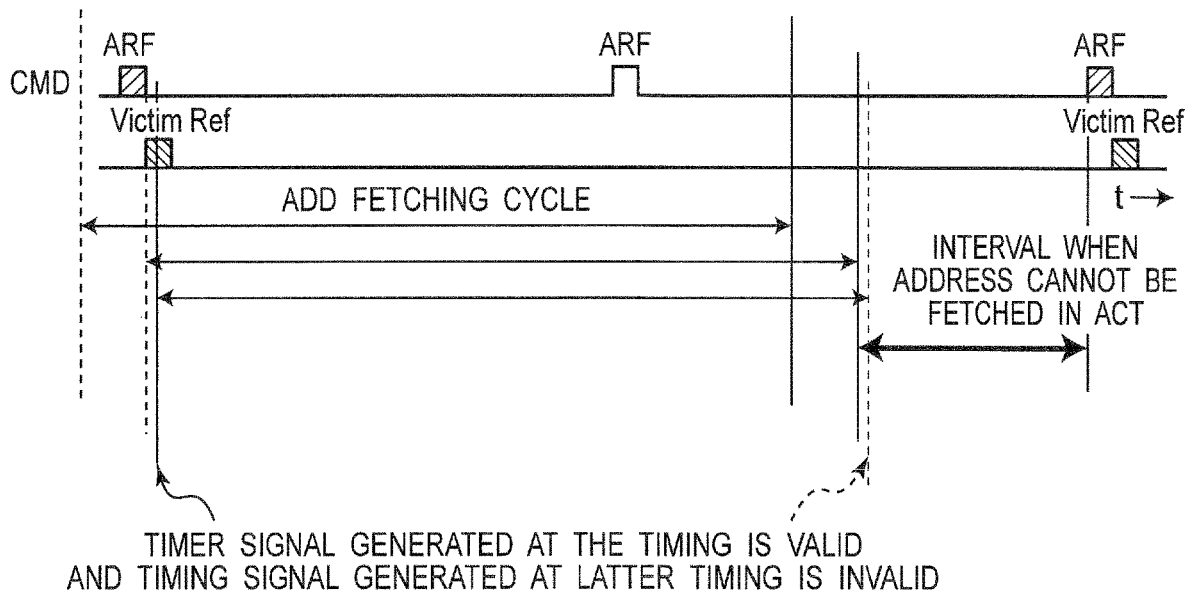
FIG. 32 is a timing chart illustrating an operation example when a first trigger signal after an AUTO REFRESH command is valid, and when an address fetching cycle is shorter than a victim refresh cycle, in the row control circuit 10D according to the fifth embodiment.
Figure 33:
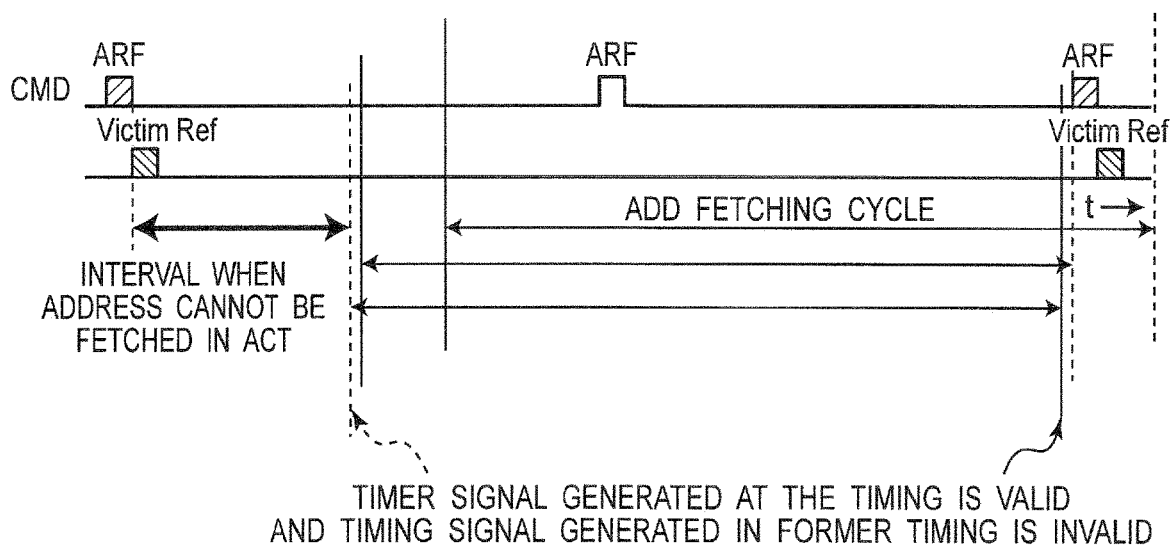
FIG. 33 is a timing chart illustrating an operation example when a trigger signal is valid until immediately before an AUTO REFRESH command, and when an address fetching cycle is shorter than the victim refresh cycle, in the row control circuit 10D according to the fifth embodiment.

FIG. 32 is a timing chart illustrating an operation example when a first trigger signal after the victim refresh is valid, and when an address fetching cycle is shorter than a victim refresh cycle, in the row control circuit 10D according to the fifth embodiment. In addition, FIG. 33 is a timing chart illustrating an operation example when a trigger signal is valid until immediately before the victim refresh when an address fetching cycle is shorter than a victim refresh cycle, in the row control circuit 10D according to the fifth embodiment. In the fifth embodiment, when performing the victim refresh once after the auto refresh of a plurality of times, if a refresh cycle of a victim cell and an address fetching cycle are focused on, the relationship similar to that in the fourth embodiment is established. Therefore, it is preferable that the address fetching cycle be longer than the victim refresh cycle.

As described above, according to the fifth embodiment, for example, the timer controller 41C2 sets the cycle of the timer signal to be longer than the refresh cycle of a victim cell according to the AutoRef/VictimRef switching signal. Therefore, it is possible to disperse row address fetching at various positions between respective AUTO REFRESH commands.

Sixth Embodiment

Figure 21:
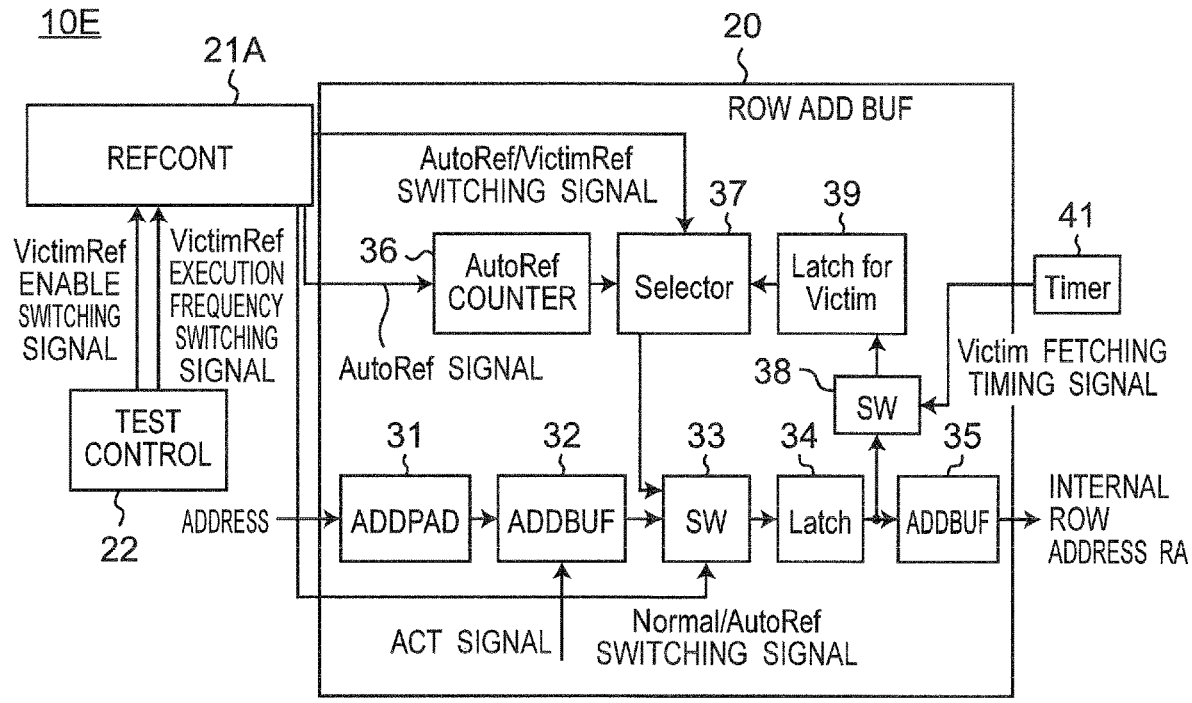
FIG. 21 is a block diagram illustrating a configuration example of a part of a row control circuit 10E of a DRAM according to a sixth embodiment.

FIG. 21 is a block diagram illustrating a configuration example of a part of a row control circuit 10E of a DRAM according to a sixth embodiment. In comparison with the row control circuit 10 according to the first embodiment of FIG. 7, the row control circuit 10E according to the sixth embodiment of FIG. 21 is characterized by including a refresh controller 21A and a test controller 22 instead of the refresh controller 21. In this case, the refresh controller 21A controls generation of an AutoRef/VictimRef switching signal according to a VictimRef enable switching signal or a VictimRef execution frequency switching signal from the test controller 22. In this case, the test controller 22 is characterized by giving an instruction as to whether or not to enable the refreshing of a victim cell in a test mode.

This embodiment is useful, for example, to verify the effect on the RH tolerance and in contrast, to confirm the impact to the power consumption (increasing the current by additional refresh rows for victim cells) by switching AutoRef/VictimRef selection signal.

Figure 34A:
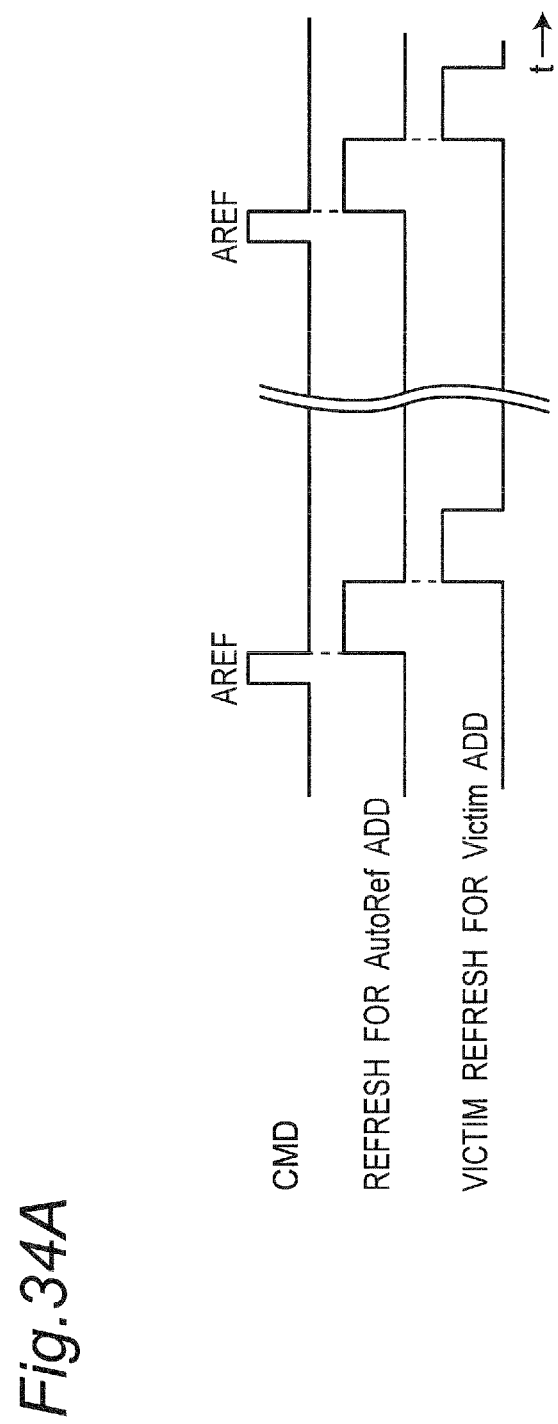
FIG. 34A is a timing chart illustrating an operation example when the victim refresh is enabled by row control circuits 10E, 10F, and 10G according to sixth to eighth embodiments.
Figure 34B:
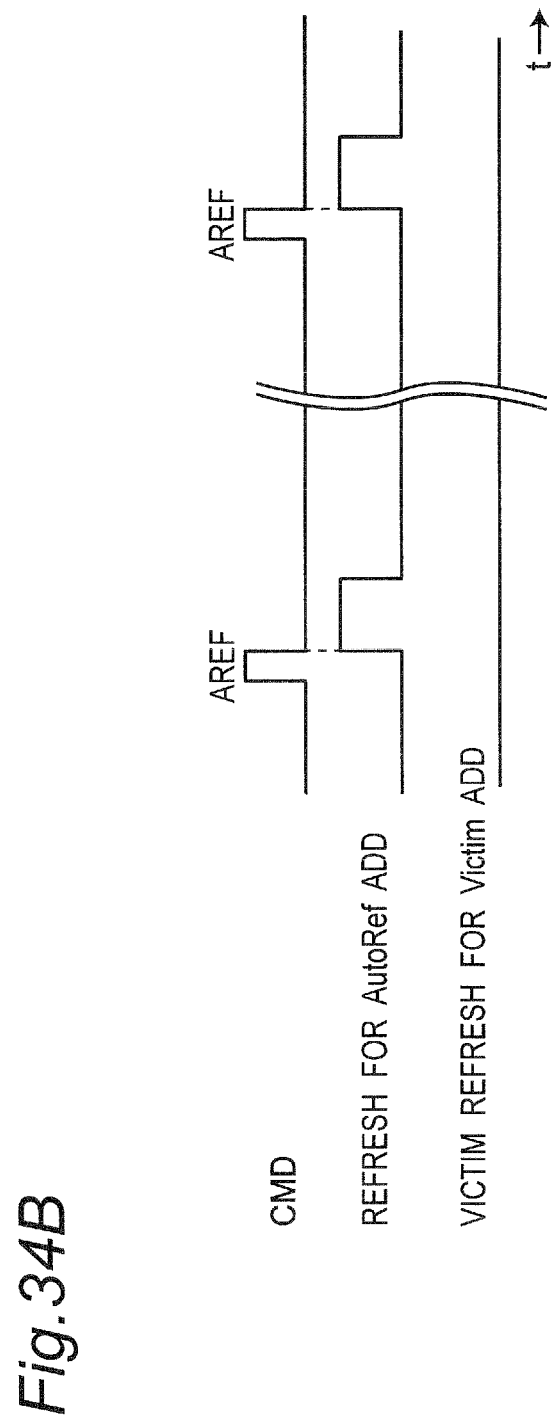
FIG. 34B is a timing chart illustrating an operation example when the victim refresh is disabled by the row control circuits 10E, 10F, and 10G according to the sixth to eighth embodiments.

FIG. 34A is a timing chart illustrating an operation example when the victim refresh is enabled by the row control circuit 10E (10F and 10G) according to the sixth embodiment (including seventh and eighth embodiments). FIG. 34B is a timing chart illustrating an operation example when victim refresh is disabled by the row control circuit 10E (10F and 10G) according to the sixth embodiment (including the seventh and eighth embodiments).

For example, in the refresh method according to the fifth embodiment, as shown in FIG. 34A, when the victim refresh is enabled, by issuing AUTO REFRESH command, the normal row address is refreshed at first, then the victim address is refreshed. When the victim refresh is disabled, as shown in FIG. 34B, the operation is similar to a conventional auto refresh, which does not refresh the victim address. As described, by disabling the refresh of the victim address, it is possible to check the effect of giving RH free, an increase in current consumption, or the like for each chip in the test mode.

Referring to FIG. 21, the test controller 22 sets the victim refresh cycle to the refresh controller 21A, by using a VictimRef enable switching signal. In this case, the operation of refreshing the victim cell having the victim address latched by the ACTIVE command is executed at a frequency rate of once in a plurality of the AUTO REFRESH commands, according to the AUTO REFRESH commands. The Victim execution frequency switching signal from the test controller 22 sets the frequency rate of the operation.

As described above, according to the sixth embodiment, the test controller 22 can set the victim refresh cycle to the refresh controller 21A by using the VictimRef enable switching signal. In addition, the Victim execution frequency switching signal from the test controller 22 can set the frequency rate of the victim refresh.

Seventh Embodiment

Figure 22:
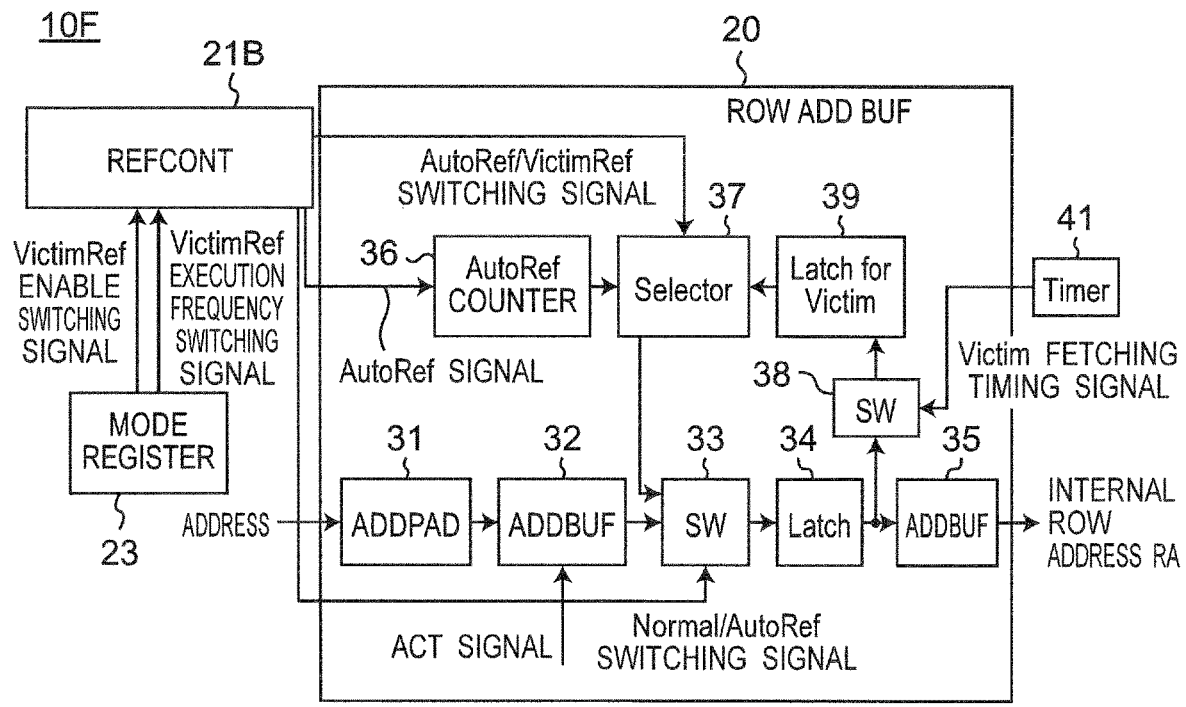
FIG. 22 is a block diagram illustrating a configuration example of a part of a row control circuit 10F of a DRAM according to a seventh embodiment.

FIG. 22 is a block diagram illustrating a configuration example of a part of a row control circuit 10F of a DRAM according to a seventh embodiment. In comparison with the row control circuit 10E according to the sixth embodiment of FIG. 21, the row control circuit 10F according to the seventh embodiment of FIG. 22 is characterized by including a mode register 23 instead of the test controller 22. The mode register 23 generates a control signal similar to that of the test controller 22.

According to the seventh embodiment, for example, by disclosing a mode register which enables the victim refresh only to customers who need a specific RH tolerance, it is possible to make this function of taking two mode states of the victim refresh enabled and the victim refresh disabled for each user individually without any mask option or fuse disconnection, which means the exactly same product.

In addition, contrary to the seventh embodiment, for a user who does not need RH tolerance and requires less current consumption, by not disclosing the mode register 23 that enables the victim refresh, it is possible to supply a product with less current consumption (in a state of not refreshing a victim address).

Eighth Embodiment

Figure 23:
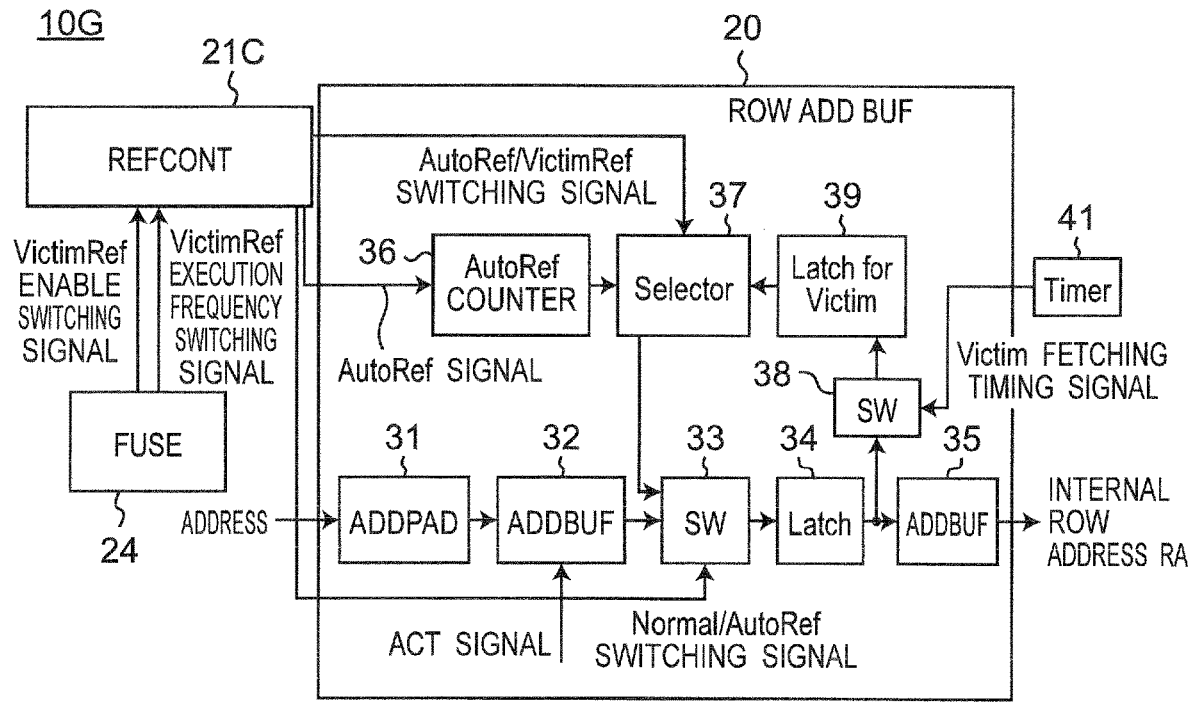
FIG. 23 is a block diagram illustrating a configuration example of a part of a row control circuit 10G of a DRAM according to an eighth embodiment.

FIG. 23 is a block diagram illustrating a configuration example of a part of a row control circuit 10G of a DRAM according to an eighth embodiment. In comparison with the row control circuit 10E according to the sixth embodiment of FIG. 21, the row control circuit 10G according to the eighth embodiment of FIG. 23 is characterized by including a fuse circuit 24, which generates a control signal similar to that of the test controller 22 instead of the test controller 22.

According to the eighth embodiment, unlike the case shown in the seventh embodiment, it is not necessary to disclose the mode register 23 for enabling the victim refresh on a specific customer. However, it is necessary to decide whether or not to perform cutting of a fuse of the fuse circuit 24, which enables or disables the victim refresh in a process before shipment. In that case, for example, the fuse may be cut off in each item to be shipped. Alternatively, as shown in the example of the mode register 23 according to the seventh embodiment, cutting of the fuse of the fuse circuit 24 for enabling the victim refresh may be performed only in the product to be shipped to a customer requiring a specific RH tolerance, while the victim refresh may be disabled without cutting the fuse, which enables the victim refresh, in the products to be shipped to other customers.

Ninth Embodiment

Figure 24:
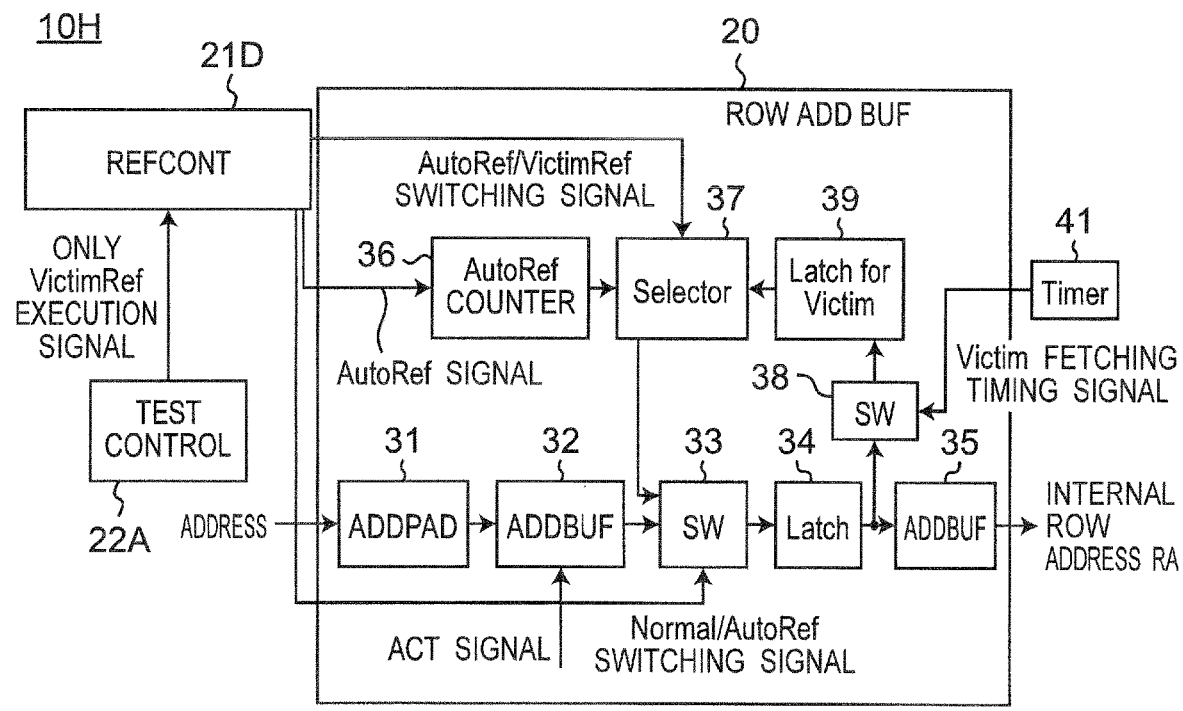
FIG. 24 is a block diagram illustrating a configuration example of a part of a row control circuit 10H of a DRAM according to a ninth embodiment.

FIG. 24 is a block diagram illustrating a configuration example of a part of a row control circuit 10H of a DRAM according to a ninth embodiment. The row control circuit 10H according to the ninth embodiment of FIG. 24 differs from the row control circuit 10E according to the sixth embodiment of FIG. 21 in the following points.

(1) The row control circuit 10H includes a test controller 22A instead of the test controller 22. The test controller 22A generates an only VictimRef execution signal, and outputs the signal to a refresh controller 21D.

(2) The row control circuit 10H includes the refresh controller 21D instead of the refresh controller 21A. The refresh controller 21D generates an AutoRef/VictimRef switching signal according to the only VictimRef execution signal.

Hereinafter, the above differences will be described in detail.

In contrast to the eighth embodiment, in the ninth embodiment, the test controller 22A provides a test mode for stopping refreshing an auto refresh address and only refreshing a victim address. This function is for checking that the victim address is refreshed. This function is useful in evaluating whether or not the latched victim addresses are concentrated on specific timings between the auto refresh and the next auto refresh, for example, locations just before the AUTO REFRESH commands described in the eighth embodiment.

Figure 35:
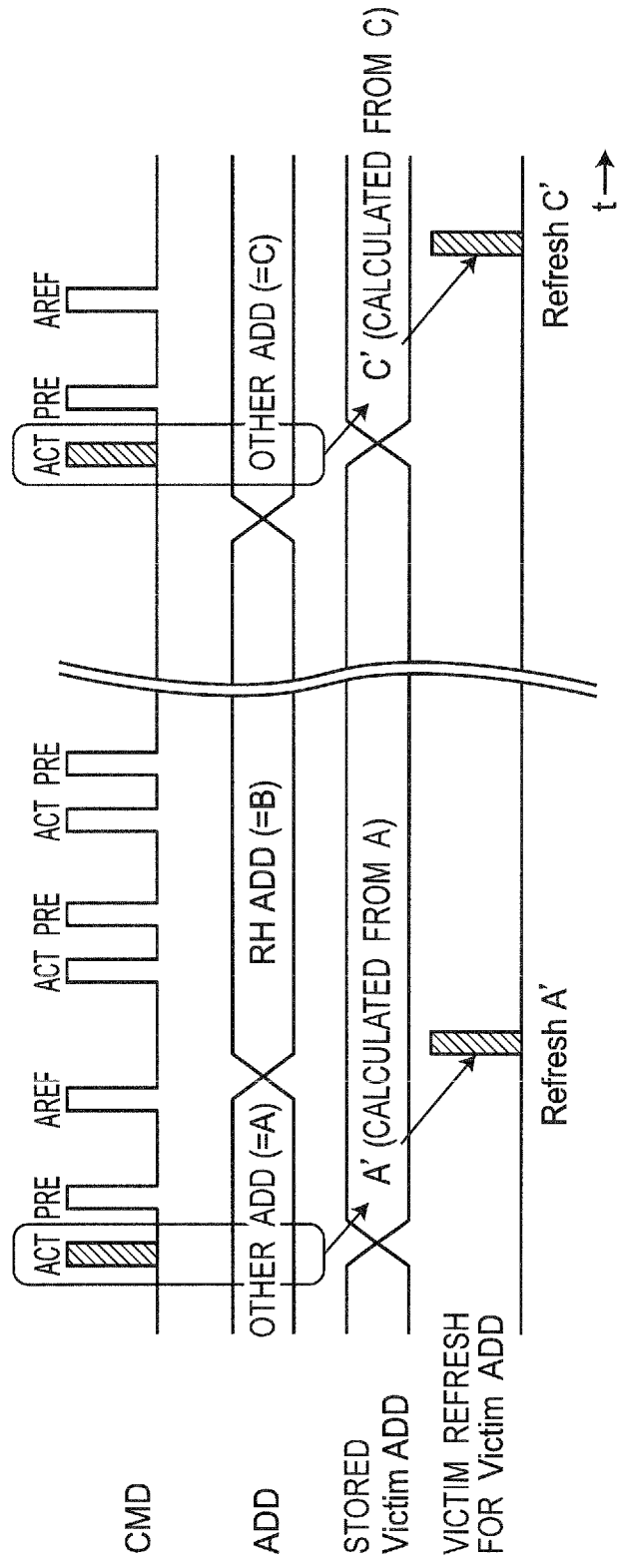
FIG. 35 is a timing chart illustrating a first operation example of the row control circuit 10H according to a ninth embodiment.

FIG. 35 is a timing chart illustrating a first operation example of the row control circuit 10H according to the ninth embodiment. In addition, FIG. 36 is a timing chart illustrating a second operation example of the row control circuit 10H according to the ninth embodiment.

For example, in the eighth embodiment, when latching a victim address by calculating the victim address from the address at the time of the ACTIVE command immediately before an AUTO REFRESH command, if the operation is performed in a pattern of selecting the addresses (A and C in FIG. 35) other than the RH address (B in FIG. 35) only at the ACTIVE commands immediately before the AUTO REFRESH command, the victim addresses A' and C' calculated from the addresses A and C are refreshed, and an address B' calculated from the RH address (=B) which is a victim address to be refreshed originally is not refreshed at all. This phenomenon occurs because the victim address to be refreshed is calculated from the address latched at a specific timing. If latching timings occur perfectly at random, the probability that the address B' calculated from the address B, which is active for a relatively long time in FIG. 35, is latched as the victim address is not low. Further, there are as many chances of refreshing the memory cell having the address B' as the auto refresh is performed the number of times, for example, 8192 times. The probability that the address B' is never refreshed for this interval is extremely low. Therefore, the method for checking if the victim address to be refreshed is fetched at random during the auto refresh commands is important.

Figure 36:
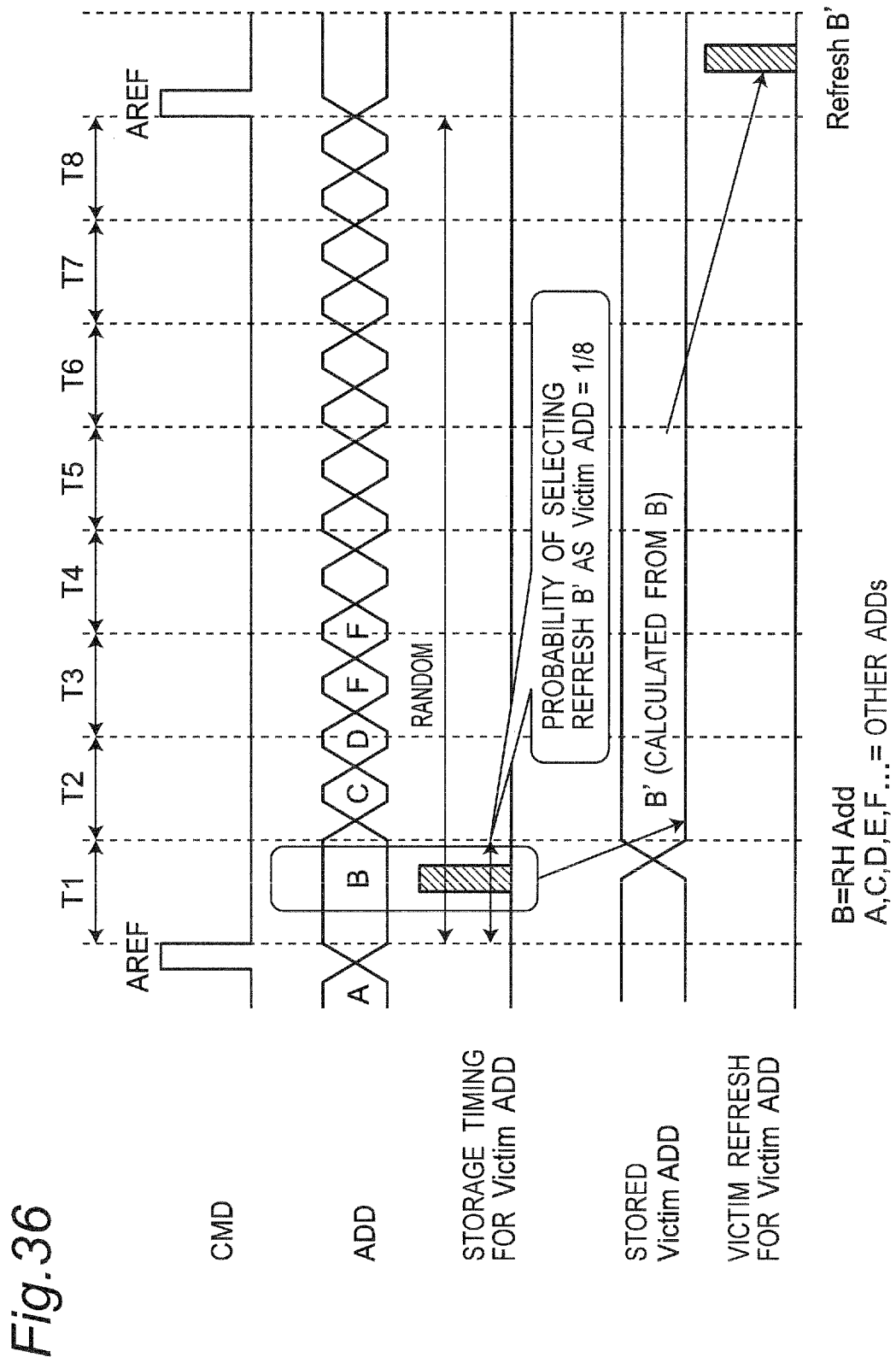
FIG. 36 is a timing chart illustrating a second operation example of the row control circuit 10H according to the ninth embodiment.

For example, as shown in FIG. 36, if the interval between the auto refresh and the auto refresh is equally divided into eight periods, and it is confirmed that the victim address is calculated from the addresses, which become active in all the periods T1 to T8 and it is refreshed, it is possible to confirm that there is no malfunction such as only refreshing the victim address calculated only from an address which is latched at a specific timing between the auto refresh and the auto refresh, for example, the period T8.

In order to confirm this, the row control circuit 10H according to the ninth embodiment of FIG. 24 is used. In this case, the row control circuit 10H is characterized by stopping auto refresh operation based on an AUTO REFRESH command in the test mode, and refreshing the victim cell upon issuing of the AUTO REFRESH command to the victim cell having the victim address.

For example, as shown in FIG. 36 illustrating a specific method, if only the address B which is the RH address is activated only for the first interval T1, and the addresses (C, D, E, F, . . . ) other than the address B are activated for the other intervals T2 to T8, the probability that the address B', which is the victim address calculated from the address B once between the auto refresh and the auto refresh, is latched as the address to be refreshed is ⅛ as long as timings of latching a victim address occur completely at random. Since this pattern is repeated 8192 times, for example, and there are 8192 chances to refresh the latched address B', the probability that the address B' is never refreshed is $(⅞)^{8192}$, which is extremely low probability.

At this time, if the function according to the ninth embodiment sets all the data of the memory cells is set to physical data "1" at 85° C., for several seconds or more, for example, in a state of stopping the refresh, the auto refresh addresses and repeats this sequence, the addresses except the victim address will not be refreshed and will be failed. In this case, if the address B' calculated from the address B active for the interval T1 is refreshed as the victim address, the row address indicated by the address B' passes this test. In contrast, if the victim address calculated from the row address active for the interval T1 cannot be refreshed, the address B' will fail the test.

A similar test is also performed for each of the intervals T2 to T8. If the address B' passes the test, the victim address calculated from the row address active for each of the intervals T1 to T8 is refreshed. Therefore, it can be confirmed that there is no malfunction such as malfunction of not refreshing the victim address at a specific timing for the intervals T1 to T8.

As described above, according to the ninth embodiment, the row control circuit 10H stops auto refresh operation based on an AUTO REFRESH command in the test mode, and refreshes the victim cell having the victim address upon issuing of the AUTO REFRESH command to the victim cell. As a result, in the test mode, it is possible to confirm that there is no such malfunction as the victim address at a specific period of T1 to T8 is not refreshed.

Tenth Embodiment

Figure 25:
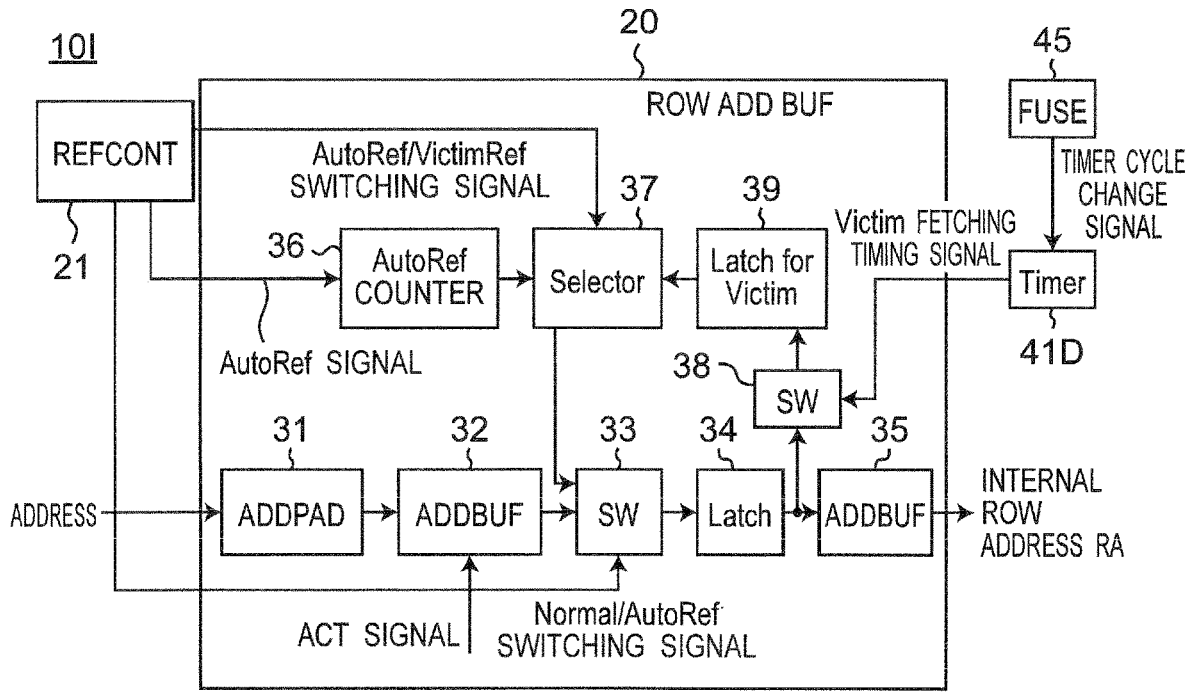
FIG. 25 is a block diagram illustrating a configuration example of a part of a row control circuit 10I of a DRAM according to a tenth embodiment.

FIG. 25 is a block diagram illustrating a configuration example of a part of a row control circuit 10I of a DRAM according to a tenth embodiment. The row control circuit 10I according to the tenth embodiment of FIG. 25 differs from the row control circuit 10 according to the first embodiment of FIG. 7 in the following points.

(1) The row control circuit 10I includes a fuse circuit 45 which generates a timer cycle change signal for changing the cycle of a timer signal.

(2) The row control circuit 10I includes a timer circuit 41D instead of the timer circuit 41. The timer circuit 41D changes the cycle of a Victim fetching timing signal which is a timer signal, according to the timer cycle change signal.

Hereinafter, the above differences will be described in detail.

The functions according to the first to ninth embodiments have the following problem. For example, if both the auto refresh address and the victim address are refreshed every time an AUTO REFRESH command is input, current consumption becomes nearly twice as current consumption for the normal auto refresh without using the method described.

Figure 37:
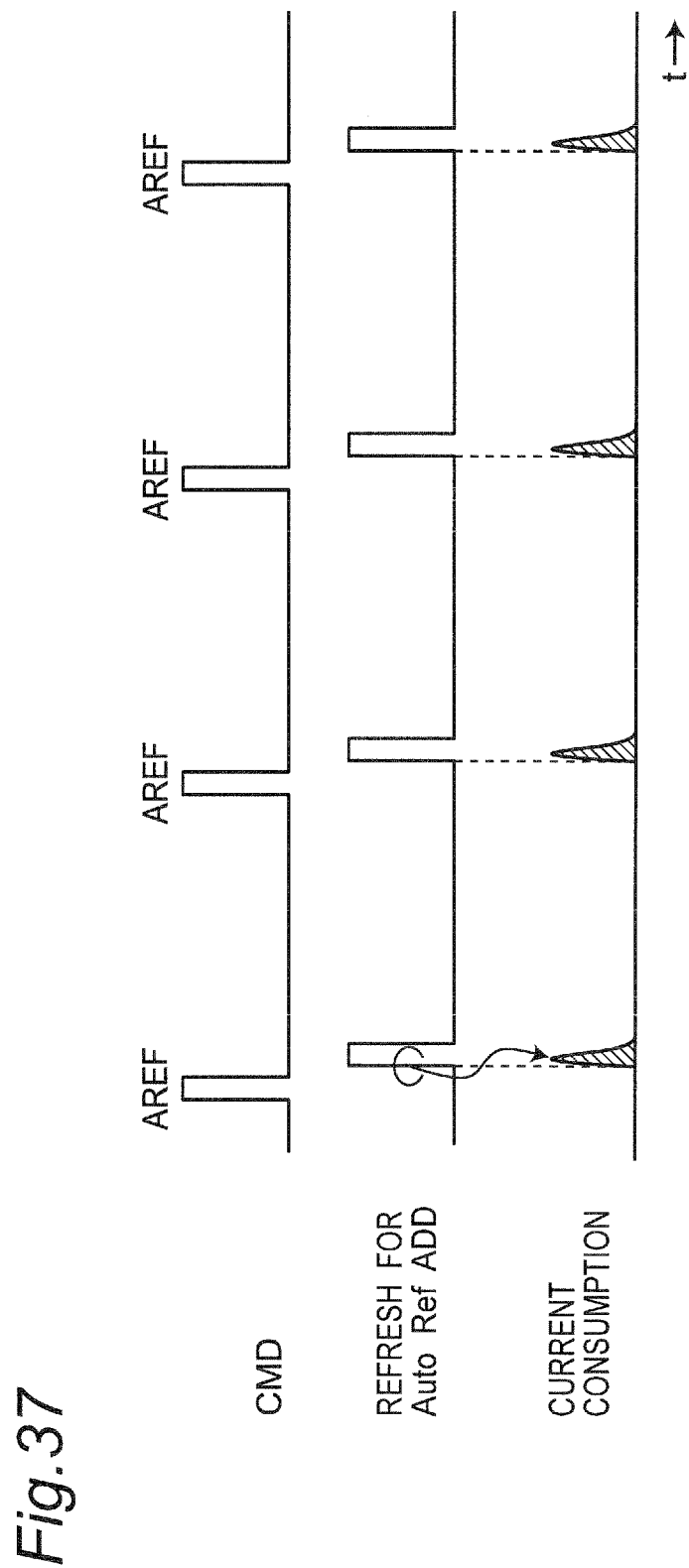
FIG. 37 is a timing chart illustrating a first operation example in row control circuits 10I, 10J, and 10K according to the tenth to twelfth embodiments.
Figure 38:
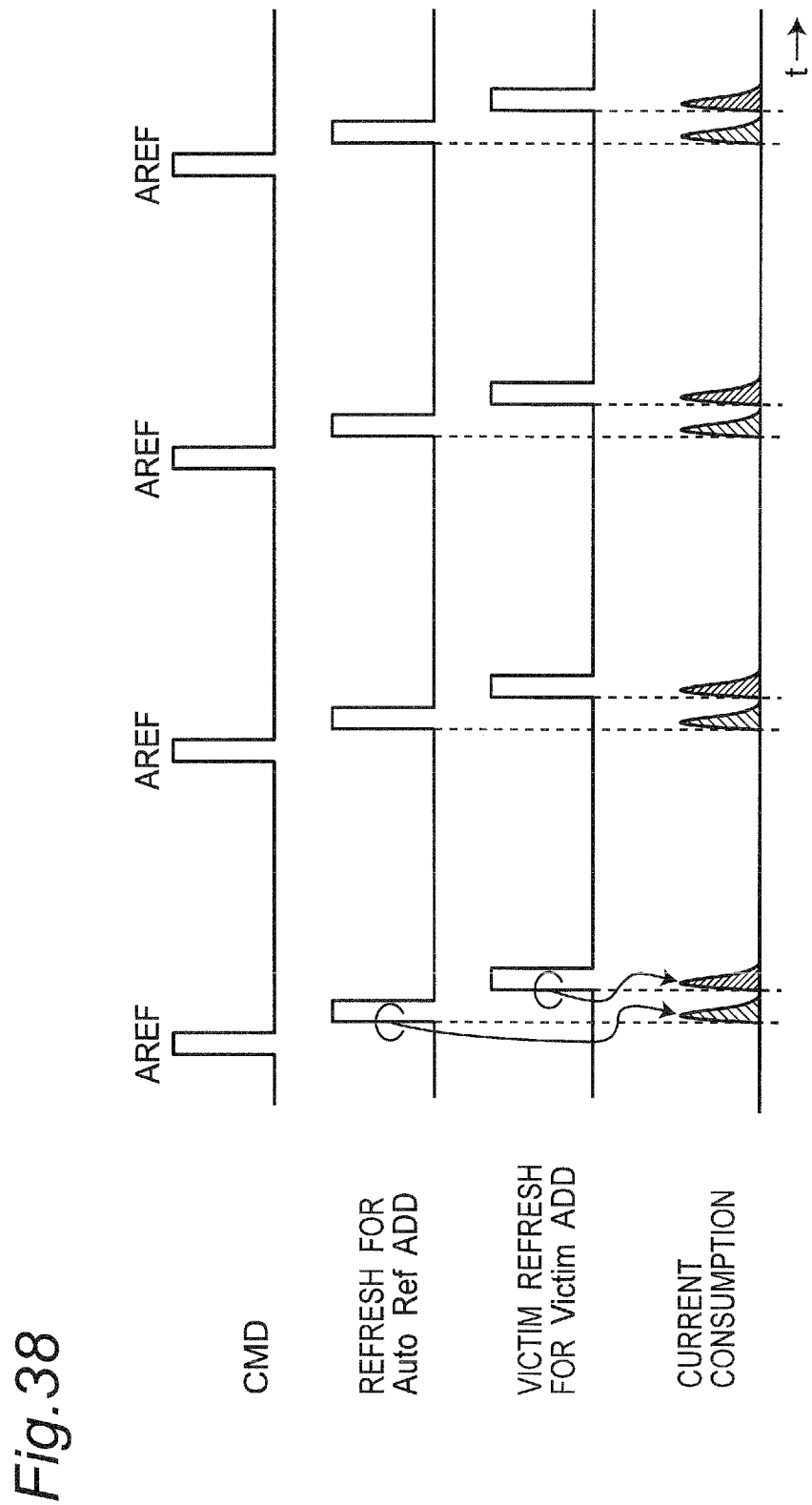
FIG. 38 is a timing chart illustrating a second operation example in the row control circuits 10I, 10J, and 10K according to the tenth to twelfth embodiments.

FIGS. 37 to 39 are timing charts illustrating a first to third operation examples in the row control circuit 10I (including 10J, and 10K) according to the tenth embodiment (including eleventh and twelfth embodiments). In this case, FIG. 37 illustrates current consumption for the normal auto refresh. FIG. 38 illustrates current consumption when refreshing the victim address every auto refresh. In order to reduce this current consumption, as shown in FIG. 39, for example, performing the refresh of a victim address only once for every two AUTO REFRESH commands can reduce current consumption. It is noted that in this case, the chances of refreshing the victim address are decreased by half, and there is a possibility of reducing RH tolerance. Therefore, for example, using a fuse circuit 45 to select whether or not to refresh the victim address once in a plurality of auto refresh commands is useful as described below.

The tenth embodiment has a function of using the fuse circuit 45 to select the setting of the frequency of refreshing the victim address in a plurality of AUTO REFRESH commands. Therefore, it is possible to variably set the tradeoff between RH tolerance and current consumption for each customer without changing the mask.

In this case, since the fuse circuit 45 enables switchover of the cycle or the calculation method of the timer signal that determines the address fetching cycle, even if the address fetching cycle matches perfectly with the auto refresh cycle due to process variation, the fuse circuit 45 can change the address fetching cycle so as to cope with the process variation. In addition, when changing the frequency of executing the victim address refresh by using the fuse circuit 45 or by the other way, it is possible to change the address fetching cycle correspondingly.

Eleventh Embodiment

Figure 26:
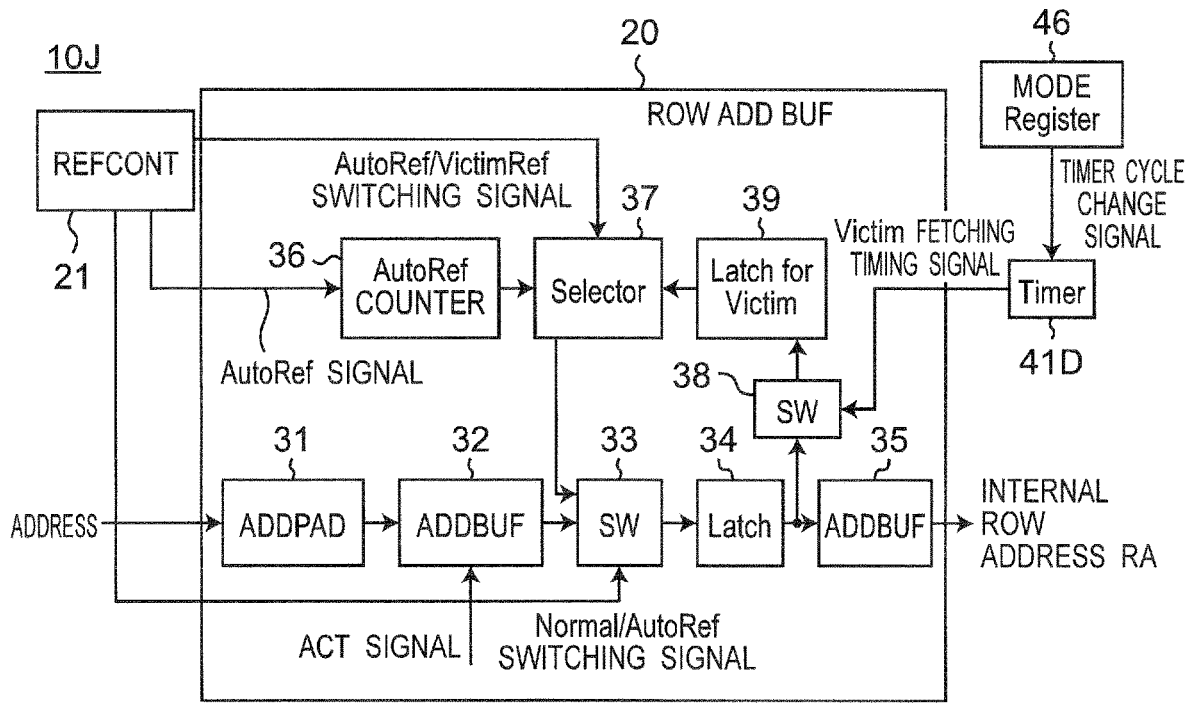
FIG. 26 is a block diagram illustrating a configuration example of a part of a row control circuit 10J of a DRAM according to an eleventh embodiment.

FIG. 26 is a block diagram illustrating a configuration example of a part of a row control circuit 10J of a DRAM according to an eleventh embodiment. The row control circuit 10J according to the eleventh embodiment of FIG. 26 differs from the row control circuit 10I according to the tenth embodiment of FIG. 25 in the following point.

(1) The row control circuit 10J includes a mode register 46 instead of the fuse circuit 45. The mode register 46 generates a timer cycle change signal for changing the cycle of a timer signal.

According to the eleventh embodiment, the mode register 46 has the function of selecting the setting of the frequency of refreshing the victim address once in a plurality of AUTO REFRESH commands. Therefore, it is possible to configure optimal settings for each customer individually by disclosing each setting of mode register without changing the circuit by masks or fuses, if necessary.

In this case, since the mode register 46 can change the cycle of the timer signal, a user can change a victim address refresh cycle, and can change a fetching timing correspondingly. Therefore, it is possible to eliminate concentration of fetching positions.

Twelfth Embodiment

Figure 27:
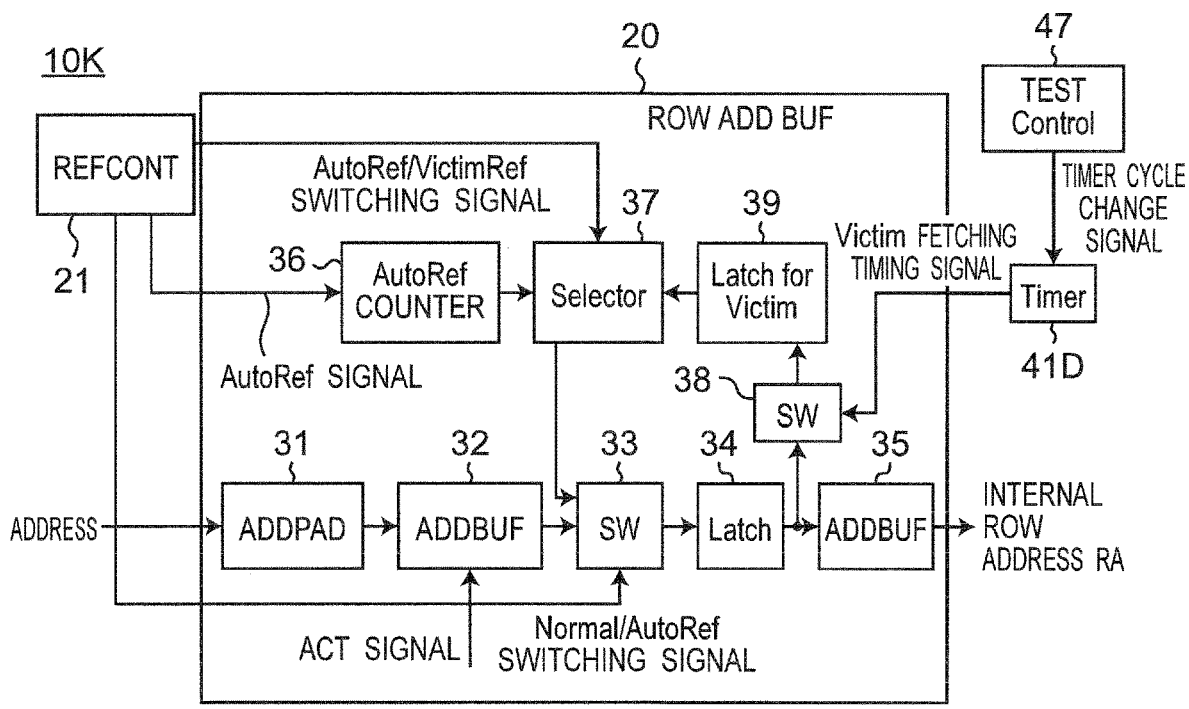
FIG. 27 is a block diagram illustrating a configuration example of a part of a row control circuit 10K of a DRAM according to a twelfth embodiment.

FIG. 27 is a block diagram illustrating a configuration example of a part of a row control circuit 10K of a DRAM according to a twelfth embodiment. The row control circuit 10K according to the twelfth embodiment of FIG. 27 differs from the row control circuit 10I according to the tenth embodiment of FIG. 25 in the following point.

(1) The row control circuit 10K includes a test controller 47 instead of the fuse circuit 45. The test controller 47 generates a timer cycle change signal for changing the cycle of a timer signal.

According to the twelfth embodiment, the test controller 47 which is activated in a test mode has the function of selecting the setting of the frequency of refreshing a victim address once in a plurality of AUTO REFRESH commands. Therefore, it is possible to evaluate RH tolerance and current consumption by changing settings for each chip.

In this case, since the test controller 47 which is activated in the test mode enables switchover of the cycle of a timer signal, it is possible to eliminate concentration of address fetching cycles by changing a victim refresh cycle in the evaluation with the tester, and to perform accurate evaluation.

Thirteenth Embodiment

Figure 41:
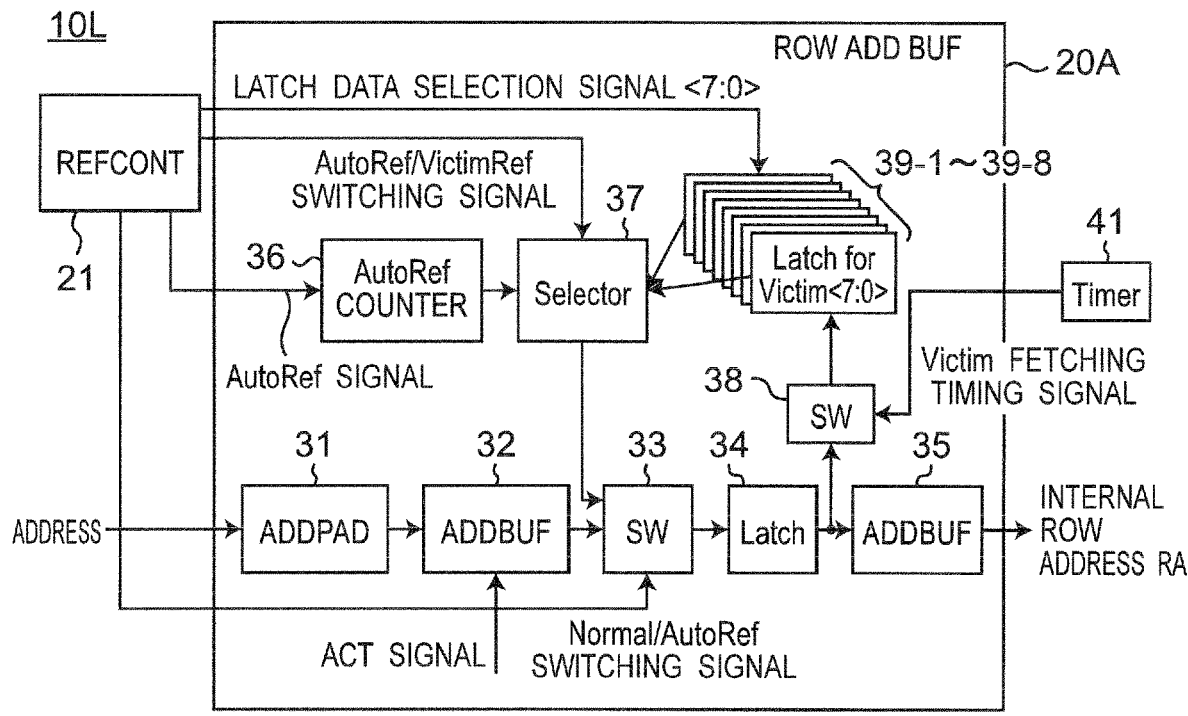
FIG. 41 is a block diagram illustrating a configuration example of a part of a row control circuit 10L according to a thirteenth embodiment.

FIG. 41 is a block diagram illustrating a configuration example of a part of a row control circuit 10L according to a thirteenth embodiment. The row control circuit 10L according to the thirteenth embodiment of FIG. 41 differs from the row control circuit 10 according to the first embodiment of FIG. 7 in the following points.

(1) The row control circuit 10L includes, for example, eight (any plural number) latches 39-1 to 39-8 instead of the latch 39. It is noted that 20A is the reference character of a row address buffer including the latches 39-1 to 39-8.

(2) A refresh controller 21 generates a latch data selection signal <7:0> indicating which latched data in latch 39-1 to 39-8 should be selected and outputted to the selector 37. This latch data selection signal <7:0> is inputted to the latch 39-1 to 39-8.

Hereinafter, the above differences will be described in detail.

Referring to FIG. 41, the row address buffer 20A of the row control circuit 10L includes the latches 39-1 to 39-8 which latch a plurality of victim addresses. In this case, the row control circuit 10L refreshes the victim cells having the latched victim addresses one by one while successive refresh.

Figure 68:
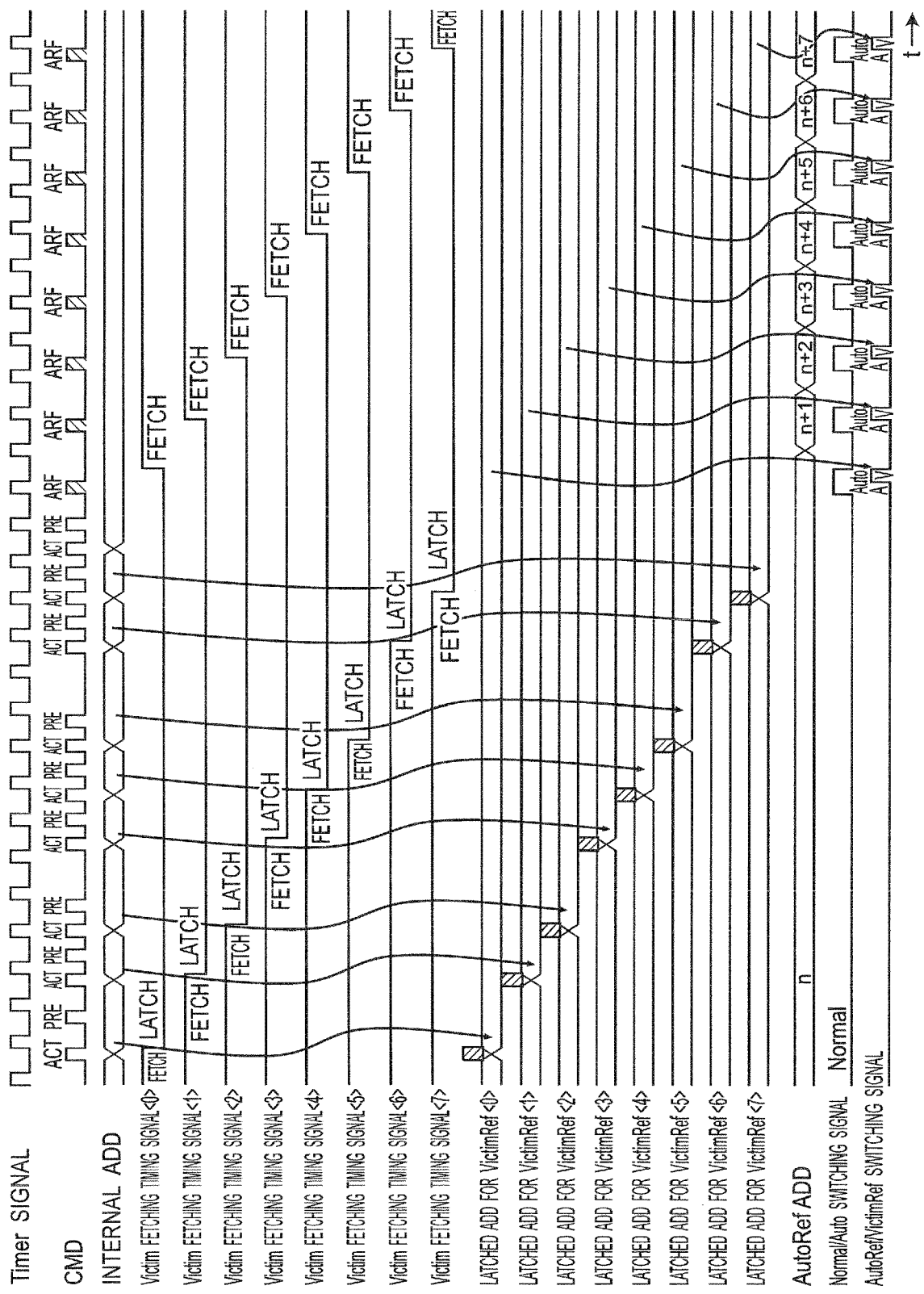
FIG. 68 is a timing chart illustrating an operation example when sequentially performing the victim refresh in the refresh performed successively, in the row control circuit 10L according to the thirteenth embodiment.

FIG. 68 is a timing chart illustrating an operation example of sequentially performing the victim refresh for the refreshes performed successively, in the row control circuit 10L according to the thirteenth embodiment. As apparent from FIG. 68, the row control circuit 10L can sequentially perform the victim refresh for the refreshes performed successively.

It is noted that, even though REFRESH commands are basically issued at equal intervals, a 1 Gb DDR3-SDRAM of one example can pull in the refresh commands, which are originally issued at equal intervals, and can issue the eight REFRESH commands successively. At this time, when only one row address is latched for a refresh interval, only one victim refresh is effective for refresh operation performed eight times successively. However, in this embodiment, means for performing the effective victim refresh even when the refresh is performed successively can be implemented by adding a function of (a) latching a plurality of row addresses in the latches 39-1 to 39-8 and (b) providing different row address among the plurality of latched row addresses to the victim refresh in the refresh operation performed successively.

Fourteenth Embodiment

Figure 42:
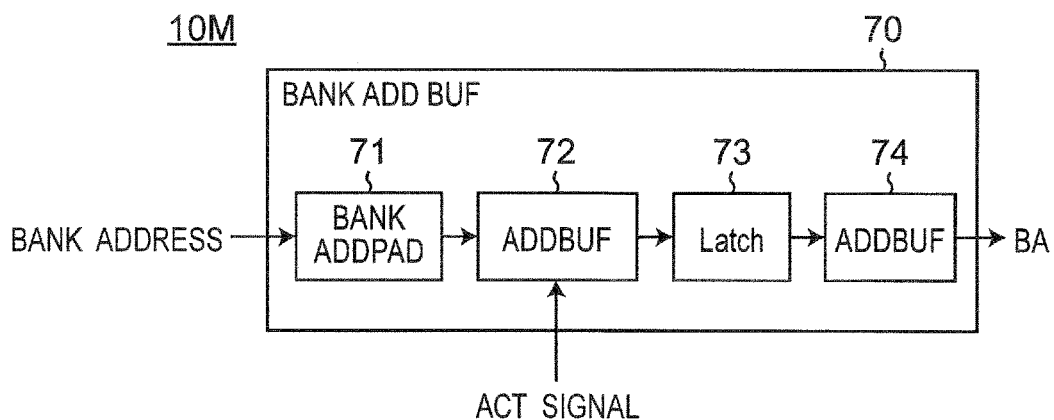
FIG. 42 is a block diagram illustrating a configuration example of a part of a row control circuit 10M according to a fourteenth embodiment.
Figure 43:
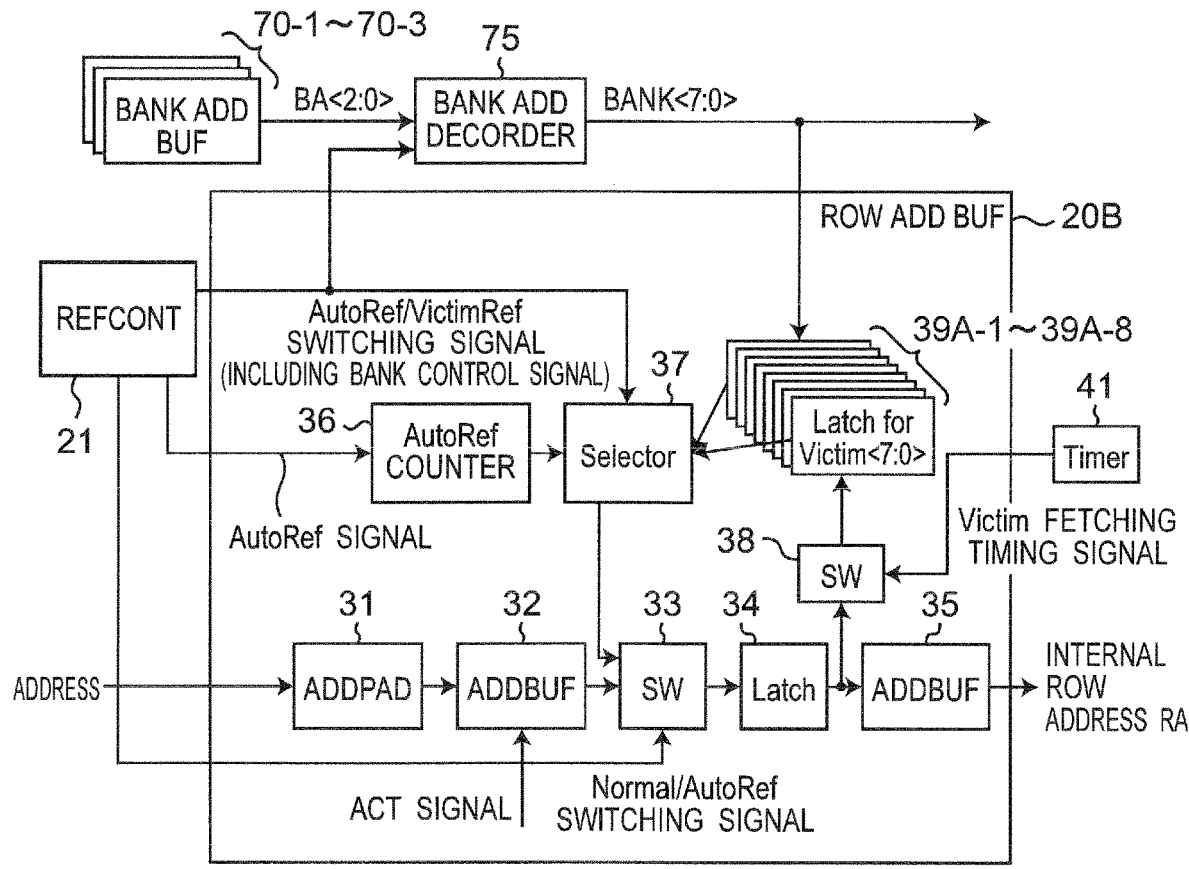
FIG. 43 is a block diagram illustrating a configuration example of a row control circuit 10M according to a fourteenth embodiment.

FIG. 42 is a block diagram illustrating a configuration example of a part of a row control circuit 10M according to a fourteenth embodiment. In addition, FIG. 43 is a block diagram illustrating a configuration example of the row control circuit 10M according to the fourteenth embodiment. The row control circuit 10M according to the fourteenth embodiment of FIGS. 42 and 43 differs from the row control circuit 10L according to the thirteenth embodiment of FIG. 41 in the following points.

(1) The DRAM chip 1 of FIG. 1 is divided into a plurality of banks to be controlled for each bank.

(2) The row control circuit 10M includes a row address buffer 20B including latches 39A-1 to 39A-8, instead of the row address buffer 20A including the latches 39-1 to 39-8.

(3) The row control circuit 10M includes, for example, three (any plural number) bank address buffers 70-1 to 70-3 (collectively denoted by reference character 70) of FIG. 42 and a bank address decoder 75.

(4) An AutoRef/VictimRef switching signal from the refresh controller 21 includes a bank control signal.

The differences will be described below.

Referring to FIG. 42, the bank address buffer 70 is configured by including a bank address pad 71, an address buffer 72, a latch 73, and an address buffer 74. For example, a bank address from a memory controller 101 is input to the address buffer 72 via the bank address pad 71, is stored at the timing of an ACT signal generated according to the ACTIVE command, and then latched in the latch 73. The latched bank address is outputted as a bank address BA to the bank address decoder 75 of FIG. 43 via the address buffer 74.

Referring to FIG. 43, the bank address decoder 75 receives a bank address BA <2:0> from each of the bank address buffers 70-1 to 70-3. The bank address decoder 75 decodes the inputted bank address BA <2:0> to a bank address BANK <7:0> according to an AutoRef/VictimRef switching signal which includes a bank control signal. This AutoRef/VictimRef switching signal is outputted from the refresh controller 21. The bank address BANK <7:0> is inputted to the latches 39A-1 to 39A-8. The addresses latched by the latches 39A-1 to 39A-8 are selected according to the decoded bank address BANK <7:0>, and are outputted to the selector 37.

According to the fourteenth embodiment configured as described above, the row control circuit 10M can latch a plurality of victim addresses for each bank of the DRAM chip 1.

In a modified embodiment of the fourteenth embodiment, the row control circuit 10M sets the refresh time to be longer than a refreshing interval for the normal refresh to performs the refresh of the of the victim cell.

Figure 55:
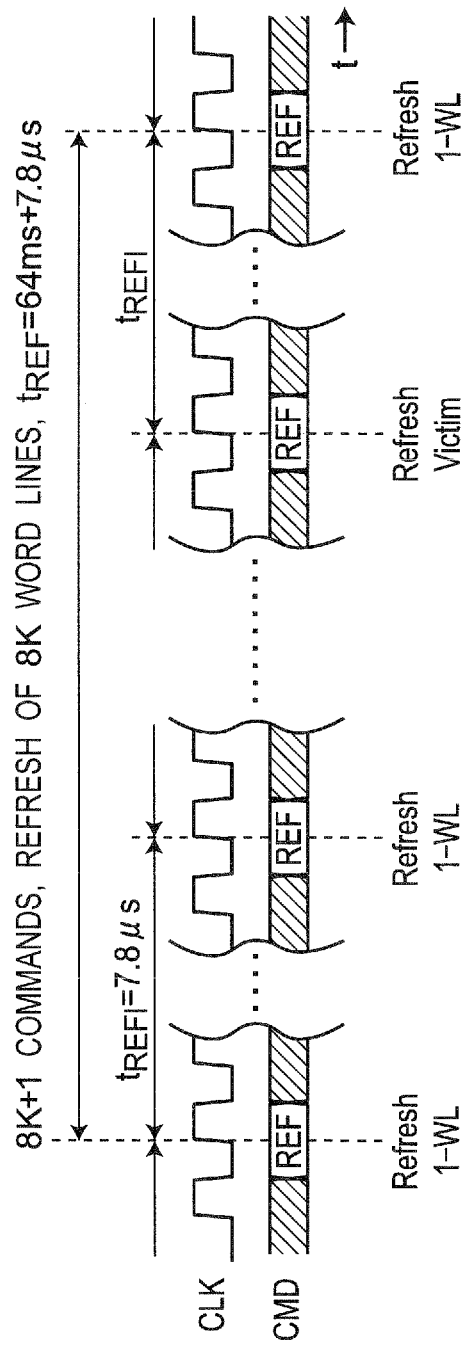
FIG. 55 is a timing chart illustrating an example of the refresh operation performed (8K+1) times, in the row control circuit 10N according to the fourteenth embodiment.

FIG. 55 is a timing chart illustrating an example of refresh operation performed (8K+1) times in the row control circuit 10M according to the fourteenth embodiment.

For example, in 1 Gb DDR3-SDRAM, eight thousand REFRESH commands are issued at intervals of about 8 µs within 64 ms in order to refresh eight thousand word lines of each bank. This embodiment illustrates a case of refreshing one word line and adding the victim refresh, while performing the normal refresh. As an example, as shown in FIG. 55, adding of one victim refresh leads to extension of the refresh time ($t_{REF}$) from 64 ms to 64 ms+8 µs. As another example, when inserting the victim refresh once for each normal refresh, the refresh time ($t_{REF}$) becomes 128 ms. Therefore, in order to reduce the probability of RH failure occurrence, it is necessary to increase the number of times of inserting the victim refresh, which causes an increase in the refresh time.

At this time, the row control circuit 10M includes the bank address buffers 70-1 to 70-3 and the latches 39A-1 to 39A-8 for each bank. Therefore, the row control circuit 10M can simultaneously perform the victim refresh for different victim addresses for each bank.

For example, when sharing the latches 39A-1 to 39A-8 among the banks and inserting the victim refresh of an identical address for each bank for each normal refresh, the refresh time extends to 64+64=128 ms. Therefore, there is a significant influence on the memory cell 6 of the DRAM chip 1. However, when including the latches 39-1 to 39-8 corresponding to each bank and performing the victim refresh of a unique victim address for each bank, the refresh time increases to 64+64/8=72 ms. Therefore, it is possible to achieve a similar effect of RH countermeasures.

For example, refreshing for each bank (Per-Bank Refresh) is specified for a LPDDR4-SDRAM standardized by JEDEC (Joint Electron Device Engineering Council). Therefore, it is difficult to perform the victim refresh according to the fifteenth embodiment to be described later. Therefore, as shown in the present fourteenth embodiment, it is possible that the LPDDR4-SDRAM adopts a configuration in which the victim refresh is added in such a manner as to extend the refresh time ($t_{REF}$). In that case, as described above in the present fourteenth embodiment, it is very effective to suppress an increase in refresh time.

Fifteenth Embodiment

Figure 44:
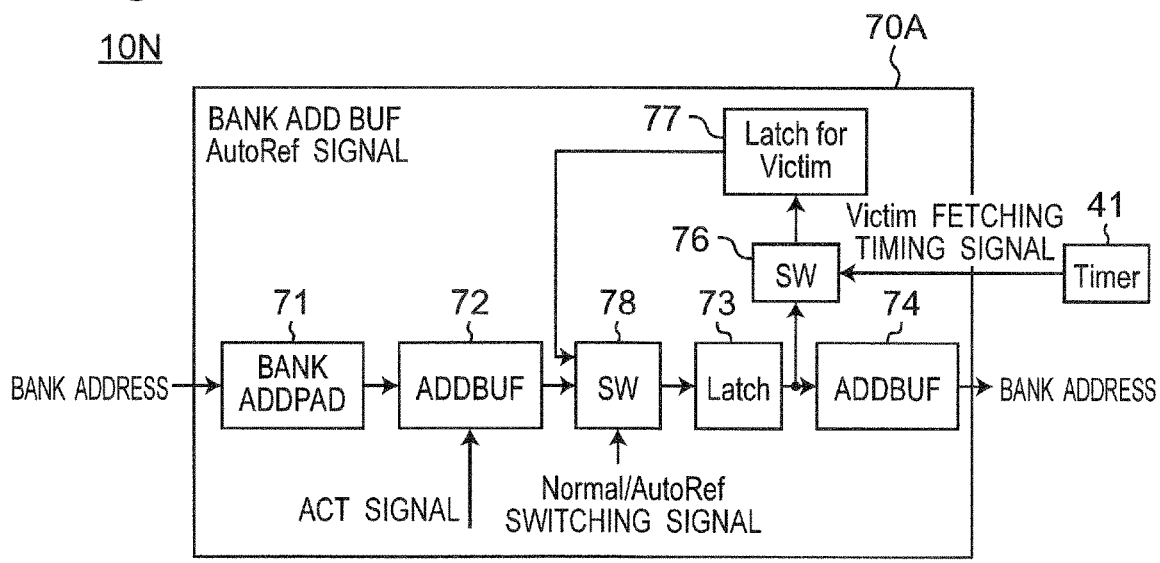
FIG. 44 is a block diagram illustrating a configuration example of a part of a row control circuit 10N according to a fifteenth embodiment.
Figure 45:
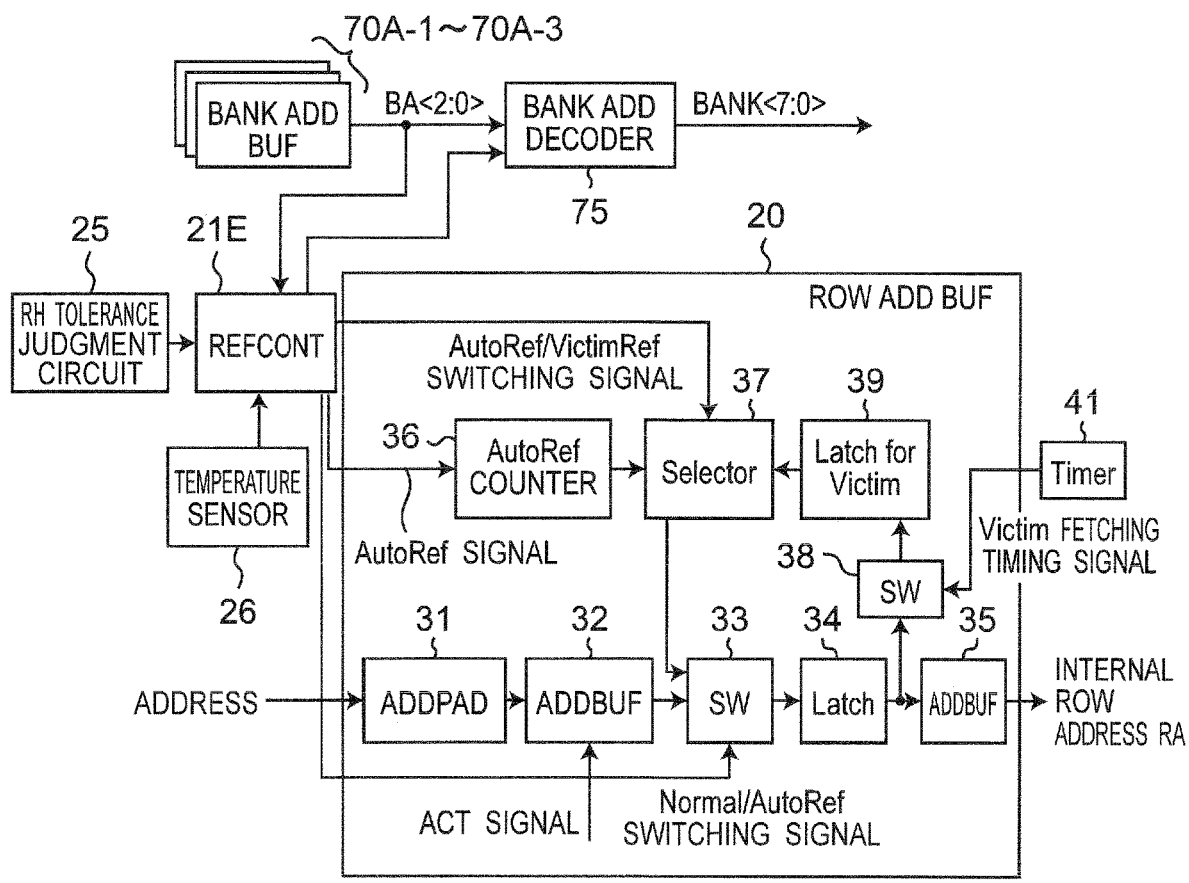
FIG. 45 is a block diagram illustrating a configuration example of a row control circuit 10N according to a fifteenth embodiment.

FIG. 44 is a block diagram illustrating a configuration example of a part of a row control circuit 10N according to a fifteenth embodiment. FIG. 45 is a block diagram illustrating a configuration example of a row control circuit 10N according to the fifteenth embodiment. The row control circuit 10N according to the fifteenth embodiment of FIGS. 44 and 45 differs from the row control circuit 10M according to the fourteenth embodiment of FIG. 42 in the following points.

(1) The row control circuit 10N includes a bank address buffer 70A instead of the bank address buffer 70.

(2) In comparison with the bank address buffer 70, the bank address buffer 70A further includes a switch 76 controlled according to a Victim fetching timing signal, which is a timer signal from a timer circuit 41, a latch 77, which latches a bank address inputted from a latch 73 via the switch 76, and a switch 78 inserted between an address buffer 72 and the latch 73. The bank address buffer 70A operates in a manner similar to that of the row address buffer 20 or the like, even though the target address differs from that of the row address buffer 20 or the like.

(3) The row control circuit 10N includes a refresh controller 21E instead of the refresh controller 21. It is noted that a RH tolerance judgment circuit 25 and a temperature sensor 26 connect to the refresh controller 21E.

(4) Bank address buffers 70A-1 to 70A-3 (collectively denoted by reference character 70) also output a bank address BA <2:0> to the refresh controller 21E.

Hereinafter, the above differences will be described in detail.

In the fifteenth embodiment, the row control circuit 10N latches a bank address together with a plurality of victim addresses. In addition, the row control circuit 10N refreshes a victim cell within a refresh cycle interval identical to that of the normal refresh. Alternatively, the row control circuit 10N may activate the bank subjected to the normal refresh and the bank subjected to the refresh of the victim cell at an interval of ACTIVE commands having the smallest value or an interval longer than or equal to one row activation interval caused by the refresh. Further, the row control circuit 10N may change activation order of the banks subjected to the normal refresh according to the bank address subjected to the refresh of the victim cell.

Figure 50:
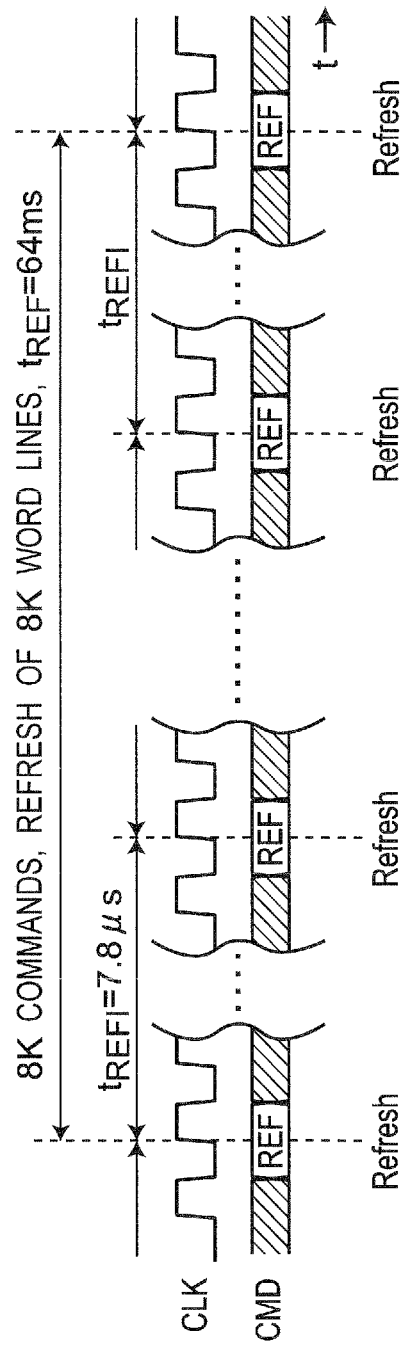
FIG. 50 is a timing chart illustrating an example of the refresh operation in the row control circuits 10N, 10O, and 10P according to the fifteenth to seventeenth embodiments.
Figure 51:
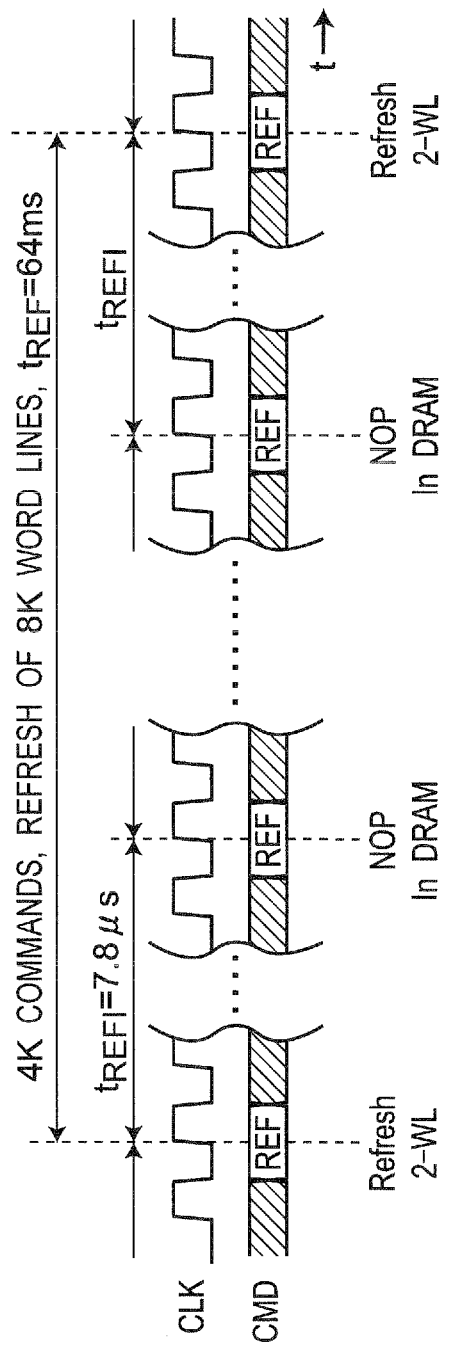
FIG. 51 is a timing chart illustrating an example of the refresh operation performed 4K times, in the row control circuits 10N, 10O, and 10P according to the fifteenth to seventeenth embodiments.
Figure 52:
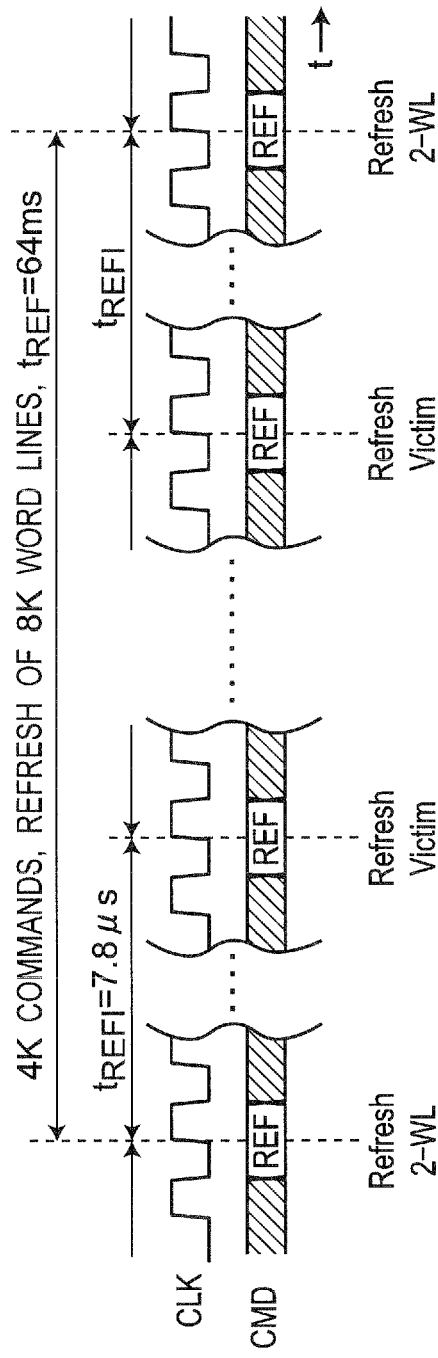
FIG. 52 is a timing chart illustrating an example of the victim refresh operation using the refresh performed 4K times, in the row control circuits 10N, 10O, and 10P according to the fifteenth to seventeenth embodiments.
Figure 53:
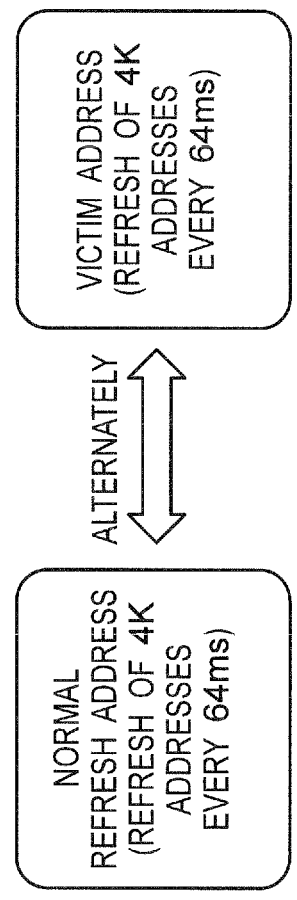
FIG. 53 is a schematic block diagram illustrating an example of the address control operation in the victim refresh using the refresh performed 4K times, in the row control circuits 10N, 10O, and 10P according to the fifteenth to seventeenth embodiments.
Figure 54:
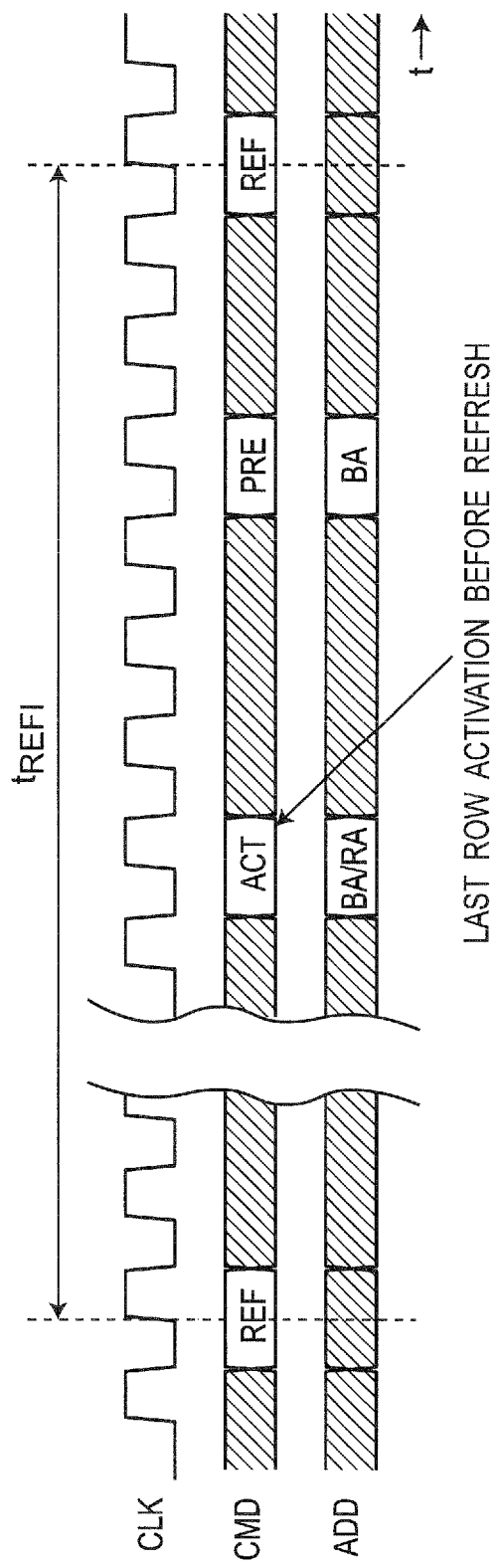
FIG. 54 is a timing chart illustrating an operation example for indicating a row address to be stored (last row activation), in the row control circuits 10N, 10O, and 10P according to fifteenth to seventeenth embodiments.

FIG. 50 is a timing chart illustrating an example of refresh operation in the row control circuits 10N (including 10O and 10P) according to the fifteenth embodiment (including sixteenth and seventeenth embodiments). FIG. 51 is a timing chart illustrating an example of refresh operation performed 4K times in the row control circuit 10N (including 10O and 10P) according to the fifteenth embodiment (including the sixteenth and seventeenth embodiments). FIG. 52 is a timing chart illustrating an example of victim refresh operation using the refresh performed 4K times in the row control circuit 10N (including 10O and 10P) according to the fifteenth embodiment (including the sixteenth and seventeenth embodiments). FIG. 53 is a schematic block diagram illustrating an example of address control operation in the victim refresh using the refresh performed 4K times in the row control circuit 10N (including 10O and 10P) according to the fifteenth embodiment (including the sixteenth and seventeenth embodiments). FIG. 54 is a timing chart illustrating an operation example for indicating a row address (last row activation) to be stored, in the row control circuit 10N (including 10O and 10P) according to fifteenth embodiment (including the sixteenth and seventeenth embodiments). It is noted that, in FIG. 51, NOP In DRAM indicates non-operation.

Refresh operation must be performed for all the word lines 8 in the DRAM chip 1 at predetermined intervals within a predetermined time. For example, as shown in FIG. 50, in 1 Gb×16 DDR3-SDRAM, it is necessary to refresh the eight thousand word lines of each bank within 64 ms. Basically, in order to perform the refresh operation evenly, a REFRESH command is issued from the outside every 8 μs to refresh one word line.

In this case, as shown in FIG. 51, assuming that two word lines are refreshed at the same time, all the eight thousand word lines are refreshed in refresh operation performed four thousand times in 64 ms. However, since eight thousand REFRESH commands are issued to the DRAM chip 1, the refresh operation needs to be performed four thousand times; however, the refresh operation does not need to be performed another four thousand times.

As shown in FIG. 52, the refresh of a victim cell is performed in the unnecessary refresh operation performed four thousand times. Therefore, it is possible to prevent RH failure. At this time, as shown in FIG. 52, the selector 37 of FIG. 45 switches over between a normal refresh address and a victim address. The victim address is an address calculated (See the victim address calculation circuit 53 of FIG. 8) from the address of certain row access, which is latched in the latches 39A-1 to 39A-8. The victim address is physically adjacent to the address of a certain row access.

For example, as shown in FIG. 54, assume that the latched row address is the last activation of the word line 8 before the refresh. There is a possibility that a malicious program causes row activation other than that immediately before the refresh to activate only a specific word line 8, and to activate another word line 8 only just before the refresh. Therefore, it may be impossible to take countermeasures against RH failure stochastically.

This embodiment illustrates an example in which two word lines 8 are always activated four thousand times for the normal refresh. However, the number of times of simultaneously activating two word lines 8 is not necessarily four thousand times. It is possible to limit the number of times required to refresh the victim cell. Further, in the present embodiment, for example, a circuit placed in the row control circuit 10N may be placed in another location in the DRAM chip 1.

In addition, the refresh controller 21E may change refresh frequency for the victim cell according to RH tolerance judged by the RH tolerance judgment circuit 25. Further, when changing the normal refresh frequency according to the temperature detected by a temperature sensor 26, refresh frequency for the victim cell may be changed.

Figure 56:
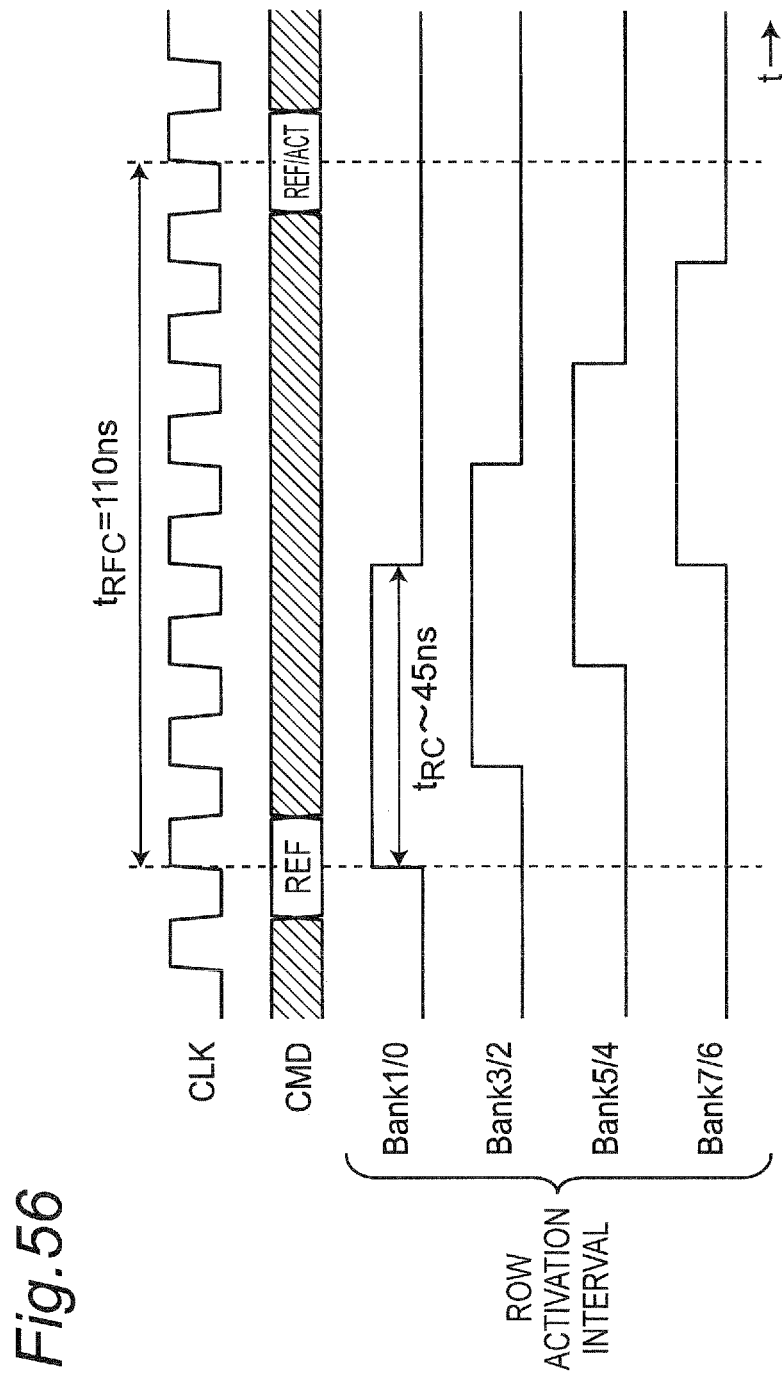
FIG. 56 is a timing chart illustrating a first operation example regarding power distribution caused by bank control in the refresh operation, in the row control circuit 10N according to the fifteenth embodiment.
Figure 57:
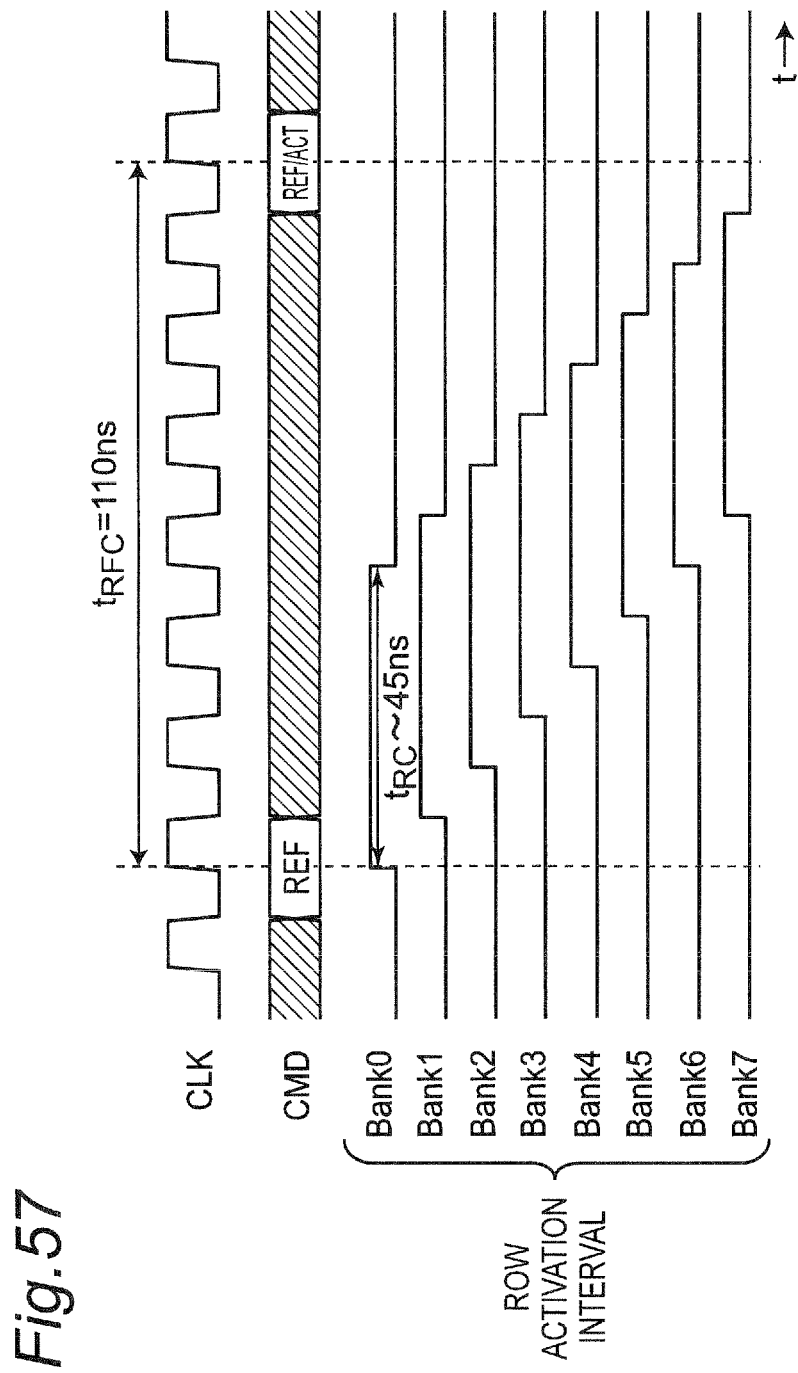
FIG. 57 is a timing chart illustrating a second operation example regarding power distribution caused by the bank control in the refresh operation, in the row control circuit 10N according to the fifteenth embodiment.
Figure 58:
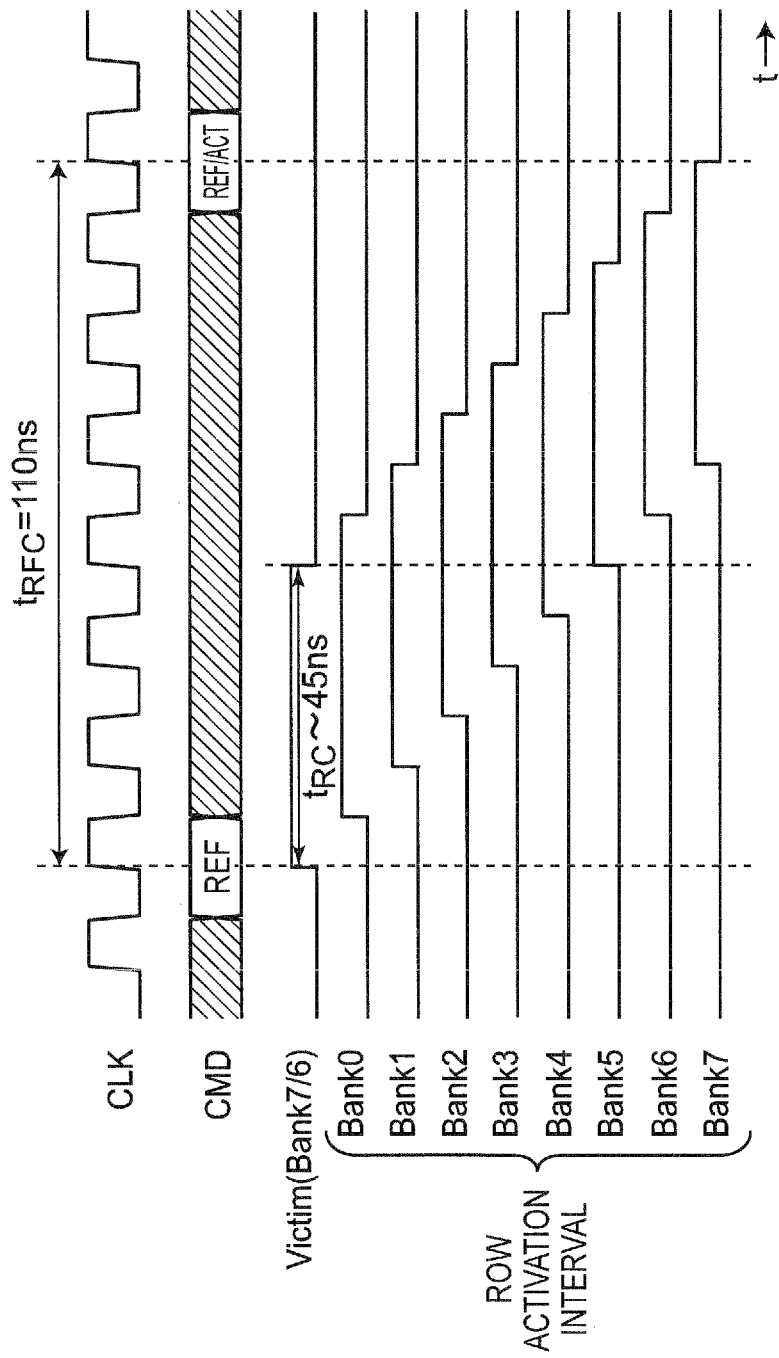
FIG. 58 is a timing chart illustrating a first operation example regarding bank control in the refresh adopting the victim refresh, in the row control circuit 10N according to the fifteenth embodiment.
Figure 59:
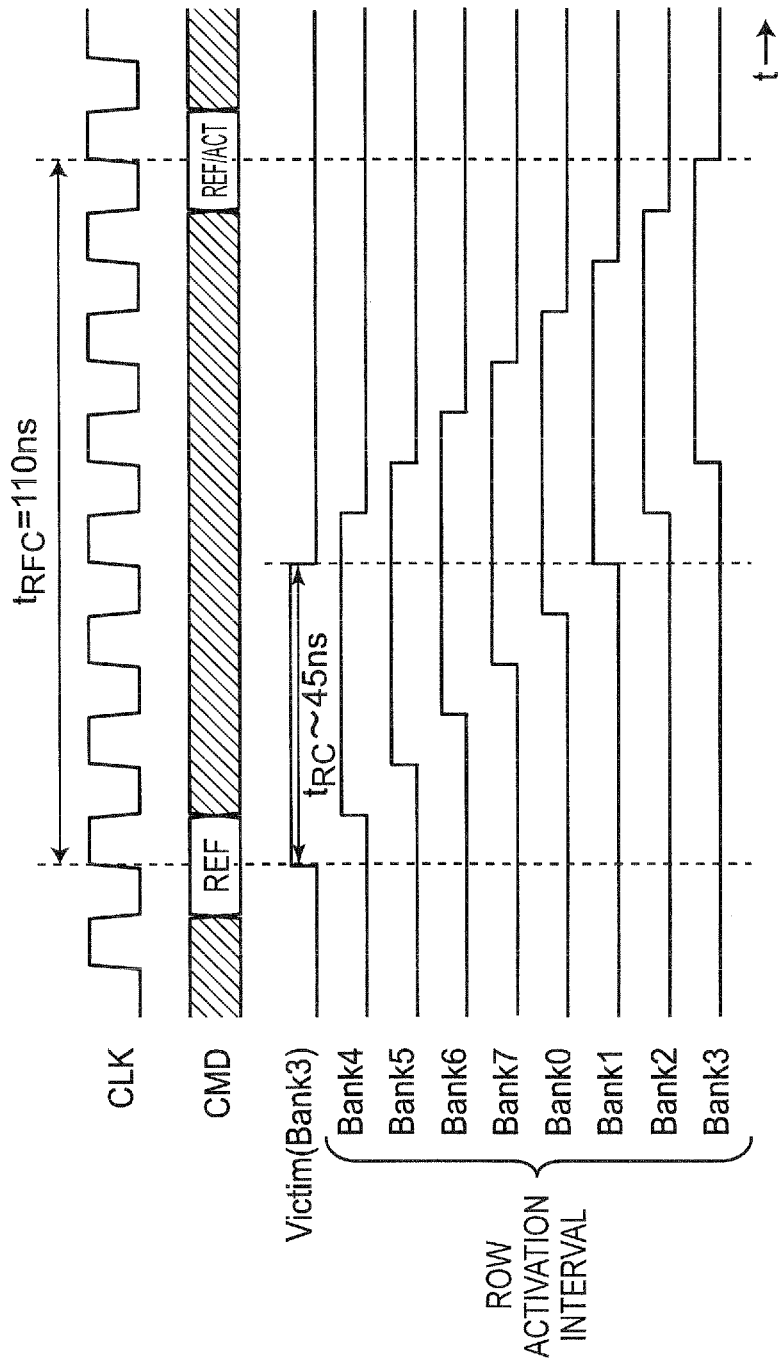
FIG. 59 is a timing chart illustrating a second operation example regarding bank control in the refresh adopting the victim refresh, in the row control circuit 10N according to the fifteenth embodiment.

FIG. 55 is a timing chart illustrating an example of refresh operation performed (8K+1) times in the row control circuit 10N according to the fifteenth embodiment. In addition, FIG. 56 is a timing chart illustrating a first operation example regarding power flattening by bank control in the refresh operation, in the row control circuit 10N according to the fifteenth embodiment. Further, FIG. 57 is a timing chart illustrating a second operation example regarding power flattening by bank control in the refresh operation, in the row control circuit 10N according to the fifteenth embodiment. FIG. 58 is a timing chart illustrating a first operation example regarding bank control in the refresh adopting the victim refresh in the row control circuit 10N according to the fifteenth embodiment. FIG. 59 is a timing chart illustrating a second operation example regarding bank control in the refresh adopting the victim refresh in the row control circuit 10N according to the fifteenth embodiment.

Incidentally, one REFRESH command causes refresh operation to be basically performed for all the banks (without exception at least in the DDR3-SDRAM described as an example). However, in order to prevent concentration of power consumption, it is possible to shift activation timing for each bank in refresh operation within the range of a refresh cycle ($t_{RFC}$).

For example, in a 1 Gb DDR3-SDAM which is an implementation example, a refresh cycle ($t_{RFC}$) is 110 ns. At this time, when assuming that one word line can be refreshed in 45 ns (which is lower than or equal to a predetermined minimum value $t_{RCmin}$ and is a value around the value), power consumption can be dispersed as illustrated in FIG. 56, for example. The distribution method is not limited to the distribution method for each clock as illustrated in FIG. 56, and may be another method such as the method for each half clock illustrated in FIG. 57 or the like.

FIGS. 58 and 59 illustrates an example in which bank control in the refresh incorporates the victim refresh. By inserting the victim refresh within the refresh cycle ($t_{RFC}$), it is possible to maintain the original values of 64 ms of refresh time and eight thousand refresh times. In addition, the victim refresh is not always performed every time. It is also possible to include the victim refresh once for the refresh performed a plurality of times. In addition, the victim refresh is not always performed at the beginning of the refresh cycle ($t_{RFC}$), and may be executed at any timing within the refresh cycle ($t_{RFC}$). However, since the normal refresh cannot be performed for a bank, which is subjected to the victim refresh activation, in the case of FIG. 57 described as an example, the victim refresh can be executed only for a bank 6 or 7. Therefore, the function of switching over the execution order of the normal refresh according to the bank address of the victim refresh as illustrated in FIG. 59 is very effective for realizing the present embodiment.

In addition, the number of times of execution of the victim refresh is not limited to once as long as the victim refresh is completed within the refresh cycle ($t_{RFC}$). In addition, a timing of the victim refresh and a timing of the victim refresh or a timing of the victim refresh and a timing of the normal refresh may not be necessarily shifted from each other, and may occur simultaneously unless an identical bank is refreshed.

Sixteenth Embodiment

Figure 46:
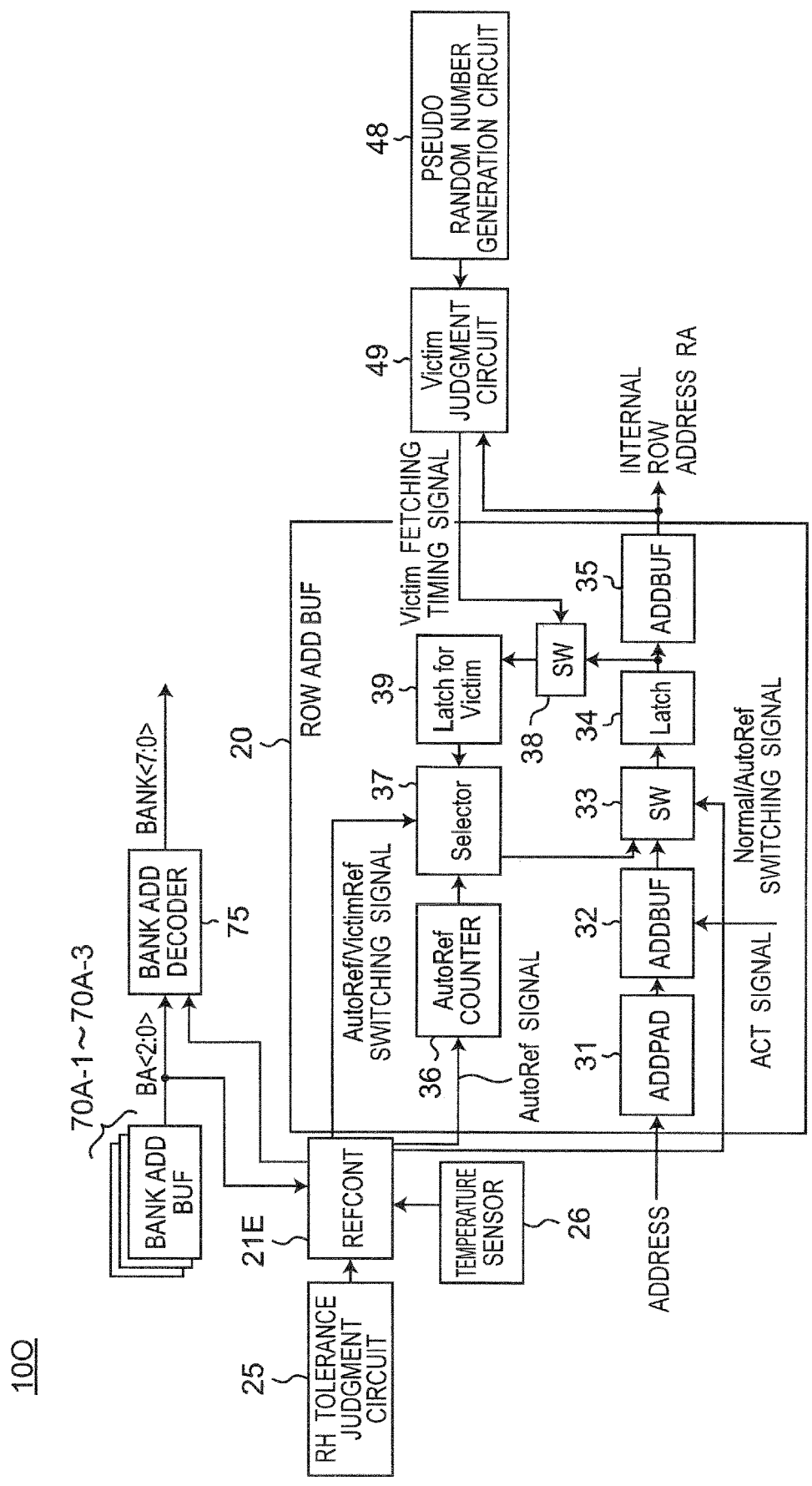
FIG. 46 is a block diagram illustrating a configuration example of a row control circuit 10O according to a sixteenth embodiment.

FIG. 46 is a block diagram illustrating a configuration example of a row control circuit 10O according to a sixteenth embodiment. The row control circuit 10O according to the sixteenth embodiment of FIG. 46 differs from the row control circuit 10N according to the fifteenth embodiment of FIG. 45 in the following point.

(1) The row control circuit 10O includes a pseudo random number generation circuit 48 and a victim judgment circuit 49 instead of the timer circuit 41.

Hereinafter, the above difference will be described in detail.

Referring to FIG. 46, the pseudo random number generation circuit 48 generates a pseudo random number according to a predetermined initial value, and outputs the pseudo random number to the victim judgment circuit 49. The victim judgment circuit 49 judges whether or not a row address RA from an address buffer 35 matches with the pseudo random number, and then, generates and outputs a Victim fetching timing signal which is a timer signal when they match with each other.

Incidentally, the tolerance to RH failure varies depending on rules of a semiconductor manufacturing process, word line voltage, or individual differences. In addition, the RH tolerance of a DRAM can be improved by using a redundant memory cell to relieve a memory cell with low RH tolerance. Meanwhile, the interruption frequency of the victim refresh required for stochastically avoiding RH failure depends on the RH tolerance of the DRAM. Further, since execution of the victim refresh has such side effects as an increase in the power consumption or an increase in the refresh interval, the present embodiment has the function of adjusting the execution frequency of the victim refresh depending on the RH tolerance of the individual DRAM, and can reduce the above-described side effects.

According to the sixteenth embodiment, the victim address is latched at a timing not fixed with respect to the refresh, or latched at random timing. Specifically, it is judged whether or not the row address RA matches with the pseudo random number. When the row address RA matches with the pseudo random number, a Victim fetching timing signal which is a timer signal is generated to determine the victim address. By changing the frequency of the refresh for the victim cell, it is possible to prevent an increase in power consumption or an increase for the refresh interval.

Seventeenth Embodiment

Figure 47:
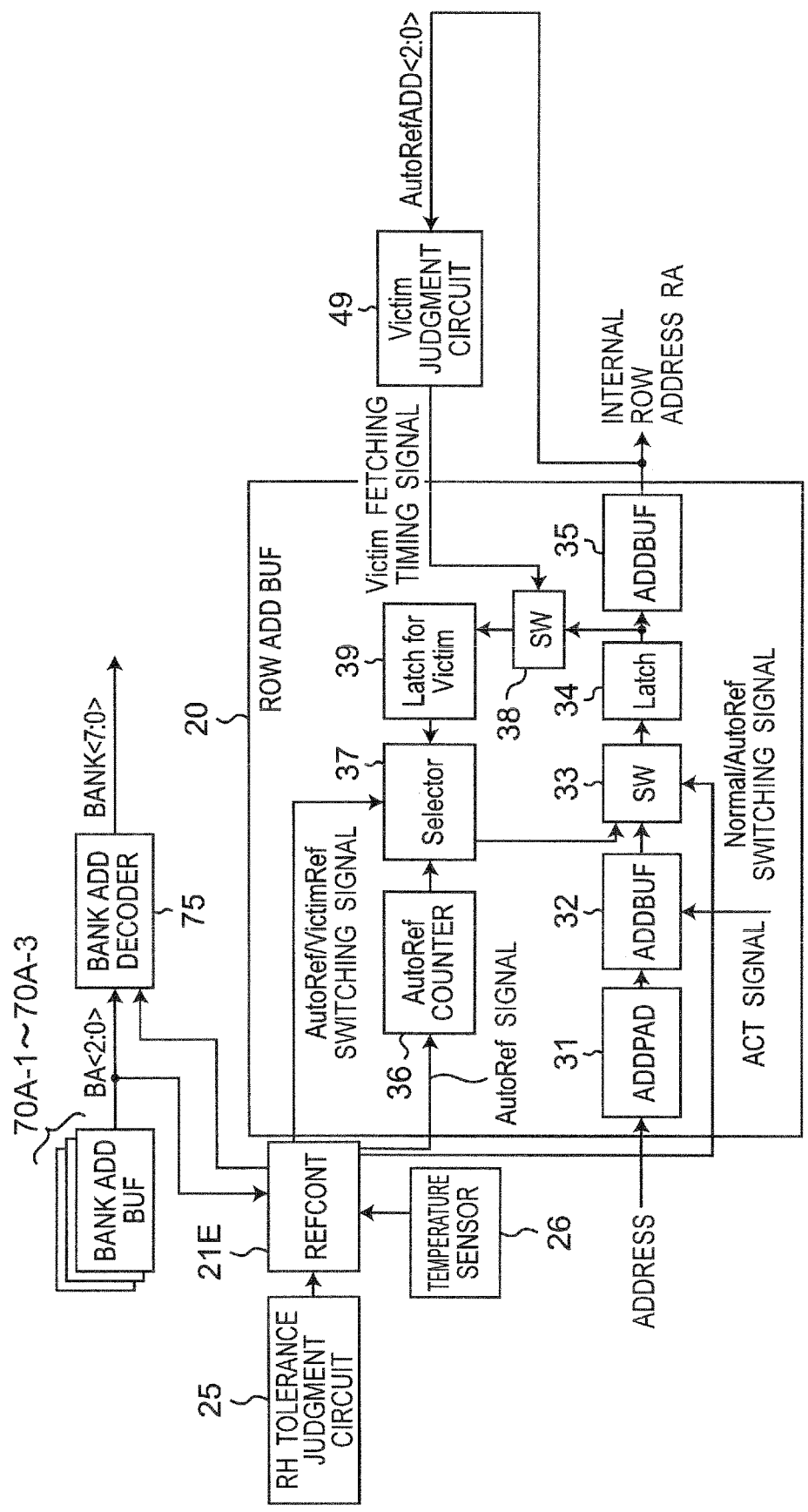
FIG. 47 is a block diagram illustrating a configuration example of a row control circuit 10P according to a seventeenth embodiment.

FIG. 47 is a block diagram illustrating a configuration example of a row control circuit 10P according to a seventeenth embodiment. The row control circuit 10P according to the seventeenth embodiment of FIG. 47 differs from the row control circuit 10N according to the fifteenth embodiment of FIG. 45 in the following point.

(1) The row control circuit 10P includes a victim judgment circuit 49 instead of the timer circuit 41.

Hereinafter, the above difference will be described in detail.

Referring to FIG. 47, the victim judgment circuit 49 counts the lower 3 bits of a row address RA outputted from an address buffer 35, judges the row address to be the address for the victim refresh when the count value reaches 0 or the maximum value, and generates a Victim fetching timing signal. That is, the row control circuit 10P latches the row address specified by a predetermined refresh address as the victim address. Therefore, the seventeenth embodiment has a function and effect similar to that of the sixteenth embodiment.

Eighteenth Embodiment

Figure 48:
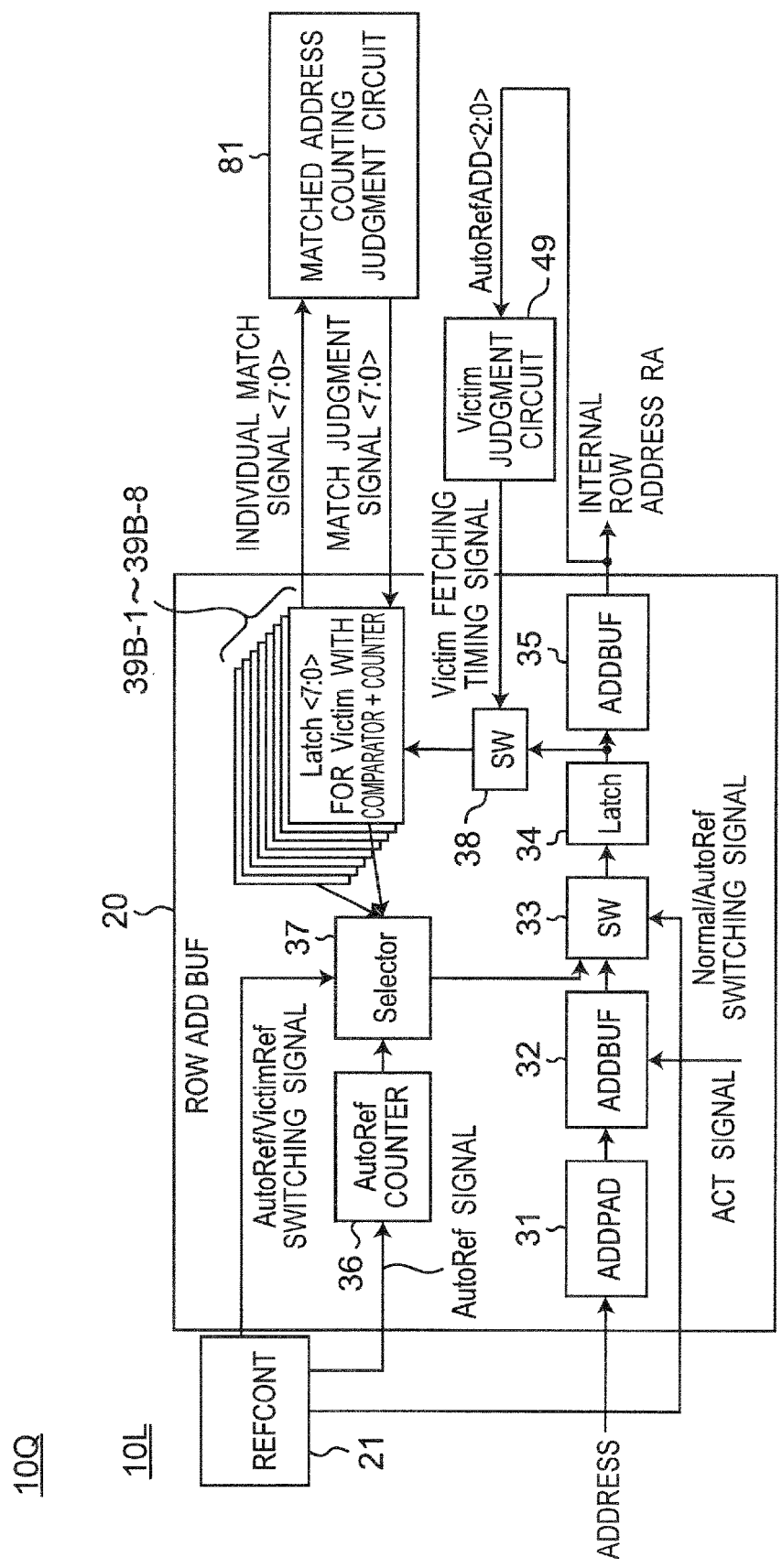
FIG. 48 is a block diagram illustrating a configuration example of a row control circuit 10Q according to an eighteenth embodiment.

FIG. 48 is a block diagram illustrating a configuration example of a row control circuit 10Q according to an eighteenth embodiment. The row control circuit 10Q according to the eighteenth embodiment of FIG. 48 differs from the row control circuit 10O according to the sixteenth embodiment of FIG. 47 in the following points.

(1) The row control circuit 10Q includes a matched address counting judgment circuit 81. The matched address counting judgment circuit 81 causes a counter to count the number of identical addresses which are a plurality of addresses latched by the latches 39B-1 to 39B-8 and matching with each other, according to an individual match signal <7:0>. The individual match signal <7:0> indicates whether or not the plurality of addresses latched by each of the latches 39B-1 to 39B-8 individually matches with each other. The matched address counting judgment circuit 81 generates a match judgement signal <7:0>, the match judgement signal <7:0> indicating the greatest identical address having the greatest count value as a match judgment address, and outputs the signal to the latches 39B-1 to 39B-8.

(2) It is noted that the refresh controller 21 does not include a RH tolerance judgment circuit 25 and a temperature sensor 26.

Hereinafter, the above difference will be described in detail.

Referring to FIG. 48, the matched address counting judgment circuit 81 causes the counter to count the number of identical addresses which are a plurality of addresses latched by the latches 39B-1 to 39B-8 and matching with each other, according to an individual match signal <7:0>. The matched address counting judgment circuit 81 generates a match judgement signal <7:0>, the match judgement signal <7:0> indicating the greatest identical address having the greatest count value as a match judgment address, and outputs the signal to the latches 39B-1 to 39B-8. That is, the matched address counting judgment circuit 81 is characterized by setting the maximum identical victim addresses having the maximum match number among the plurality of latched victim addresses to the victim address whose victim cell is to be refreshed.

The present embodiment includes the counter that latches a plurality of row addresses and counts the number of addresses if the addresses are identical. By performing the victim refresh for the address that has been stored the greatest number of times, it is possible to refresh a memory cell 6 connected to a word line 8, that is most likely to be a victim cell. The matched address counting judgment circuit 81 judges the row address saved the greatest number of times to be the target address, and generates a victim address according to the address. As a result, it is possible to eliminate unnecessary refreshes and to prevent an increase in the power consumption or an increase in the refresh interval.

Nineteenth Embodiment

Figure 49:
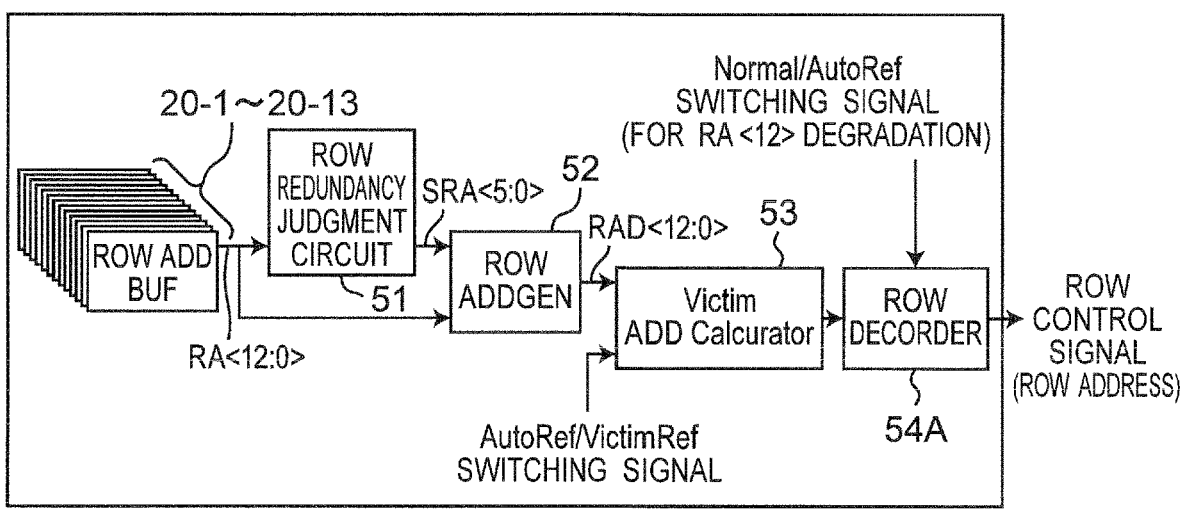
FIG. 49 is a block diagram illustrating a configuration example of a row control circuit 10R according to a nineteenth embodiment.

FIG. 49 is a block diagram illustrating a configuration example of a row control circuit 10R according to a nineteenth embodiment. The row control circuit 10R according to the nineteenth embodiment of FIG. 49 differs from the row control circuit 10 according to the first embodiment of FIG. 8 in the following point.

(1) The row control circuit 10R includes a row decoder 54A instead of the row decoder 54. The row decoder 54A uses a Normal/AutoRef switching signal from a refresh controller 21 as a signal for degrading a row address RA <12>. The row decoder 54A degrades the victim address calculated by a victim address calculation circuit 53 and decodes the victim address, and thus generates a row address.

Referring to FIG. 49, the row decoder 54A is controlled so as to degrade the row address RA <12> for the auto refresh and select, for example, twice as many as word lines 8 for the auto refresh (See FIG. 51). That is, the row control circuit 10R reduces the number of times of the normal refresh by increasing the number of word lines to be refreshed in the normal refresh, as compared with the number of word lines to be normally refreshed. Also, the row control circuit 10R controls the refresh on the victim cell to be interposed in the time intervals corresponding to the number of times of the refresh reduced. As a result, it is possible to eliminate the unnecessary refresh and to prevent an increase in the power consumption or an increase in the refresh interval.

INDUSTRIAL APPLICABILITY

As described above in detail, according to the semiconductor memory device of the present invention, it is possible to prevent a refresh failure to a similar extent of the prior patents without accompanying a significant increase in the size of the circuit as compared with the prior arts.

DESCRIPTION OF REFERENCE CHARACTERS

1: DRAM CHIP
2: MEMORY CELL ARRAY
3: WORD LINE DECODE CIRCUIT
4: SENSE AMPLIFIER CIRCUIT
5: COLUMN SELECTION LINE DECODE CIRCUIT
6: MEMORY CELL
7: BIT LINE
8: WORD LINE
9: COLUMN SELECTION LINE
10, 10A to 10R: ROW CONTROL CIRCUIT
11: INTERNAL SIGNAL GENERATION CIRCUIT
12: DATA PROCESSING CIRCUIT
13: DATA INPUT AND OUTPUT CIRCUIT
14, 15: INTERNAL DATA BUS
16: EXTERNAL DATA INPUT AND OUTPUT PIN
20, 20-1 to 20-13, 20A, 20B: ROW ADDRESS BUFFER (ROW ADD BUF)
21, 21A to 21E: REFRESH CONTROLLER (REFCONT)
22, 22A: TEST CONTROLLER (TEST CONTROL)
23: MODE REGISTER
24: FUSE CIRCUIT (FUSE)
25: RH TOLERANCE JUDGMENT CIRCUIT
26: TEMPERATURE SENSOR
31: ADDRESS PAD (ADDPAD)
32, 35: ADDRESS BUFFER (ADDBUF)
33, 38: SWITCH (SW)
34: LATCH
36: AUTO REFRESH COUNTER (AutoRef COUNTER)
37: SELECTOR
39, 39-1 to 39-8, 39A-1 to 39A-8, 39B-1 to 39B-8: LATCH FOR VICTIM ADDRESS (LATCH FOR VICTIM)
41, 41A to 41D, 41C1, 41C2, 44: TIMER CIRCUIT (TIMER)
42: LATCH CONTROLLER (LATCH CONTROL)
43: OR LOGIC CIRCUIT
45: FUSE CIRCUIT (FUSE)
46: MODE REGISTER
47: TEST CONTROLLER (TEST CONTROL)
48: PSEUDO RANDOM NUMBER GENERATION CIRCUIT
49: VICTIM JUDGMENT CIRCUIT
51: ROW REDUNDANCY JUDGMENT CIRCUIT
52: ROW ADDRESS GENERATION CIRCUIT (ROW ADDGEN)
53: VICTIM ADDRESS CALCULATION CIRCUIT (VICTIM ADD CALCULATOR)
54, 54A: ROW DECODER
61: BUFFER AMPLIFIER
62: INVERTER
63: EXOR GATE
70, 70-1 to 70-3, 70A: BANK ADDRESS BUFFER (BANK ADD BUF)
71: BANK ADDRESS PAD (BANK ADDPAD)
72, 74: ADDRESS BUFFER (ADDBUF)
73: LATCH
75: BANK ADDRESS DECODER (BANK ADD DECODER)
76, 78: SWITCH (SW)
81: MATCHED ADDRESS COUNTING JUDGMENT CIRCUIT
101: MEMORY CONTROLLER
102: PROCESSOR

The invention claimed is:

1. A semiconductor memory device comprising a row control circuit, wherein the row control circuit is configured to:

(A) latches one of (a) a target address upon issuing of an ACTIVE command to the semiconductor memory device, and (b) a row address of a victim cell in which data of a memory cell is affected by the target address, as a victim address by using a predetermined row address latch method; and then, (B) refreshes the victim cell having the victim address by a predetermined refresh method upon issuing of a REFRESH command, and wherein the row control circuit, which applies the row address latch method based on probability, includes a timing signal generating circuit that generates a timing signal indicating a timing of latching the row address to refresh the memory cell of the row address before occurrence of a failure, where the memory cell of the row address may be affected by access to substantially all target addresses to cause an issue of the failure.

2. The semiconductor memory device as claimed in claim 1, wherein the timing signal generating circuit generates the timing signal indicating the timing of the ACTIVE command, which selects a part of all ACTIVE commands based on the ACTIVE command and the REFRESH command.

3. The semiconductor memory device as claimed in claim 2, wherein the timing signal generating circuit generates the timing signal indicating the timing of latching a row address upon issuing of an ACTIVE command executed immediately before issuing of a REFRESH command by the row address latch method.

4. The semiconductor memory device as claimed in claim 2, wherein the timing signal generating circuit generates the timing signal indicating the timing of latching a row address upon issuing of an ACTIVE command executed immediately after issuing of a REFRESH command by the row address latch method.

5. The semiconductor memory device as claimed in claim 2, wherein the row control circuit includes the timing signal generating circuit, and wherein the timing signal generating circuit generates the timing signal indicating the timing of latching a row address upon issuing of an ACTIVE command after issuing of a REFRESH command, and after a predetermined number of ACTIVE commands are issued, by the row address latch method.

6. The semiconductor memory device as claimed in claim 1, wherein the timing signal generating circuit includes a timer circuit, and wherein, by the row address latch method, the row address is latched as a victim address at a timing that a timer signal outputted from the timer circuit indicates.

7. The semiconductor memory device as claimed in claim 6, wherein the timing signal generating circuit includes:
a plurality of the timer circuits; and
an arithmetic circuit, which generates the timer signal according to a logical sum of timer signals from the plurality of timer circuits.

8. The semiconductor memory device as claimed in claim 6, wherein a cycle of the timer signals is set to be longer than a cycle of au to refresh.

9. The semiconductor memory device as claimed in claim 6, wherein a cycle of the timer signal is set to be longer than a cycle of refreshing of the victim cell.

10. The semiconductor memory device as claimed in claim 6, wherein a cycle of the timer signal is automatically and selectively changed.

11. The semiconductor memory device as claimed in claim 10, wherein the timing signal generating circuit comprises a fuse circuit, which sets a cycle of the timer signal, and wherein the cycle of the timer signal is changed according to a signal from the fuse circuit.

12. The semiconductor memory device as claimed in claim 10, wherein the timing signal generating circuit comprises a mode register, which sets the cycle of the timer signal, and wherein the cycle of the timer signal is changed according to a signal from the mode register.

13. The semiconductor memory device as claimed in claim 10, wherein the timing signal generating circuit comprises a test controller, which sets the cycle of the timer signal, and wherein the cycle of the timer signal is changed according to a signal from the test controller.

14. The semiconductor memory device as claimed in claim 1, wherein the row control circuit further comprises an auto refresh counter, which counts an AUTO REFRESH command, and wherein, by the refresh method, the row control circuit performs refreshing on an address specified by a count value from the auto refresh counter, and then, performs subsequently refreshing on a victim cell having a victim address latched according to an ACTIVE command for an identical AUTO REFRESH command interval.

15. The semiconductor memory device as claimed in claim 14, wherein operation of refreshing the victim cell having the victim address latched according to the ACTIVE command is executed by all AUTO REFRESH commands.

16. The semiconductor memory device as claimed in claim 14, wherein operation of refreshing the victim cell having the victim address latched by the ACTIVE command is executed according to the AUTO REFRESH command at a rate of once for a plurality of AUTO REFRESH commands.

17. The semiconductor memory device as claimed in claim 16, further comprising a fuse circuit, which sets the rate.

18. The semiconductor memory device as claimed in claim 16, further comprising a mode register, which sets the rate.

19. The semiconductor memory device as claimed in claim 16, further comprising a test controller, which sets the rate.

20. The semiconductor memory device as claimed in claim 1, wherein the row control circuit further comprises a test controller, which gives an instruction as to whether to enable the refresh on the victim cell in a test mode.

21. The semiconductor memory device as claimed in claim 1, wherein the row control circuit further comprises a mode register, which gives an instruction as to whether to enable the refresh on the victim cell.

22. The semiconductor memory device as claimed in claim 1,
wherein the row control circuit further comprises a fuse circuit, which gives an instruction as to whether to enable the refresh on the victim cell.

23. The semiconductor memory device as claimed in claim 1,
wherein the row control circuit stops auto refresh operation based on an AUTO REFRESH command in a test mode, and refreshes the victim cell upon issuing of an AUTO REFRESH command to the victim cell having the victim address.

24. The semiconductor memory device as claimed in claim 1,
wherein the row control circuit uses a row address after row redundancy judgment as the victim address.

25. The semiconductor memory device as claimed in claim 1,
wherein a latch interval of the victim address is changed according to one of an AUTO REFRESH command and another control signal.

26. The semiconductor memory device as claimed in claim 1,
wherein the row control circuit latches a plurality of the victim addresses.

27. The semiconductor memory device as claimed in claim 26,
wherein the row control circuit latches the plurality of victim addresses for each bank of the semiconductor memory device.

28. The semiconductor memory device as claimed in claim 26,
wherein the row control circuit sequentially refreshes victim cells, each having a victim address, upon successive refreshes, by using a plurality of latched victim addresses.

29. The semiconductor memory device as claimed in claim 26,
wherein the row control circuit latches a bank address together with the plurality of victim addresses.

30. The semiconductor memory device as claimed in claim 1,
wherein the timing signal generating circuit includes a pseudo random number generating circuit that generates a pseudo random number, and
wherein the timing signal generating circuit generates a timing signal indicating a timing signal based on the pseudo random number, the timing signal being not fixed with respect to the REFRESH command.

31. The semiconductor memory device as claimed in claim 30,
wherein the row control circuit latches a row address specified by a refresh address as the victim address.

32. The semiconductor memory device as claimed in claim 30,
wherein the row control circuit sets an identical victim address having a maximum number among the plurality of victim addressers to be latched, to be a victim address whose victim cell is to be refreshed.

33. The semiconductor memory device as claimed in claim 1,
wherein the row control circuit refreshes the victim cell in addition to a normal refresh, to set a refresh time to be longer than a refresh interval for the normal refresh.

34. The semiconductor memory device as claimed in claim 1,
wherein the row control circuit reduces a number of times of the normal refresh by increasing a number of word lines to be refreshed upon the normal refresh as compared with a number of word lines to be normally refreshed, and controls the refresh of a victim cell to be interposed for a time interval corresponding to the number of times of the normal refresh reduced.

35. The semiconductor memory device as claimed in claim 1,
wherein the row control circuit refreshes a victim cell 'within an identical refresh cycle interval upon the normal refresh.

36. The semiconductor memory device as claimed in claim 35,
wherein the row control circuit executes activation of a bank to be subjected to the normal refresh and a bank to be subjected to the refresh on the victim cell, at one of an interval having a minimum value of an ACTIVE command interval and an interval equal to or longer than one row activation interval by the refresh.

37. The semiconductor memory device as claimed in claim 36,
wherein the row control circuit changes activation order of banks to be subjected to the normal refresh according to a bank address subjected to the refresh of the victim cell.

38. The semiconductor memory device as claimed in claim 1,
wherein the row control circuit changes a frequency of the refresh on the victim cell according to a Row Hammer tolerance.

39. The semiconductor memory device as claimed in claim 1, wherein the row control circuit changes a frequency of the refresh on the victim cell when changing the frequency of the normal refresh according to temperature.

* * * * *